(12) United States Patent
Woods et al.

(10) Patent No.: US 10,128,664 B1
(45) Date of Patent: *Nov. 13, 2018

(54) MONITORING VOLTAGE LEVELS ON POWER LINES AND RECLOSER OPERATION

(71) Applicant: Idaho Power Company, Boise, ID (US)

(72) Inventors: Shane M. Woods, Meridian, ID (US); Kelly L. Hulse, Middleton, ID (US); Jon D. Roholt, Meridian, ID (US)

(73) Assignee: Idaho Power Company, Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/396,144

(22) Filed: Dec. 30, 2016

Related U.S. Application Data

(63) Continuation of application No. 14/555,219, filed on Nov. 26, 2014, now Pat. No. 9,557,720.

(60) Provisional application No. 61/909,925, filed on Nov. 27, 2013.

(51) Int. Cl.
*H02H 3/04* (2006.01)
*H02J 5/00* (2016.01)
*H02M 7/06* (2006.01)
*G01R 19/02* (2006.01)
*G01R 31/08* (2006.01)
*G05B 15/02* (2006.01)

(52) U.S. Cl.
CPC ............. *H02J 5/005* (2013.01); *G01R 19/02* (2013.01); *G01R 31/085* (2013.01); *G05B 15/02* (2013.01); *H02M 7/06* (2013.01)

(58) Field of Classification Search
CPC .................................................... H02H 1/0007
USPC ........................................................ 340/3.43
See application file for complete search history.

(56) References Cited

U.S. PATENT DOCUMENTS

| 6,018,451 | A | * | 1/2000 | Lyke | ........................ H02H 3/04 361/42 |
|---|---|---|---|---|---|
| 6,538,347 | B1 | * | 3/2003 | Baranowski | ....... H01H 11/0062 307/137 |
| 2004/0227410 | A1 | | 11/2004 | Fitzgibbon | |
| 2006/0176000 | A1 | | 8/2006 | Schulman et al. | |
| 2009/0265042 | A1 | | 10/2009 | Mollenkopf et al. | |
| 2011/0181269 | A1 | | 7/2011 | Watkins et al. | |
| 2012/0038446 | A1 | | 2/2012 | McBee et al. | |
| 2014/0028116 | A1 | | 1/2014 | O'Brien et al. | |
| 2014/0207399 | A1 | | 7/2014 | Roberson | |

* cited by examiner

*Primary Examiner* — Kevin Kim
(74) *Attorney, Agent, or Firm* — Klarquist Sparkman, LLP

(57) ABSTRACT

An electrical power distribution system comprises recloser monitors that monitor power line voltages to thereby whether reclosers are open or closed. The recloser monitors report the voltages and associated times to a remote recipient, such as by cell phone. Momentary voltage drops that do not result in a power outage are reported as well. At least some of the recloser monitors are carried by power poles and desirably comprise weather stations for reporting localized weather conditions. The overall efficiency and reliability of the power distribution system is improved by allowing for more rapid identification of outage locations and proactive repair of power system components prior to actual outages.

17 Claims, 38 Drawing Sheets

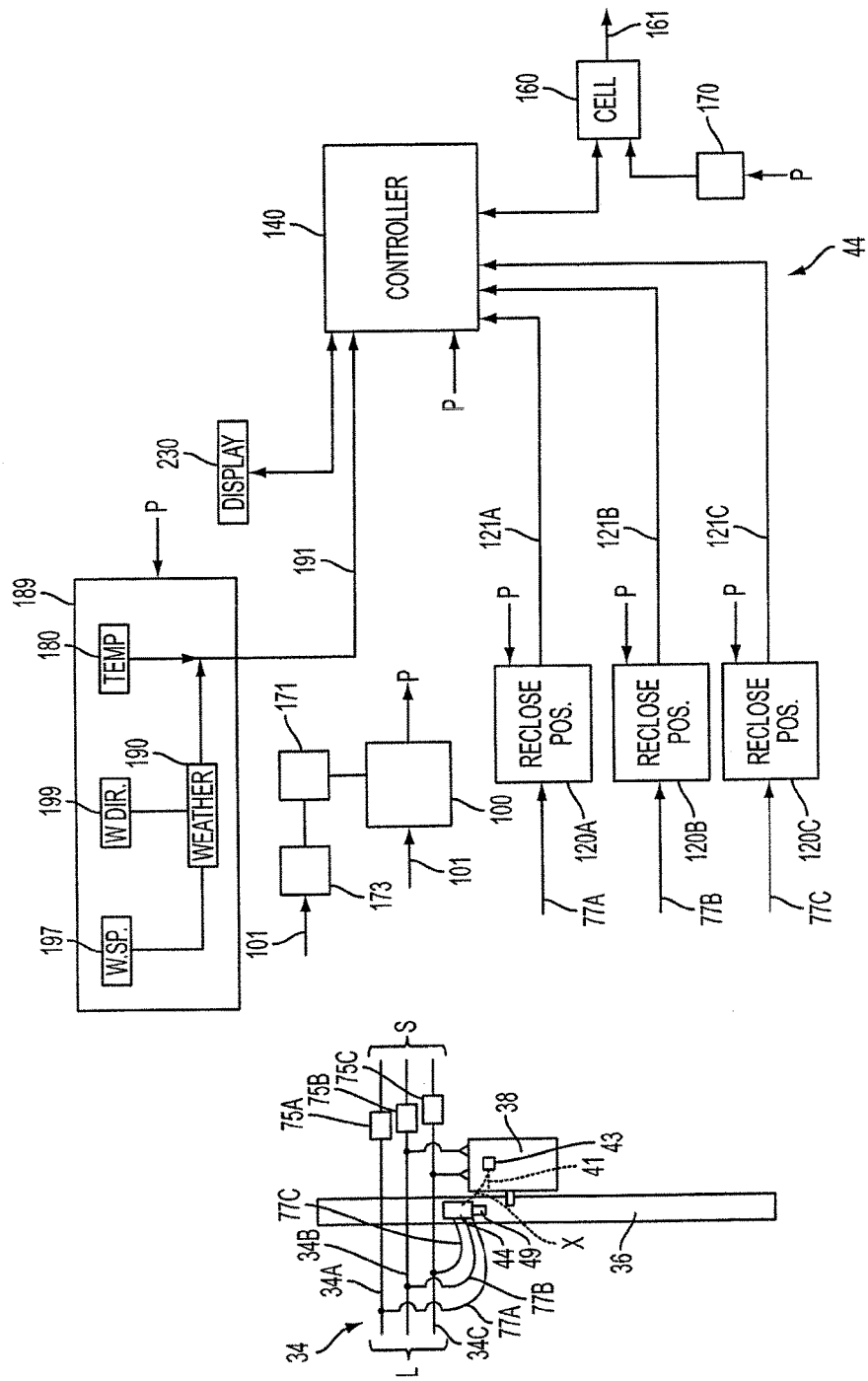

MONITORING VOLTAGE LEVELS ON POWER LINES AND RECLOSER OPERATION

CROSS REFERENCE TO RELATED APPLICATION

This application is a Continuation of U.S. patent application Ser. No. 14/555,219, entitled "MONITORING VOLTAGE LEVELS ON POWER LINES AND RECLOSER OPERATION", filed Nov. 26, 2014, which claims the benefit of U.S. Provisional Application Ser. No. 61/909,925, entitled MONITORING VOLTAGE LEVELS ON POWER LINES, filed on Nov. 27, 2013. These applications are incorporated by reference herein.

BACKGROUND

A typical electrical distribution system is made up of transmission lines that deliver electrical power to substations which in turn provide the power to various feeder or power distribution lines. These power lines can be above ground, such as supported by power poles and the like, or underground. Transformers are used to step down the voltage for delivery to residences and other customers at appropriate voltage levels. It is conventional for reclosers to be provided at various points along power distribution lines. A recloser or switch operates to remove the line from the distribution system when a fault occurs downstream from the recloser. Conventional reclosers can open and close in response to a momentary fault and reopen again if the fault remains on the line. Opening and closing of the reclosers can happen a number of times before the recloser remains in an open circuit position. Reclosers are also known that count their open and closing cycles.

Historically power companies have relied on customers calling in to a utility to report a power outage. A repair crew would then be sent by a dispatcher to the location indicated by the caller. When at the location, the crew would look for a cause of the outage, such as a tree falling over and taking out power lines. It can be difficult to determine where an outage has occurred from call-in information as the outage may be in the customer's private service line or elsewhere upstream in the distribution network.

It is often more difficult to locate the source of momentary outages, particularly momentary outages that are intermittent. In fact, intermittent momentary outages that do not cause the recloser to remain open are often never reported to a power company. Furthermore, power companies in the past typically had no way to know when rural customers were experiencing excessive momentary outages unless and until complaints from such customers started to accumulate. When that happened, a utility worker would typically drive out, read the counters on the various reclosers in the area of the customers (the counters indicating how many times the reclosers had opened and closed). The existing new count on the reclosers would then be compared to a previous count, that may have been months earlier. The differences would be tallied and reclosers with the most reclose operations were then considered to be the zone in the distribution network causing the problem. Sometimes the correct area was identified; sometimes it wasn't.

Therefore, a need exists for an improved apparatus and system, as well as associated methods, for identifying power outages, including momentary outages that may be happening intermittently. A need also exists for a power distribution system in which the location of outages are more easily located.

SUMMARY

In accordance with one aspect of this disclosure, monitoring devices for an electrical distribution system are provided for assisting in locating the source of outages in the electrical distribution system. The monitors are desirably low cost and capable of monitoring the electrical distribution system for both momentary and sustained outages.

As another desirable aspect, the monitoring devices can be provided with a mechanism for accurately determining the time when power went off and also desirably if, and when, power was turned on. In one approach, the power on/off data is accurately time stamped to allow the determination of the time of the outage for later analysis. The data indicative of the outages and time is transmitted to a processing location, such as a centrally located computer. The computer analyzes the data and determines the location and times of outages. This data can be used by dispatchers who, in response to the data, can send repair crews to the location of the faults. The positions of individual monitors can be identified by associating identifiers for particular monitors with particular geographic location (such as power pole numbers mapped to specific locations or residence addresses) when the monitors are installed. In the event an outage is detected by a monitor, the monitor relays information concerning the identification of the monitor and outage, along with timing information used to generate a time stamp for the outage, via a communication link such as a phone line (e.g., a landline or cell phone) to a processing location, such as a central computer coupled to the various monitors positioned throughout the electrical distribution system.

To prevent interference with the use of a telephone landline by a user, in one embodiment the monitor can have an off the hook detection mechanism for determining when the user is using the telephone and thus the telephone line is not available for transmission of outage related data without interfering with the user's use of the telephone. The monitoring device can determine when the phone is returned to the hook (and thus is available for data transmission) and send the data under these conditions. The monitoring device can determine the time of the outage and the time the telephone was off the hook and provide a time stamp, or other time delay indicating information, from which the time of the outage can be determined. For example, the current time when the phone was placed back on the hook can be adjusted by subtracting the time off the hook to backtrack to the time the outage took place. This time determination can be accomplished by the monitor or more desirably by a remote central processor receiving information from plural monitors distributed throughout the system.

The landline monitors can be placed at a plurality, at a majority or at substantially all of the residences or end user locations connected to a distribution system to provide an indication of which residences are out of power. This can be used to identify and prioritize outage repair. However, the use of landline transmission of data is becoming more problematic as more and more households switch to cell phone use only. In addition, limiting the locations of monitors to places where a landline is present in many instances positions the monitors at substantial distances from reclosers located on feeder lines and further up the distribution system from end user landline locations.

Consequently, in a second embodiment, in addition to or instead of landline monitors, wireless communicating monitors, such as cell phone communicating monitors, can also be provided. These cell phone communicating monitors can be placed downstream from a plurality of, a majority of or substantially all of the reclosers in the system.

Desirably, a monitor is provided downstream in the distribution system from each recloser in the system. The term recloser encompasses other protective devices, such as switches and fuses, as well as conventional reclosers.

Cell phone embodiments of monitors can be placed on power poles and the like at locations adjacent to or proximate to reclosers for reporting the opening and closing of such reclosers to thereby provide an indication of sustained outages as well as momentary outages. The circuitry for such monitoring devices can be powered from transformers coupled to the wires of the distribution system. In addition, with cell phone coverage, the monitors still function for a time if provided with backup power, such as from a battery or discharging capacitor, so that they can send their outage indicating data signals even if the power lines associated with the monitor have been taken down, such as by falling debris.

In addition, as an aspect of an embodiment, the monitors can comprise a mechanism for determining environmental conditions, such as wind speed, wind direction, wind gust speed and ambient temperature. This data can be correlated with outages to assist in determining the source of such outages. For example, momentary outages occurring only when wind gusts exceed a particular threshold from a particular direction provide an indication that a tree branch may be blowing across a power line under such conditions and then springing back off the power lines.

It should be noted that the monitoring devices are not limited to the devices which are mounted to power poles in close proximity to reclosers. That is, they can be used at various locations in the power distribution system and can be used to monitor underground power lines, such as at or approximate to transformers where reclosers are located.

Data captured by the remote monitoring devices can be sent to a server that records or loads this information into a database. A remote monitoring device typically tracks the start and duration of the outage event. The monitoring device synchs these events with the server. The server can then calculate the actual time of an event from event time stamps so that distribution events (outages for example) can be correlated back to the real time the events occurred. Examples of outage causing events include transmission outages, switching caused outages, and outages from lightning strikes. The monitoring system also can provide accurate validation of protective device coordination such as, for example, the responses of various reclosers in the system along a particular feeder and distribution lines that can be evaluated for proper sequential operation.

In an alternative approach, one or more of the monitoring devices can determine the time of event information and transmit this information along with the duration of the event to the server. Thus, the time the event started, the duration of the event, and the time the event ended can be sent to the server with time adjustments being made by the monitoring devices instead of the server.

In the event power is out, the monitoring devices can automatically report information on the outage to the server. Data can be sent periodically, such as over short time intervals with every few seconds being an example. Alternatively, the monitors can be queried, for example, periodically, for outage information. A display can provide display outage location information to dispatch operators and can be updated, such as every 60 to 90 seconds. The dispatchers, based upon the display, can assign crews to respond and repair power outages even before customers begin calling in to report the repairs.

As pointed out above, momentary interruptions can be captured by the device and reported back to a remote server, for example. The devices can be time stamped in time intervals, such as every ten milliseconds to provide a ten millisecond resolution. This allows the extraction of sequence event information from the distribution system at a fine level of granularity. Again, the sequence of events allows verification of the coordination or miss-coordination of upstream and downstream protective devices such as reclosers. Miss-coordination can often result in unnecessary outages for customers. Once discovered through a power distribution system including monitoring devices as disclosed herein, distribution engineers can address and correct these miss-coordination problems to improve customer reliability and satisfaction.

Trip counts of reclosers, that is the number of recloser operations, can be determined by evaluating the outage captured by the devices. This allows dispatchers and the utility to respond to areas that have more than an expected number of momentary operations of reclosers and make necessary repairs. This can save customers from experiencing a sustained interruption as the utility can proactively address momentary outage problems before they become sustained outages. In addition, this proactive ability to identify potential sustained outages in advance can save the utility from having to make emergency repairs of a later occurring sustained outage outside of normal operating hours during which overtime and other costs are higher.

In accordance with another aspect of the disclosure, in connection with landline monitors, houses or businesses that have meters with meter bases near a phone service box (which is commonly the case) can be identified. The phone landline owner can be contacted for permission to use the phone line for power outage monitoring. A separate 800 number or other dedicated number can be utilized to eliminate charges to the customer. If the monitor detects an outage when the landline telephone is in use, desirably the monitor can be operated to wait for the phone line to be free before placing the outage call to the central server to thereby minimize impact on the customer.

Telephone landline based monitors located only at customer meters cannot distinguish between outages on primary distribution system lines and the secondary service or drop lines leading to the customer's premises. Outages that originate on the customer's service line would be reported by such a monitor and could be interpreted as a wider area outage. Outages could also be reported incorrectly if the customer's power is shut off, for example, for nonpayment of a bill or because the customer has moved out, or because of remodeling or other construction. These intentional outages can be addressed by entering data corresponding to such intentional events into a central database of the system so that the report of an outage is evaluated and ignored if due to one of these intentional non-fault indicating events. Also, an interruption in data from a landline monitor, which may indicate an outage, can be due to the customer shutting off phone line service in favor of a cell phone. Also, a cable television company or phone company can occasionally disconnect a landline from a customer's phone circuit. If disabling of a landline occurs and is identified as a source, data from the associated monitor can be ignored.

Although cell phone monitors can be used adjacent to a power end user's residence or location, cell phone monitors also allow monitoring at locations spaced from the end user's premises. In areas where cell phone coverage is spotty or nonexistent, landline monitors can alternatively be used. Desirably, both types of monitors can be used in a system.

Cell phone monitors facilitate more accurate monitoring of the distribution system and also can be used to capture additional information to help correlate outages to their causes. For example, minimum voltage, maximum voltage, average voltage, ambient temperatures, average wind speed, maximum wind speed (gusts) and the direction of the wind at installation locations can be logged. This allows the utility to capture real values during a storm to more directly correlate weather related outages. Power distribution systems are designed to specific wind loading criteria. Information on wind caused outages can facilitate adjustments to the system at locations where outages have occurred that should not have occurred during a particular storm (e.g., the system in a particular area can be made stronger and more wind resistant if unexpected gusts occur locally where the monitor is located).

Data from weather stations that are positioned at locations that are remote from (not proximate to) power lines, and from reclosers, do not provide a true picture of the local weather at the location of a monitor. More accurate correlations between outages and environmental conditions can be achieved with power distribution systems with plural dispersed monitors with environmental sensors such as weather stations. Weather monitoring can be used for other purposes as well, such as to determine when cloud seeding is viable. Localized weather information from power pole located monitors also can be used to provide a real time wind speed and direction indication for use in forecasting power generation from wind farms connected to the transmission and distribution lines having the monitors. An increase in the number of weather stations at outage monitoring devices in a distribution system, especially at locations in the path of a wind farm, improves the accuracy of determining when wind farms should be activated or shut down.

In accordance with an embodiment, an electrical power distribution system for distributing electrical power through power transmission lines is disclosed and can comprise:

a power line distribution section comprising first and second power lines supported along their length by a plurality of spaced apart power poles, a plurality of such power poles carrying transformers that are coupled to the power lines to provide secondary power to end users of power, the distribution section comprising a plurality of reclosers in each of the first and second power lines carried by respective power poles, the reclosers being positioned at plural locations along the length of the first and second power lines, an upstream recloser being a recloser that is closer to a source of power for a specific location in the distribution system where voltage is being monitored and a downstream recloser being a recloser that is further from the source of power for the specific location at which voltage is being monitored, the reclosers being operable to shift between a closed state in which electric current flows through the recloser and an open state in which electric current does not flow through the recloser; a plurality of recloser status monitors for each of the first and second power lines and carried by respective power poles, the recloser status monitors each comprising a voltage monitoring circuit comprising a first input coupled to the first power line and a first voltage output at which a first voltage output signal is provided that corresponds to the voltage at the first power line and thereby to the open and closed status of a recloser through which current flows to the location where voltage of the first power line is being monitored by the voltage monitoring circuit, the voltage monitoring circuit comprising a second input coupled to the second power line and a second voltage output at which a second voltage output signal is provided that corresponds to the voltage at the second power line and thereby to the open and closed status of a recloser through which current flows to the location where voltage of the second power line is being monitored by the voltage monitoring circuit, the recloser status monitor comprising a microcontroller comprising a first voltage receiving input coupled to the first voltage output and a second voltage receiving input coupled to the second voltage output, the microcontroller providing voltage data signals corresponding to the first and second voltage output signals over time and time data associated with the voltage output signals, the voltage output signals indicating the open or closed status of the reclosers that are upstream from the location at which voltage is being monitored by the voltage monitoring circuit, and the recloser status monitor also comprising a cellphone circuit having an input coupled to the microcontroller and to the direct current voltage output, the cellphone circuit being operable in response to the control signal from the microcontroller to place a cellphone call to a recipient location and to transmit the voltage data signals and the time data to the recipient location.

As an aspect of an embodiment, each of the recloser status monitors can comprise a power circuit comprising a transformer having an input for coupling to at least one of the first and second power lines so as to receive power from said at least one of the first and second power lines; the transformer having a first alternating current output, the power circuit comprising a first full wave rectifier coupled to the transformer outlet and operable to convert the first alternating current output to a direct current voltage output; the voltage monitoring circuit, the microcontroller, and the cell phone each being coupled to the direct current voltage output.

As yet another aspect, the voltage monitoring circuit can comprise an RMS voltage circuit and wherein the first and second voltage outputs correspond to the RMS voltage over time at the respective first and second power lines.

As a further aspect, at least one of the recloser status monitors carried by a power pole can comprise a weather station having an anemometer operable to measure wind speed, the weather station having a weather data output at which wind speed signals representing the measured wind speed are provided, the microcontroller comprising a weather data input coupled to the weather data output, the microcontroller providing wind speed indicating data corresponding to the wind speed signals, and thereby to the measured wind speed over time, the cellphone circuit also being operable to transmit the wind speed indicating data to the recipient location.

As still another aspect, the wind speed indicating data also can comprise wind gust data.

As yet another aspect, the weather station can have a wind vane operable to measure wind directions, the weather station having a weather data output at which wind direction signals representing the measured wind direction are provided, the microcontroller providing wind direction indicating data corresponding to the wind direction signals, and thereby to the measured wind direction over time, the cellphone circuit also being operable to transmit the wind direction indicating data to the recipient location.

Also, as an aspect, the weather station can comprise an ambient temperature detector operable to measure the ambient temperature, ambient temperature signals representing the measured ambient temperature being provided at the weather data output and thereby to the microcontroller, the microcontroller providing ambient temperature indicating data corresponding to the ambient temperature signals and thereby to the measured ambient temperature over time, the cellphone circuit also being operable to transmit the ambient temperature indicating data to the recipient location.

In accordance with another embodiment, an apparatus is disclosed for monitoring and reporting the operation of reclosers in an electrical power distribution system having power lines that are opened and closed by the reclosers. The apparatus can comprise: a power circuit comprising a transformer having an input for coupling to the power lines so as to receive power from the power lines; the transformer having a first alternating current output, the power circuit comprising a first full wave rectifier coupled to the transformer outlet and operable to convert the first alternating current output to a direct current voltage output; a recloser status monitor coupled to the direct current voltage output and to one of the power lines, the recloser status monitor comprising a voltage monitoring circuit coupled to said one of the power lines, the voltage monitoring circuit having a voltage output at which a voltage output signal is provided that corresponds to the voltage at said one of the power lines, the recloser status monitor having a power input coupled to the direct current voltage output; a microcontroller having a voltage receiving input coupled to the voltage output, the microcontroller providing voltage data signals corresponding to the voltage output signals over time and time data associated with the voltage output signals, the voltage output signals indicating the open or closed status of the recloser, the microcontroller being coupled to the direct current voltage output, and the microcontroller providing a cellphone control signal; and a cellphone circuit having an input coupled to the microcontroller and to the direct current voltage output, the cellphone circuit being operable in response to the control signal from the microcontroller to place a cellphone call to a recipient location and to transmit the voltage data signals and the time data to the recipient location.

As another aspect of the immediately preceding embodiment, the voltage monitoring circuit can comprise an RMS voltage circuit and wherein the voltage output corresponds to the RMS voltage over time at said one of the power lines.

As yet another aspect, the embodiment can further comprise a weather station having an anemometer operable to measure wind speed, the weather station having a weather data output at which wind speed signals representing the measured wind speed are provided, the microcontroller comprising a weather data input coupled to the weather data output, the microcontroller providing wind speed indicating data corresponding to the wind speed signals, and thereby to the measured wind speed over time, the cellphone circuit also being operable to transmit the wind speed indicating data to the recipient location. The wind speed indicating data can also comprise wind gust data. In addition, the weather station can also have a wind vane operable to measure wind directions, the weather station having a weather data output at which wind direction signals representing the measured wind direction are provided, the microcontroller providing wind direction indicating data corresponding to the wind direction signals, and thereby to the measured wind direction over time, the cellphone circuit also being operable to transmit the wind direction indicating data to the recipient location, wherein the weather station further comprises an ambient temperature detector operable to measure the ambient temperature, ambient temperature signals representing the measured ambient temperature being provided at the weather data output and thereby to the microcontroller, the microcontroller providing ambient temperature indicating data corresponding to the ambient temperature signals and thereby to the measured ambient temperature over time, the cellphone circuit also being operable to transmit the ambient temperature indicating data to the recipient location.

As a further aspect, the monitoring and reporting apparatus can be mounted to and/or carried by, and thereby in combination with, a power pole of an electrical power distribution system and wherein the apparatus is mounted to an upper end portion of the power pole. The apparatus can be mounted to a power pole at a location downstream from a recloser and coupled to the power line controlled by the recloser to measure the voltage on such power line at a location downstream of said recloser.

As a further aspect, the apparatus further can comprise a backup battery circuit for coupling to the power lines, the backup battery circuit comprising a backup battery power output coupled to the recloser status indicating current, coupled to the weather station current, coupled to the microcontroller and to the cellphone circuit.

In accordance with a still further embodiment, an electrical power distribution system for distributing electrical power through power transmission lines comprises: a power line distribution section comprising first and second power lines supported along their length by a plurality of spaced apart power poles, a plurality of such power poles carrying transformers that are coupled to the power lines to provide secondary power to end users of power, the distribution section comprising a plurality of reclosers in each of the first and second power lines carried by respective power poles, the reclosers being positioned at plural locations along the length of the first and second power lines, an upstream recloser being a recloser that is closer to a source of power for a specific location in the distribution system where voltage is being monitored and a downstream recloser being a recloser that is further from the source of power for the specific location at which voltage is being monitored, the reclosers being operable to shift between a closed state in which electric current flows through the recloser and an open state in which electric current does not flow through the recloser; a plurality of recloser status monitors for each of the first and second power lines and carried by respective power poles, the recloser status monitors each comprising a voltage monitoring circuit comprising a first input coupled to the first power line and a first voltage output at which a first voltage output signal is provided that corresponds to the voltage at the first power line and thereby to the open and closed status of a recloser through which current flows to the location where voltage of the first power line is being monitored by the voltage monitoring circuit, the voltage monitoring circuit comprising a second input coupled to the second power line and a second voltage output at which a second voltage output signal is provided that corresponds to the voltage at the second power line and thereby to the open and closed status of a recloser through which current flows to the location where voltage of the second power line is being monitored by the voltage monitoring circuit, the recloser status monitor comprising a microcontroller comprising a first voltage receiving input coupled to the first voltage output and a second voltage receiving input coupled to the second voltage output, the microcontroller providing voltage data signals corresponding to the first and second voltage output signals over time and time data associated with the voltage output signals, the voltage output signals indicating the open or closed status of the reclosers that are upstream from the location at which voltage is being monitored by the voltage monitoring circuit, and the recloser status monitor also comprising a cellphone circuit having an input coupled to the microcontroller and to the direct current voltage output, the cellphone circuit being operable in response to the control signal from the microcontroller to place a cellphone call to a recipient location and to transmit the voltage data signals and the time data to the recipient location; wherein the each of the recloser status monitors comprises a power circuit comprising a transformer having an input for coupling to at least one of the first and second power lines so as to receive power from said at least one of the first and second power lines; the transformer having a first alternating current output, the power circuit comprising a first full wave rectifier coupled to the transformer outlet and operable to convert the first alternating current output to a direct current voltage output; the voltage monitoring circuit, the microcontroller, and the cell phone each being coupled to the direct current voltage output; wherein the voltage monitoring circuit comprises an RMS voltage circuit and wherein the first and second voltage outputs correspond to the RMS voltage over time at the respective first and second power lines; wherein at least one of the recloser status monitors carried by a power pole further comprises a weather station having an anemometer operable to measure wind speed, the weather station having a weather data output at which wind speed signals representing the measured wind speed are provided, the microcontroller comprising a weather data input coupled to the weather data output, the microcontroller providing wind speed indicating data corresponding to the wind speed signals, and thereby to the measured wind speed over time, the cellphone circuit also being operable to transmit the wind speed indicating data to the recipient location; and wherein the weather station has a wind vane operable to measure wind directions, the weather station having a weather data output at which wind direction signals representing the measured wind direction are provided, the microcontroller providing wind direction indicating data corresponding to the wind direction signals, and thereby to the measured wind direction over time, the cellphone circuit also being operable to transmit the wind direction indicating data to the recipient location.

As another aspect of the preceding embodiment, the weather station can also comprise an ambient temperature detector operable to measure the ambient temperature, ambient temperature signals representing the measured ambient temperature being provided at the weather data output and thereby to the microcontroller, the microcontroller providing ambient temperature indicating data corresponding to the ambient temperature signals and thereby to the measured ambient temperature over time, the cellphone circuit also being operable to transmit the ambient temperature indicating data to the recipient location.

Exemplary embodiments of monitors and their positioning in an electrical distribution system are provided below. These are examples only and do not limit the scope of the inventive features and method acts set forth herein. The invention is directed toward all novel and non-obvious features of monitors and electrical distribution systems with such monitors disclosed herein, both individually and in all possible combinations and sub-combinations thereof. The invention is also directed toward all novel and non-obvious combinations and sub-combinations of method acts disclosed herein.

BRIEF DESCRIPTION OF THE DRAWINGS

FIG. 4A illustrates an upper portion of a power pole carrying power distribution lines with reclosers in such lines and illustrating an exemplary smart grid monitor (SGM) shown mounted to an upper end portion of the power pole proximate to or adjacent to the power lines. The illustrated smart grid monitor tracks the voltage in the respective power lines, and thereby the operation of the associated reclosers as well as reporting such conditions and timing information, such as via cellphone.

FIG. 4B illustrates a block diagram of an exemplary SGM of FIG. 4A.

FIG. 5B illustrates exemplary circuitry of a landline SGM embodiment including a microprocessor for transmitting the voltage and outage information for controlling the transmission of voltage and outage information to a recipient, such as to a remote recipient computer at a power company central headquarters. FIGS. 5C and 5D illustrate an exemplary circuit of the exemplary landline SGM utilizing a telephone line to provide data signals to the remote computer.

DETAILED DESCRIPTION

Throughout this disclosure, when a reference is made to a first element being coupled to a second element, the term "coupled" is to be construed to mean both direct connection of the elements as well as indirect connection of the elements by way of one or more additional intervening elements. Also, the singular terms "a", "and", and "first", mean both the singular and the plural unless the term is qualified to expressly indicate that it only refers to a singular element, such as by using the phase "only one". Thus, for example, if two of a particular element are present, there is also "a" or "an" of such element that is present. In addition, the term "and/or" when used in this document is to be construed to include the conjunctive "and", the disjunctive "or", and both "and" and "or". Also, the terms "includes" and "has" have the same meaning as "comprises" and the terms "including" and "having" have the same meaning as "comprising".

Figure 1:
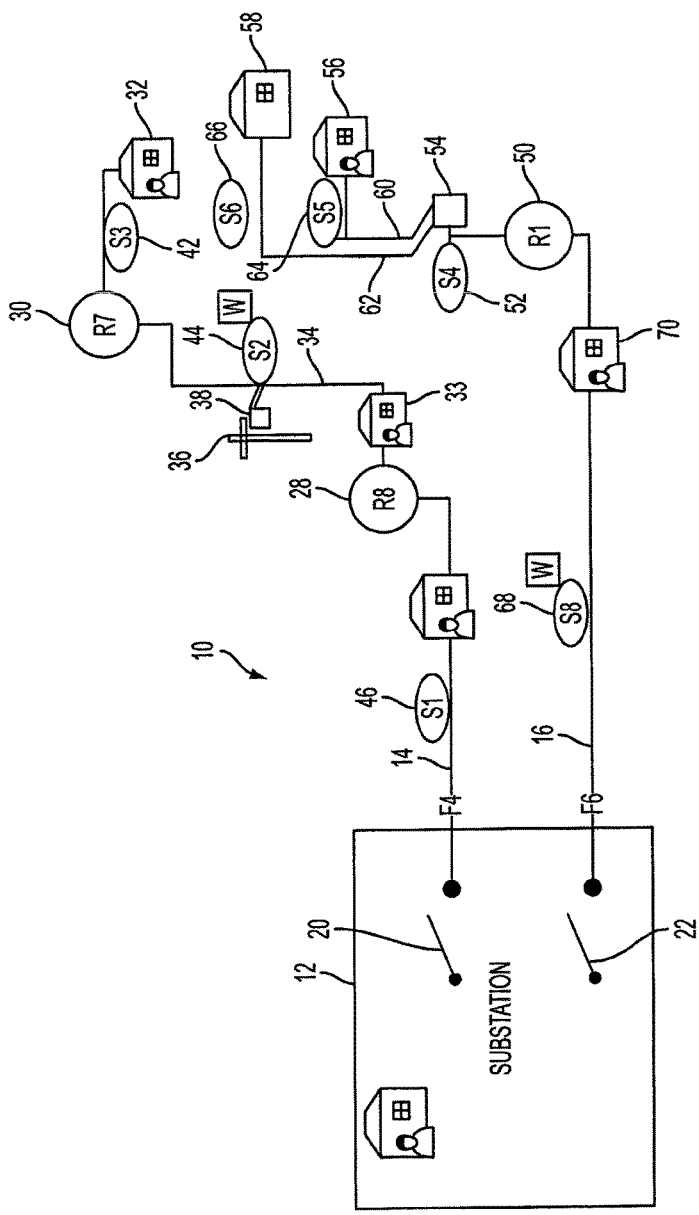
FIG. 1 is a schematic illustration of a portion of a power distribution system 10.

FIG. 1 illustrates a portion of a power distribution system 10 comprising a sub-station 12 with first and second feeder lines 14, 16 (also identified as F4 and F6). Power transmission lines leading to the sub-station 12 are not shown in FIG. 1.

Power is delivered from sub-station 12 to feeder 14 when a sub-station switch 20 is closed. In addition, power is delivered from sub-station 12 to feeder 16 when a sub-station switch 22 is closed. Typically these switches 20, 22 remain closed, unless an alternative source of power is provided to feeders F4 and F6, for example from a different direction not shown in FIG. 1.

Feeder 14 has a plurality of reclosers. These reclosers include a first recloser 28 (R8) and a second recloser 30 (R7). For illustrative purposes, a single end user of power (e.g., factory or residence) is shown downstream in feeder 14 from recloser R7, this end user being indicated by the number 32. In addition, an end user 33 is shown electrically connected to the feeder intermediate to reclosers 28, 30. This section of the feeder is indicated by the number 34. A portion of feeder section 34 is shown supported by a power pole 36. A transformer 38 is shown carried by the power pole. In a typical distribution system there will be multiple power poles and associated transformers to feed power to end users at an appropriate voltage stepped down from the feeder voltage.

A number of monitoring devices are provided in the system. One or more such monitoring devices can be provided adjacent to or downstream from each of the reclosers. In addition, monitoring devices can be provided upstream from the reclosers as well. In connection with feeder 14, a landline type monitoring device 42 (S3) is shown downstream from recloser 30 adjacent to end user's location 36. Alternatively, monitoring device 42 can be a cell phone communicating monitor.

Another such monitoring device 44 (S2) is shown adjacent to transformer 38, such as mounted to a power pole 36 and coupled to a transformer 38. The monitoring device 44 is provided with power from the transformer. Monitoring device 44 is downstream from recloser 28. An additional monitoring device can be provided between recloser 28 and end user 33 if desired. Yet another monitoring device 46 (S1) is shown between the feeder switch 20 and the recloser 28.

Feeder F6 is shown with a single recloser 50 (R1). A monitoring device 52 (S4), which again can be a cell phone type monitoring device 52 is shown adjacent to an underground transformer 54. Transformer 54 is electrically coupled to the monitoring device 52 to provide power to the monitoring device. Transformer 54 is coupled to end users 56, 58 via respective service power lines 60, 62. A monitoring device 64 (S5) is shown adjacent to end user location 56 and can be a landline connected or cell phone monitoring device. Either type of monitoring device can include a weather station. Another monitoring device 66, which can be like device 64, is shown adjacent to end user 58. Another end user 70 is shown upstream of recloser 50. A monitoring device 68, which again can be a power pole mounted, or otherwise positioned, monitor, is located between switch 22 and recloser 50.

One or more of the monitoring devices, and desirably the cell phone activated devices, are provided with an associated weather station sensors indicated by the letter W next to monitoring device 68 and the letter W next to monitoring device 44. Again, one or more or all of the monitoring devices may have associated weather stations. However, the landline devices that are located next to end users typically do not need a weather station as they are often in sheltered areas. Thus, for example, weather station W associated with monitoring device 44 on power pole 36 is positioned to obtain localized environmental readings, such as wind speed, wind gusts, wind direction and external temperature. Consequently, if there is an outage in feeder line section 34 of feeder 14, the outage can be correlated with the weather information to determine if weather affected the outage and whether corrections to that section of the power distribution system should be made in anticipation or in advance of future similar weather conditions.

With a system set up as shown in FIG. 1, momentary outages can be captured by the various monitoring devices and used to indicate such outages and other information. Sustained outages can also be captured and reported. The various monitoring devices can communicate via land telephone lines (in the case of landline monitoring coupled devices) or via cell phone (in the case of cell phone monitoring devices) or other remote communication systems (e.g., satellite) to a central data processing center that is remote from the monitoring stations. The data can be evaluated to address sustained and momentary outage locations.

Figure 2:
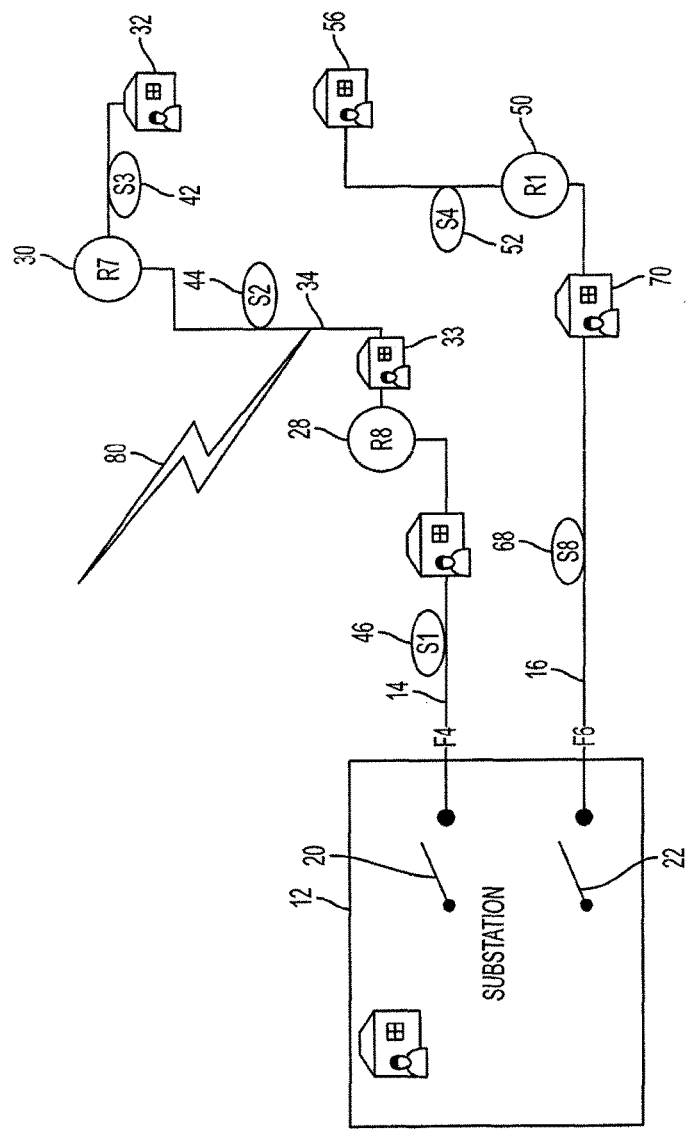
FIG. 2 is a schematic illustration of a portion of a distribution system shown in FIG. 1 in which an event has occurred that has caused one or more reclosers to operate to an open state.
Figure 3:
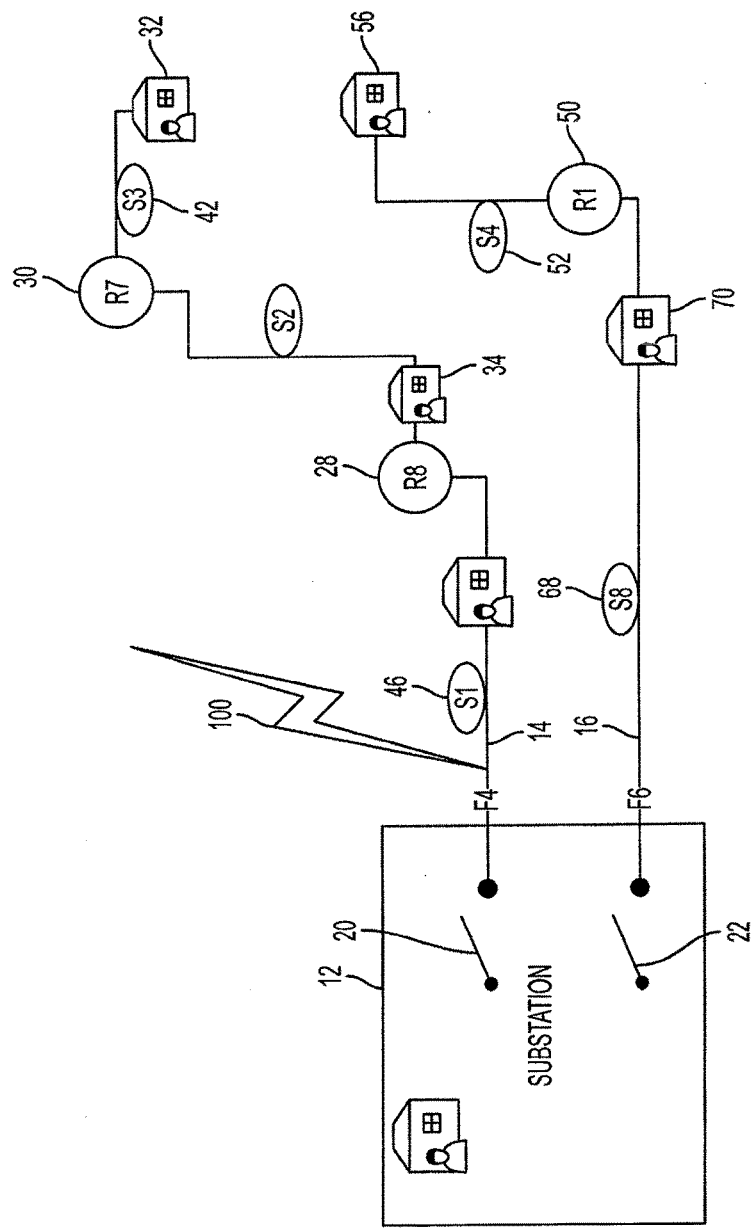
FIG. 3 is a schematic view of a portion of the distribution system shown in FIG. 1 illustrating an exemplary fault causing event that occurred at a different location in the power distribution system than the place of the event causing fault in FIG. 2.

With reference to FIG. 2, which replicates a portion of the distribution system shown in FIG. 1, like numbers for like elements in both FIGS. 1 and 2 have been assigned the same numbers in FIG. 2. In the example of FIG. 2, assume a lightning strike 80 has occurred somewhere along feeder section 34, causing a power surge in this section. Alternatively, other conditions can similarly cause problems in the distribution system, such as a tree falling over a line or a car impacting and knocking over a power pole. As a result of the surge cause by lightning strike 80, recloser 28 and possibly recloser 30 both operate to open. As a result, end user locations 32 and 34 experience an outage. This outage is reported by both monitor 44 and monitor 42. As a result, the power company is aware of the outage. As an alternative, if a fault on feeder F4 causes switch 20 to open, all of the zones monitored by monitor 42, 44 and 46 in this case would be out of power, with the outage being reported back to the central location by all three monitors. In addition, an alarm would conventionally be reported to the central location due to the now open station breaker 20, as well. An outage event that is reported by all three monitors is illustrated in FIG. 3 by a lightning strike 100 impacting feeder 14 between the feeder breaker 20 and the recloser 28, causing the feeder breaker 20 to open and an outage in all the zones served by feeder 14. In FIG. 3, which also discloses a portion of the distribution system shown in FIG. 1, numbers for elements in common with those in FIG. 1 have been given the same number for convenience.

Figure 3A:
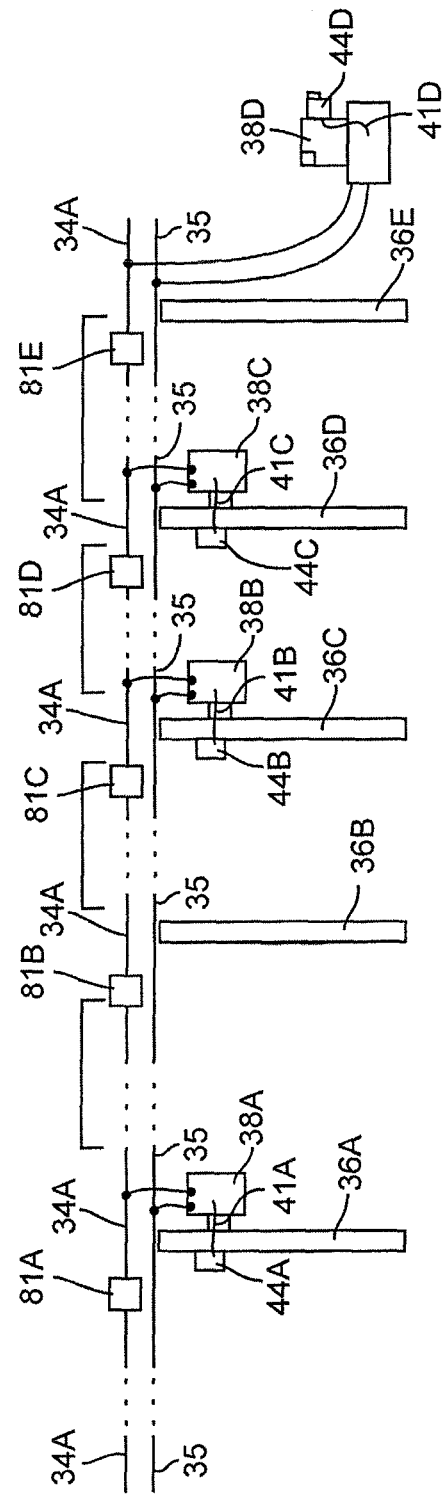
FIG. 3A shows a section of an electrical power distribution system having a plurality of power poles carrying transmission lines and with a number of recloser monitors (SGMs) positioned on various power poles and at other locations in the system.

FIG. 3A illustrates a portion of an electrical power distribution system having a power line 34A, and neutral 35 for a singlephase section of the power distribution system. The power line 34A and neutral 35 are carried by respective poles 36A, 36B, 36C, 36D and 36E as well as by other poles not shown in FIG. 3A. The poles 36A, 36C and 36D carry respective transformers 38A, 38B and 38C. These transformers are coupled to the neutral and are each fed by power from power line 34A. Grid voltage monitors, or SGMS, in accordance with this disclosure are indicated at 44A, 44B and 44C carried by the respective power poles 36A, 36C and 36D. Another SGM 44D is shown mounted to a pad mount transformer 38D. The respective SGMs 44A-44D are supplied with power, in this example, via lines 41A, 41B, 41C and 41D from the secondary side, such as from secondary taps, of the respective transformers 38A, 38B, 38C and 38D. Reclosers 81A are shown in 34A upstream from pole 36A, although these reclosers could be carried by pole 36A. Similarly, recloser 81B is shown upstream of pole 36B, recloser 81C is shown upstream of pole 36C, recloser 81D is shown upstream of pole 36D, and recloser 81E is shown upstream of pole 36E.

In this example, there are a plurality of power poles in this section of the power distribution system, as well as plural transformers. Numerous poles in a power line distribution section typically do not carry transformers as transformers are typically located at locations along the length of the distribution system section where secondary power is provided to an end user, such as to a residence or other location of power use. If the distribution system is a three-phase system, additional reclosers would be provided in the other phases. Also, two and three transformer banks coupling three-phase power to users could also be used. In the above example, the power poles would be separated, such as a few hundred feet or more apart, with the ellipses ( . . . ) between various power poles of this section of the distribution system indicating other power pole locations. In addition, not all of the SGMs need to comprise weather stations as typically SGMs having weather stations are positioned substantial distances apart, such as five or more miles apart. This, for example, SGM 44A may not comprise a weather station SGM whereas SGM 44B may comprise a weather station, and so forth. Typically there are a plurality of SGMs with weather stations in a distribution sub-system or section, such as for example SGMs 44B and 44C having such weather stations. Also, the SGMs are typically conveniently located at a place in the system where a transformer is located such that the SGMs can be coupled to the secondary side of the transformers for voltage monitoring and for obtaining power for operation of the SGMs. In addition, the reclosers may be located on power poles upstream from the SGMs. FIG. 3A is simply one example of a section of a distribution system with SGMs in accordance with the FIGS. 1, 2 and 3 electrical power distribution systems.

A power line distribution system can have smart meters that provide meter usage information to a central location. This works well for obtaining metering information from all areas of a distribution system including remote areas. Smart meters are powered by power from power lines connected thereto for communicating metered power usage information to a central location. As a result, when power is lost so is the communication. This makes smart meters of this type unable to report an outage or continuation of an outage until power is restored. The smart meters typically record and report back an outage message during the next meter read. However, in general, this is not prompt enough for action to deal with repairing outages. Stand-alone outage monitors that are independent of meter usage reporting meters offer a number of advantages.

The system can be implemented so as to automatically ping the various revenue meters (usage meters) after power is restored to receive confirmation of whether power is restored to the meter. This can be done while repair crews are on the scene to provide an alert if any of the meters do not respond to the ping; and thereby indicate possible additional outages that need to be repaired before a crew leaves an area.

The automatic pinging of usage meters can be used to track momentary outages captured by the monitoring devices. When a monitoring device reports an event, such as an intermittent outage, the server can send a ping request to meters downstream from the outage, or proximate to the outage. This will facilitate early outage detection for fused taps that may have lost power as a recloser or station breaker moves to its tripped open and closed states to clear momentary faults. Smart meters that do not reply to these pings can be evaluated as possible additional outages.

By monitoring outages at reclosers, better feeder coordination can be achieved. From the outage data and time sequencing of outages (if time is tracked to a sufficiently fine granularity), one can determine when devices operate that should not have operated (e.g., going through a reclose and open cycle) or that have a mis-timed operation. Often the mis-coordination of reclosers along a feeder is due to reclosers and breakers that sense conditions beyond the next protective (e.g., downstream from the next recloser) zone. The diagnostic and coordination of reclosers that is achievable with outage monitors of this disclosure reduces the number of outages and improves customer satisfaction.

The monitors also provide warnings when an area is experiencing excessive momentary outages (excessive recloser operation). This can be caused by a tree impacting the line, debris from bird nests, broken equipment, and so forth. Identifying the area of momentary outages and addressing the momentary interruptions can prevent a subsequent sustained outage. In addition, repairs can be made during normal business hours to reduce overtime costs associated with off hour outage restorations.

The monitoring devices also facilitate faster response times to outages due to the early alert of outage conditions. In addition, information about the number or frequency of outages assists in identifying where system repairs are more critical. As a result, a utility can target rebuilds and repairs of power lines where most needed.

In a specific example involving monitors of this disclosure, one customer came to a utility and complained: "Every time I start my pump the power goes out." The next day one of the inventors was out standing in the middle of the potato field with the customer. The customer said: "Watch this." The customer then pressed the start button on a pump. The pump started for a second and shut off. The customer then said: "Now watch this." The customer pressed and held the pump start button, which caused the pump to start for a second, shut off for a second, start up for two seconds, shut off for two seconds, then start and stay running. Every week the same thing was happening. The data reported from the monitoring devices showed that every week the feeder experienced several trip close operations that affected a few hundred customers. The cause was a new recloser that had been installed upstream from these customers. It turned out that the size of the customer's pump was not accurately noted on the distribution system, resulting in the new recloser settings being set too low for the current inrush from the customer's pump.

As another example, a utility customer contacted a utility that employed the inventor and stated: "Every other day at 3:30 my lights blink." With the outage monitoring system it was verified that the customer was not exaggerating. For almost a month a recloser had been operating within a few minutes of the customer's complaint. An investigation was scheduled for the next day and the inventor found an irrigation pivot end gun spraying directly onto the power distribution lines. Soon thereafter, the power lines flashed (shorted), the recloser opened, the irrigation pivot shut off, and the recloser closed back in. The pump, however, did not restart because there was no auto restart on this particular pump. Nevertheless, the irrigation pivot kept walking into a part of the field that looked like it hadn't been watered in a month because the drive motor for the pivot restarted. The farmer who owned the field was tracked down. After the farmer finished complaining about how unreliable his power was and that his field was drying up because he couldn't keep water on it, he was informed that it was his pivot that was causing the problems. The pivot settings were adjusted to solve the repetitive momentary fault problem.

In one exemplary form, the monitors comprise voltage monitors that measure the voltage on the low voltage load side of any transformer downstream of a protective device such as a feeder breaker, recloser, sectionalizer, or fuse. If the voltage state changes from on to off, or from off to on, then the protective device has opened or closed and either interrupted or restored power. The monitors (sometimes called SGMs or Smart Grid Monitors) can capture and store these state changes in memory and then call a central server to report the incident. The call can be accomplished, for example, by a toll-free line using a built in telephone transmitter circuit that accesses a land line. As another option, the call can be accomplished using a built in cell phone circuit. Other communication technologies can alternatively be used, but the cell phone and land line approaches are the most desirable.

The telephone model (land line embodiment) can be mounted within a meter base extender that is plugged into a customer's meter base just behind an electric revenue or usage meter. Desirably, with the customer's permission, a telephone line is run from the SGM to the customer's side of the customers' telephone service entrance box. Each breaker and recloser on a distribution circuit desirably will have at least one SGM installed at any one or more of the customers within the breaker/recloser zone of protection. The zone of protection for a protective device refers to that portion of the electrical distribution system that is downstream (further from the power source for the feeder) of the protective device. Thus the power reliability record of breaker and recloser activity for all or substantially all customers provided with power from a feeder is obtained if enough SGMs are used. Note that by using the customer's existing telephone service the communication costs can be limited. Also, a dedicated line such as an 800 telephone number connected to a central server can be used to eliminate added phone charges to the customer.

The cell phone model or embodiment can be installed independently of the customer and therefore has the advantage of being able to be used in areas where land line telephone service is either unavailable or unreliable. Additionally, the cell phone monitor version (and less desirably the land line version of monitor) can include a weather station that is designed to capture environmental conditions such as wind speed, gusts and direction, and ambient temperature. Also, the voltage on power lines can be monitored continuously and can be retrieved periodically or on a near continuous basis. These added measurements allow utilities to obtain a more complete analysis of outage events and power distribution system performance. Utility systems are designed to withstand expected weather conditions. The SGM provides some evidence that outages are occurring when the design limits have been exceeded while reducing communication costs.

With either design the base station data processing system desirably collects and interprets the incoming call data. The base station or central computerized processing system can comprise several modules, such as a "call taker" that answers incoming calls and records the raw data and a call processor that then interprets the data and establishes an event time for the events (e.g., outages) found in the data. The data can be stored in a data base that can easily be exported to a variety of other software based systems or applications for analysis. A visual display and associated interface that allows various utility company employees to readily view the reliability performance of any feeder's recloser or breaker protection zones, such as down to a fine level of granularity, such as to one AC 60 Hertz cycle. Also, outages can be identified quickly and quite possibly forwarded to a repair crew dispatcher before customers begin to call in to report the outage.

A unique advantage of these SGMs is their ability to capture and store momentary outages. Customers do not typically call in to report these events as the power was not interrupted for more than a few seconds. As such, utilities are typically unaware of the number of momentary outage events that take place on their system. Momentary outages can cause the disruption of everything from alarm clocks to industrial manufacturing processes. As such, they are a major source of customer frustration and can be a precursor to potential sustained interruptions.

FIGS. 4A-4K illustrate an exemplary embodiment of a circuit for an SGM monitor utilizing a cell phone for communication purposes.

A power pole 36 is indicated schematically in FIG. 4A (for example, cross arms are eliminated) for carrying power lines 34 of an electrical power distribution system. In this example, there are three such lines carried by pole 36 labeled 34A, 34B and 34C. These three lines carry the respective voltage phases of a three phase elevated power distribution system. A neutral wire is not shown in FIG. 4A for convenience. These voltages are at a desired level for transmission and are stepped down, for example, by transformer 38 to a suitable level for further distribution or use by a consumer.

There are three reclosers shown in FIG. 4A, one per phase, indicated respectively by the numbers 75A, 75B and 75C. These reclosers can be carried by power pole 36; but more typically would be carried by a power pole upstream from power pole 36 to which an SGM 44 is mounted. The term "recloser" refers to devices technically called reclosers, as well as to circuit breakers and fuses which interrupt the flow of current through a power line of the electrical power distribution system. Different recloser types are often used in different parts of an electrical power system. The SGM's can be used with the various recloser types.

An illustrated SGM 44 is shown mounted by a bracket 49 to the power pole 36. Desirably when mounted to a power pole, the SGM is positioned at an upper end of the power pole adjacent to the respective power lines. Respective jumper cables 77A, 77B and 77C, coupled to the power lines 34A, 34B and 34C, interconnect the SGM 44 to the respective power lines for voltage monitoring. Alternatively, and more desirably, the jumpers can be coupled to secondary output taps or to conductors at the secondary side of the transformer 38. This is illustrated schematically by dashed line 41 and secondary voltage taps 43. In one desirable application, the SGMs are coupled to one phase and the neutral in a single phase system. There can be one such SGM per phase in a plural phase distribution line. Also, as explained below, a single SGM can be coupled to the neutral and also have plural voltage monitoring circuits, each coupled to a respective phase of the distribution system that is being monitored. This results in voltage monitoring of the power in the power lines as it is reflected to the secondary side of the transformer. In FIG. 4A, the load side of the particular section of the power line 34 is indicated by L and the source side by S. The load and source sides can be reversed depending upon where power is being fed to this particular section of the electrical power distribution lines. In addition, as distributed generation becomes more common (e.g., customers with solar powered or other generation sources), some power can be sourced from the downstream (L side of the system) as well as from the upstream or S side of the system. Desirably, the jumpers 77A, 77B and 77C are coupled to the power lines downstream from the principle source, as additional information concerning the operation of the system can be gleaned from voltage levels downstream of reclosers. In one desirable example, the SGMs are located on a power pole at a location where there is a service transformer downstream of the power pole carrying the reclosers and upstream of the next recloser.

An exemplary cellphone version of the SGM 44 is shown in FIG. 4B. In this example, the jumper 74A is coupled to a first recloser position determining circuit 120A, the jumper 77B is coupled to a second recloser position indicating circuit 120B and the third jumper cable 77C is coupled to a third recloser position indicating circuit 120C. The circuits 120A, 120B and 120C can be the same as one another. An exemplary circuit is indicated at 120 in FIG. 4D and is described below. The recloser circuits 120A, B and C monitor the voltage on the associated power lines. The voltage level indicates whether the recloser shifts state, such as opens from a closed state, or momentarily changes state without a sustained outage occurring. Information corresponding to the voltage is fed via respective lines 121A, 121B and 121C from the respective recloser voltage detection circuits 120A, 120B and 120C to a microcontroller 140. The timing of changes in state as well as the voltage information can be transmitted to the controller. Alternatively, the controller can track the timing of events from the voltage signals that send information downstream, for example to a central computer at a remote location, such as at a utility company headquarters, for processing to assign a time stamp to each event (e.g., each time a recloser opens or closes, or the voltage drops below or rises above desired limits).

A cellphone circuit 160 coupled to the controller 140 operates in response to control signals to send data signals from an output 161 to the remote computer or to a recipient location. The data signals indicating the voltage levels and thereby the events. Substantially real time information can be provided by the SGMs. A power circuit 170 provides power to the cellphone circuit. The SGM also comprises a power supply circuit indicated generally at 100 in FIG. 4B and described below in connection with FIG. 4C. Circuit 100 comprises an input 101 coupled to the power lines, such as to the transformer 38 in the example of a power pole with a transformer. The power is processed to provide a suitable power output P (for example, DC power) for powering the circuits of the SGM 44. In the event power goes down, for example because of a fault in the system, it can be desirable that the SGM continue to provide data, at least for a period of time until power is restored. For this reason, a battery backup circuit 171 can be provided to supply the power P in the event the power goes off. A charging circuit 173 coupled to the power source 101 maintains the batteries in a charged condition so they are available for use.

In one desirable embodiment, the SGM 44 comprises a weather station 189 with associated sensors for collecting data on environmental factors and for providing signals on a line 191 to the controller 140, such data signals corresponding to the collected environmental data. For example, a temperature sensing circuit 180 can be provided for determining the ambient temperature near the power lines.

Also, wind speed detectors, such as an anemometer 197 and wind direction detectors, such as a weather vane 199 coupled to a weather detection circuit 190 provides data along line 191 related to the wind speed and wind direction.

This weather information provides microclimate information on conditions at the power pole 36 that can affect the reliability of the power line and which allows for proactively changing the configuration of the power line system at the location of the SGM, or in the vicinity thereof, based upon recloser events correlated to the weather conditions. For example, momentary closures short of a power outage can be determined and reported. If it turns out that the momentary closures or flickers occur when wind gusts exceed a particular magnitude or when speeds exceed a particular magnitude, an indication is provided that there is a problem with a particular power line. For example, the wind when it reaches a certain level may be sufficient to blow branches across power line wires that result in a momentary short current. The power company can then, based on this determination and information, send out a power crew to repair the power line (e.g., trim tree limbs) even though a sustained outage has not yet occurred. In addition, ambient temperatures near a particular power line can be higher than expected (for example, the areas may be sheltered and surrounded by heat retaining rocks on a hillside). High temperatures can cause sagging of the wires leading to recloser action. SGM's without weather stations can be installed on power poles as well. SGMs with weather stations can be, and are typically, spaced apart in the system, such as about five or more miles apart. SGMs, with or without weather stations, can be positioned downstream of each recloser location in the system. As an alternative, SGMs are not positioned downstream of each recloser.

In a desirable system, an SGM is provided adjacent to each recloser in an electrical power distribution system or grid so as to allow more precise monitoring of recloser operation throughout the entire system. Alternatively, the SGM's can be placed at selected locations, for example adjacent to reclosers of a feeder where power problems have been experienced, to help locate the source of the problems as well as provide an indication of impending problems in the future. SGM's can be positioned at individual premises, although in such cases weather stations would typically not be used as SGM's at individual locations are typically located adjacent to a meter, which is often sheltered from wind. As another alternative, SGM's can be spaced along a particular feeder line or branch distribution power line, such as near every other recloser or every third recloser, as desired. In addition, such SGM's can be installed in other locations, such as near reclosers in transformer vaults. For example, in the case of underground lines, cellphone enabled SGM lines can, for example, be mounted to a pole where a service transformer is located.

Figure 4C:
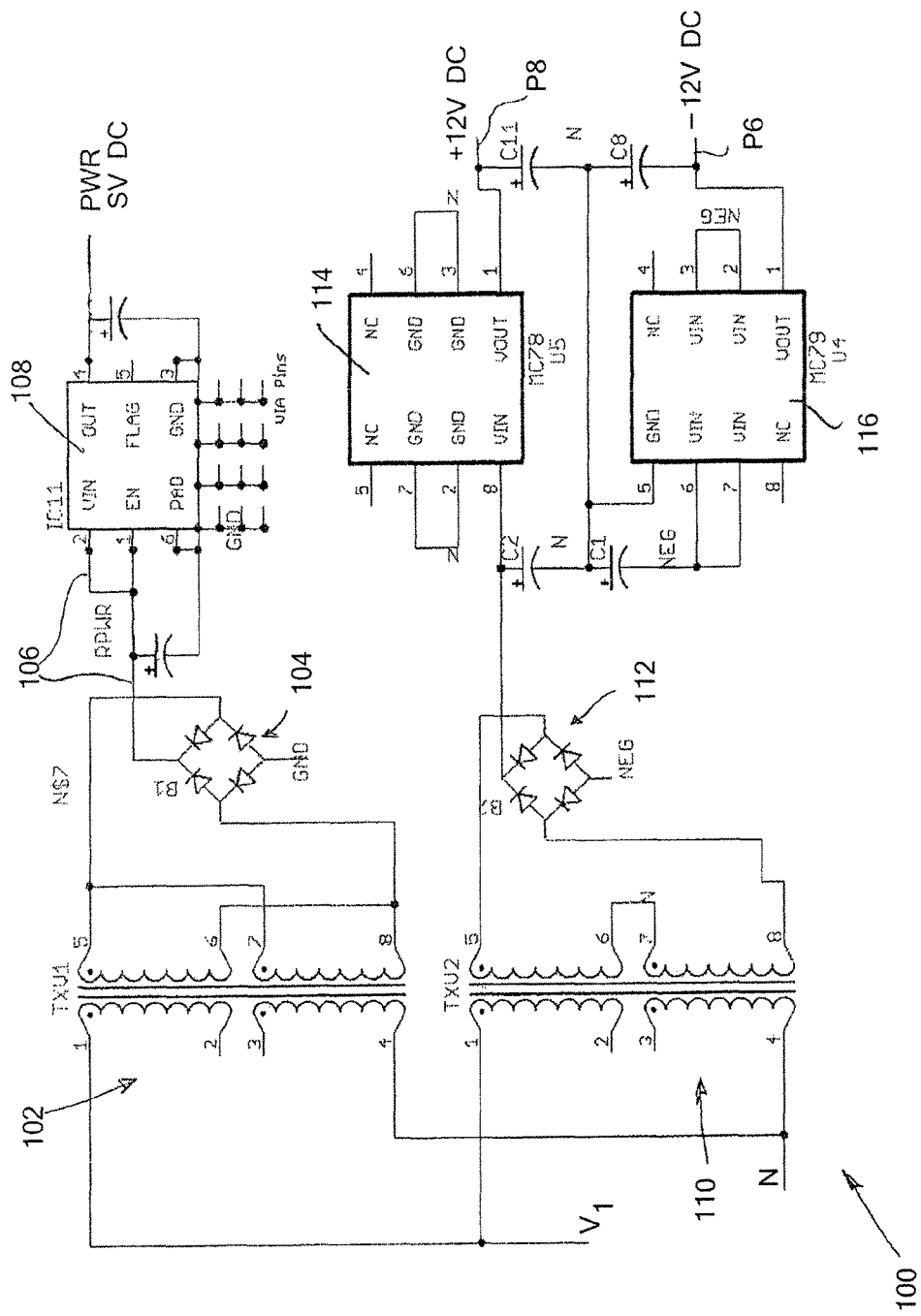
FIG. 4C illustrates an exemplary power supply circuit of the SGM of FIG. 4B.

In FIG. 4C, the circuit 100 provides DC power for the SGM monitor. Specifically, voltage V1 from a phase of a power line (such as at a transformer) and the neutral conductor of the power line is connected to a respective monitor transformer 102. The power is rectified by a full wave rectifier 104 to produce a raw power (unregulated power) output RPWR 106. A voltage regulator 108 regulates RPWR to produce a 5 volt DC PWR output. In addition, the $V_1$ and N lines are coupled to a second transformer 110. Power from the second transformer is rectified by a full wave rectifier 112 and coupled to respective first and second voltage regulators 114, 116. Regulator 114 produces an output P8 of plus 12 volts. Regulator 116 produces an output P6 of minus 12 volts. These outputs are used to power the monitor.

Figure 4D:
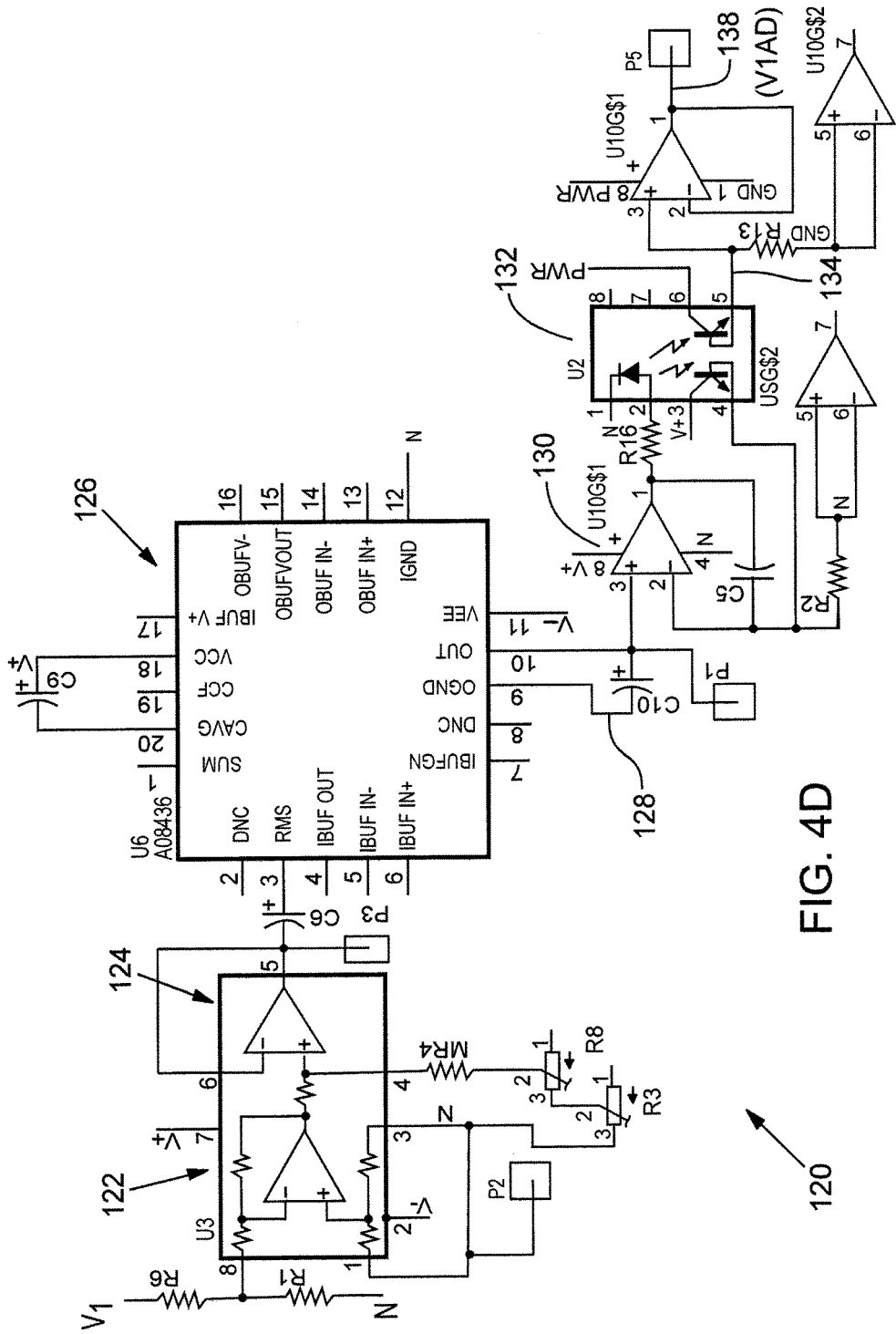
FIG. 4D is a circuit schematic of an exemplary voltage detection circuit for monitoring the voltage in an associated power line.

With reference to FIG. 4D, $V_1$ and $N_1$ lines are also connected to a circuit 120. The circuit 120 is designed to provide a signal indicating the on/off status of the recloser (whether the circuit is open or closed) by determining the voltage level on the line $V_1$ so that the magnitude of the line voltage can be tracked. This circuit also, in this example, provides a signal representing the magnitude of the voltage on line $V_1$. A similar circuit 120 and monitor is desirably provided for each line of a plural phase transmission line set. In this way, each of the individual lines can be monitored for an outage. From the input signals $V_1$ and N, first and second op amps 122, 124 process the signals for delivery to an RMS chip 126, such as a U6 AD8436 chip. The RMS output signal from circuit 126 is fed via a pin 128 to an op amp 130 which operates to smooth the signal. An LED optical isolator 132 isolates the power signals from a direct connection to downstream processing circuitry. Output 134 comprises a linear output representative of the AC voltage $V_1$. This signal is processed by an op amp 136 to provide a V1AD output signal 138 that corresponds to the $V_1$ voltage.

Figure 4E:
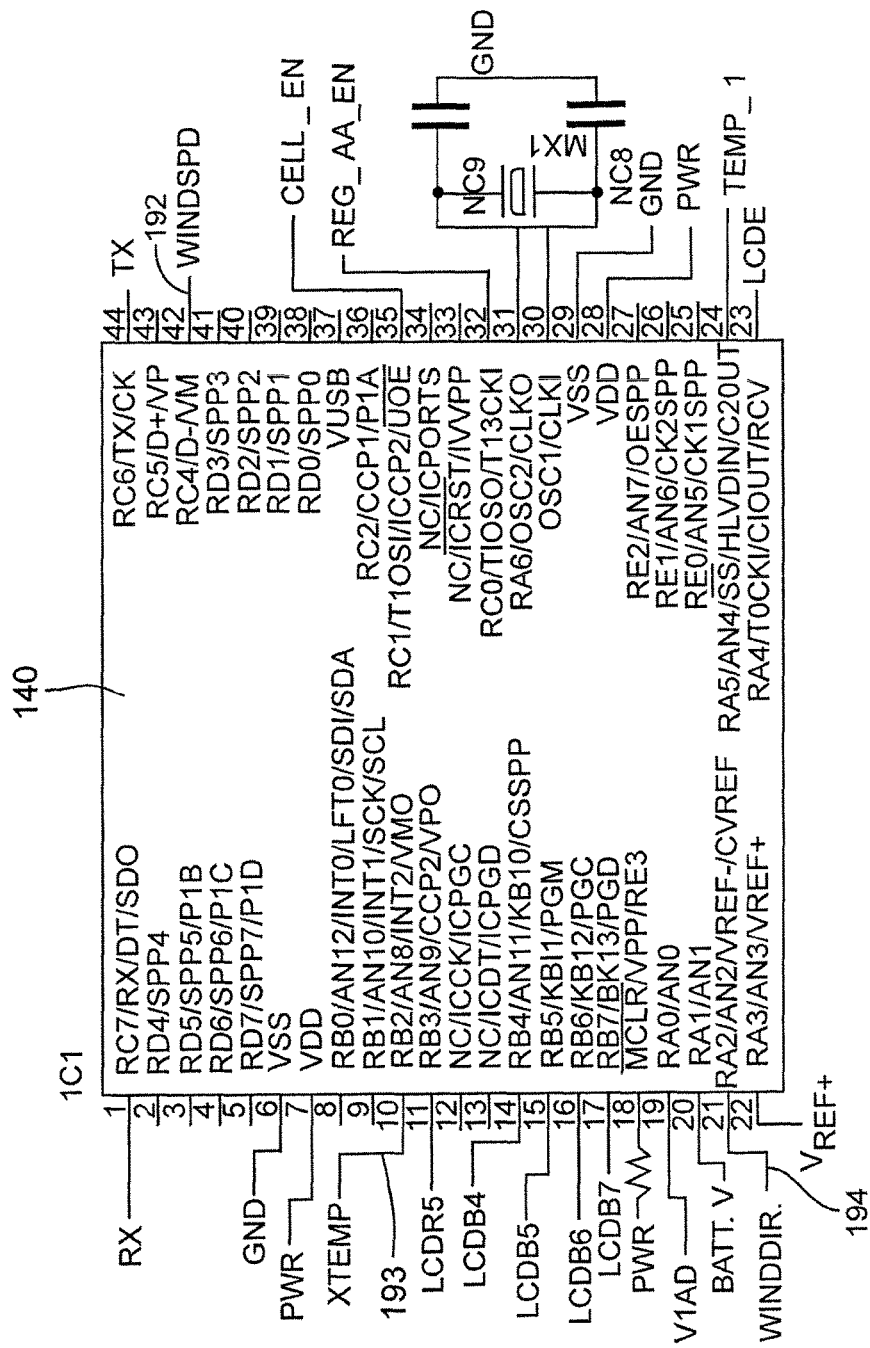
FIG. 4E illustrates an exemplary microcontroller used in the SGM embodiment of FIG. 4A. Exemplary pseudo code describing the steps that can be carried out by the programmed microcontroller is set forth in pseudo code listings found in the application.
Figure 4F:
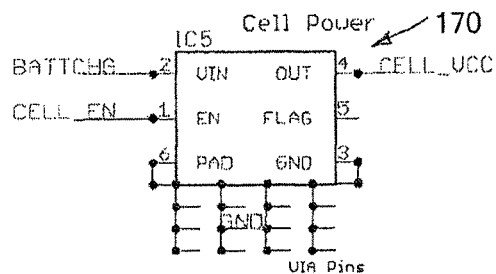
FIG. 4F is an exemplary circuit of the SGM for providing power to a cellphone circuit of the exemplary SGM of FIG. 4A.
Figure 4H:
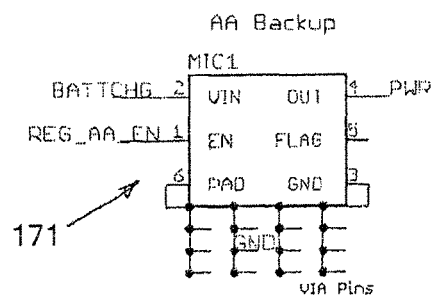
FIG. 4H is an exemplary backup battery circuit that can be used to provide power to the SGM in the event power is unavailable from the transmission line for the SGM, or otherwise when the use of backup power is desired.
Figure 4I:
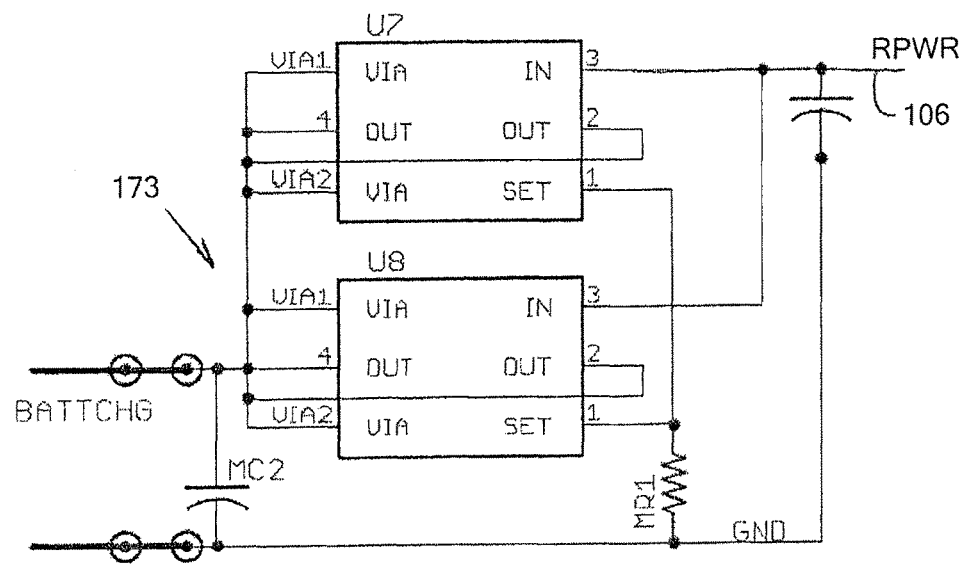
FIG. 4I illustrates an exemplary charging circuit for charging batteries included in the battery backup of FIG. 4H.
Figure 4G:
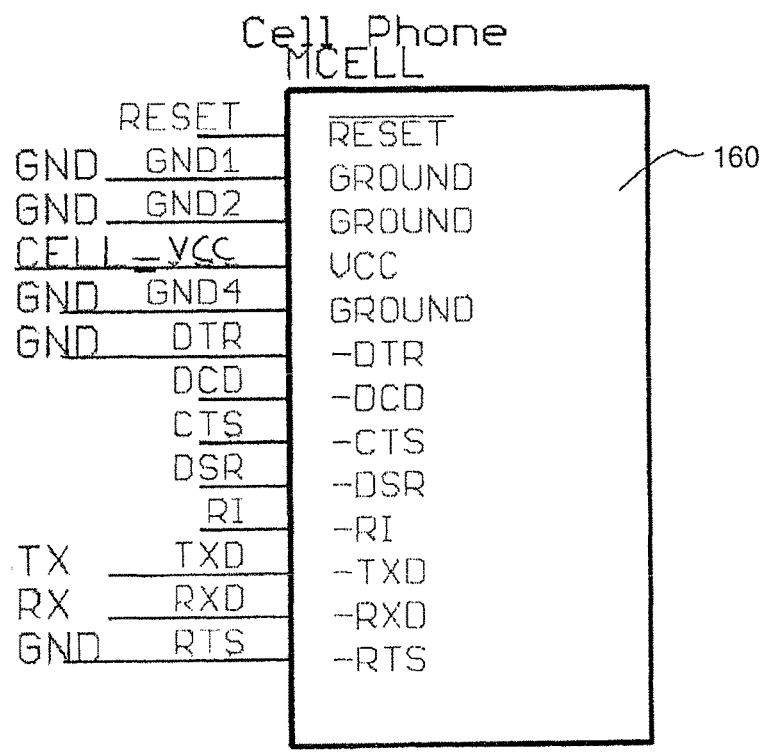
FIG. 4G is an exemplary cellphone circuit that can be included in the SGM of FIG. 4A.
Figure 4J:
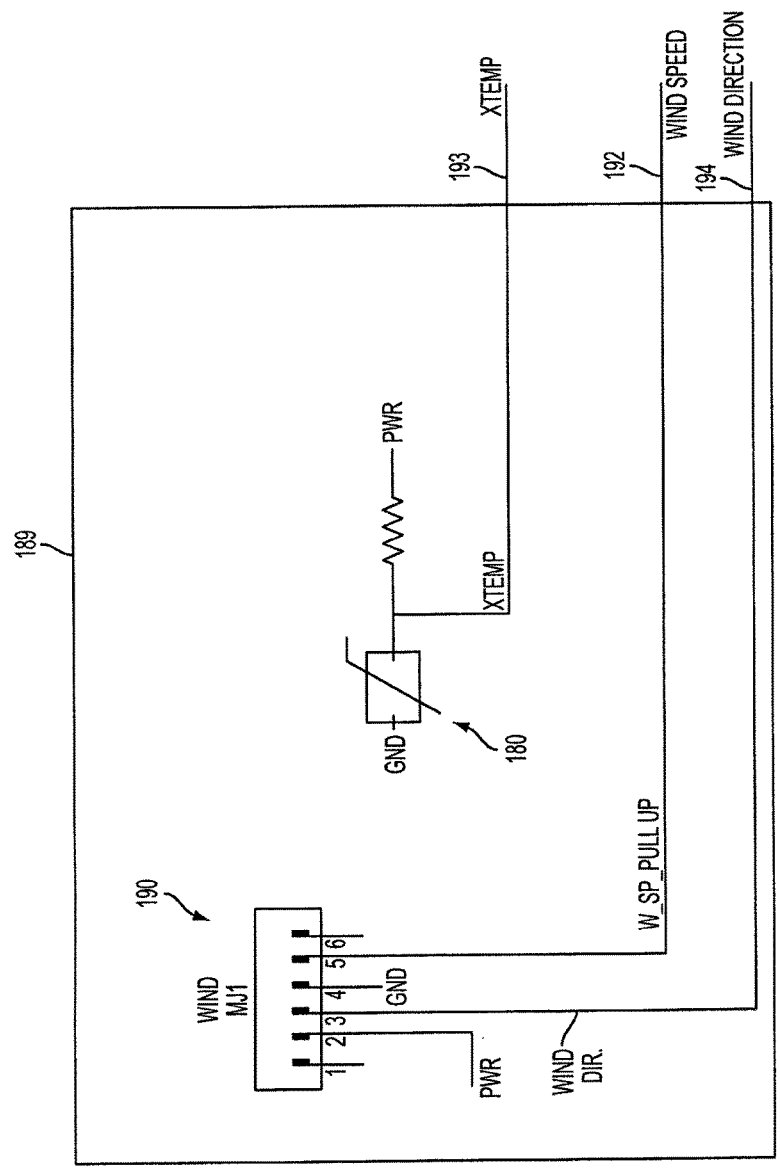
FIG. 4J illustrates an exemplary weather station with associated sensors for collecting data on environmental conditions that can affect power outages and the operation of the reclosers.
Figure 4K:
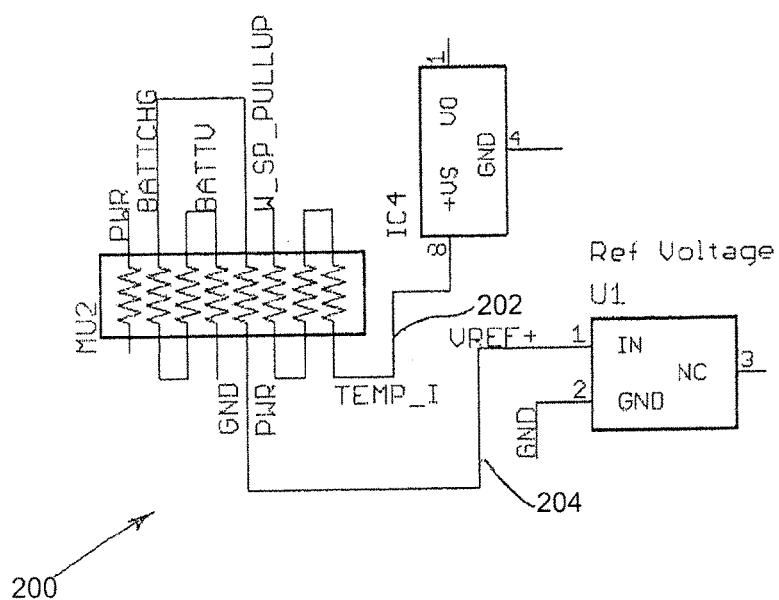
FIG. 4K illustrates a circuit for providing a reference voltage usable in the system as well as an internal temperature of circuits in the SGM, indicative of potential circuit failure problems.

With reference to FIG. 4E, the V1AD output signal is provided to an input pin of a microcontroller 140. The microcontroller 140 can, for example, comprise a PIC 18F 4550 microcontroller. The term microcontroller includes any type of processor suitably programmed to carry out and control the functions of the SGM. A signal corresponding to V1AD is transmitted to a central processor, such as at a remote location (for example at a utility company headquarters) by way of a communication link, such as via cell phone in this example, in response to a cell enable signal CELL_EN from the microprocessor 140 to a cell power circuit 170 (FIG. 4F), and more specifically to the CELL_EN input pin of this circuit 170. A CELL_VCC signal from the cell power circuit 170 is then delivered to the CELL_VCC input of a cell phone circuit 160 (FIG. 4G) to start a cell phone call to transmit data to the remote location. An exemplary cell phone circuit is a model MTSMC-C2-IP-N3-SP circuit available from Multitech. In addition, the cell power circuit 170 receives an input labeled BATTCHG from a battery charging circuit 171 (FIG. 4H) to provide backup power for the operation of the cell phone if needed. The batteries of circuit 171 can be kept charged by a battery charging circuit 173 (FIG. 4I) that receives power RPWR from the circuit of FIG. 4A. The circuits 171 and 173 can be voltage regulators.

The illustrated circuit SGM monitor of FIG. 4B also comprises, in this example, a weather station 189 (FIG. 4J) with associated sensors for collecting data on environmental factors and providing signals corresponding to such sensed data to the microprocessor 140. Although additional environmental conditions can be monitored, in this example an external temperature probe circuit 180 senses the external (ambient temperature) temperature and provides an output signal on a line 193 in the form of a voltage reference XTEMP via a thermocouple to the microcontroller input XTEMP (pin 10). A conventional weather station circuit 190 comprising an accompanying anemometer 197 and weathervane 199 is also included in this example. Davis Instruments is one manufacturer of suitable weather stations. The anemometer can open and close a relay to provide an output signal indicative of the wind speed at 192 that is fed to a wind speed input (pin 42) of the microcontroller. The wind speed indicating output signal is typically conditioned, such as by a pull up resistor to be compatible with the microprocessor 140. The weather station power can be powered by circuit 100 with backup power being provided by the battery backup circuit 171. In addition, the weather station 190 can comprise a weathervane that provides an indication of wind direction. In one embodiment, the weathervane slides a potentiometer as it moves to provide an output that varies with the wind direction, such as from zero to 5 volts DC. The wind direction output 194 from station 190 is also provided to a WIND.DIR. input of microcontroller 140. Wind direction can be determined with reference to a first angle, such as from North. The various signals are conditioned, such as by resistor networks to be at levels suitable for the microcontroller.

In addition, the illustrated embodiment comprises a circuit 200, for, among other things, monitoring the temperature of the circuit board itself and providing an output signal TEMP_I at an output 202 that is fed to the microcontroller. This can be used to diagnose failures of the circuit board such as if the temperature rises above, for example, a threshold. In addition, a reference voltage Vref+ output 204 is also provided from this circuit 200. These outputs are coupled to the microcontroller. Various resister networks (e.g., 205 in FIG. 4K) are used for pulling up voltages to desired levels. In addition, a display 230 (FIG. 4B), such as a liquid crystal display, can be provided at the SGM device for viewing by an individual (for example, someone who has climbed a power pole 36 (FIG. 4A) to look at the device) for a quick visual indication of system data. The liquid crystal display has a number of inputs LCDRS, LCDDB4, LCDDB5, LCDDB6, and LCDDB7 coupled to corresponding outputs of the microcontroller. In response to signals on the respective data lines, diagnostic and other data (e.g., the number of openings and closings of the associated recloser) can be displayed.

Figure 5A:
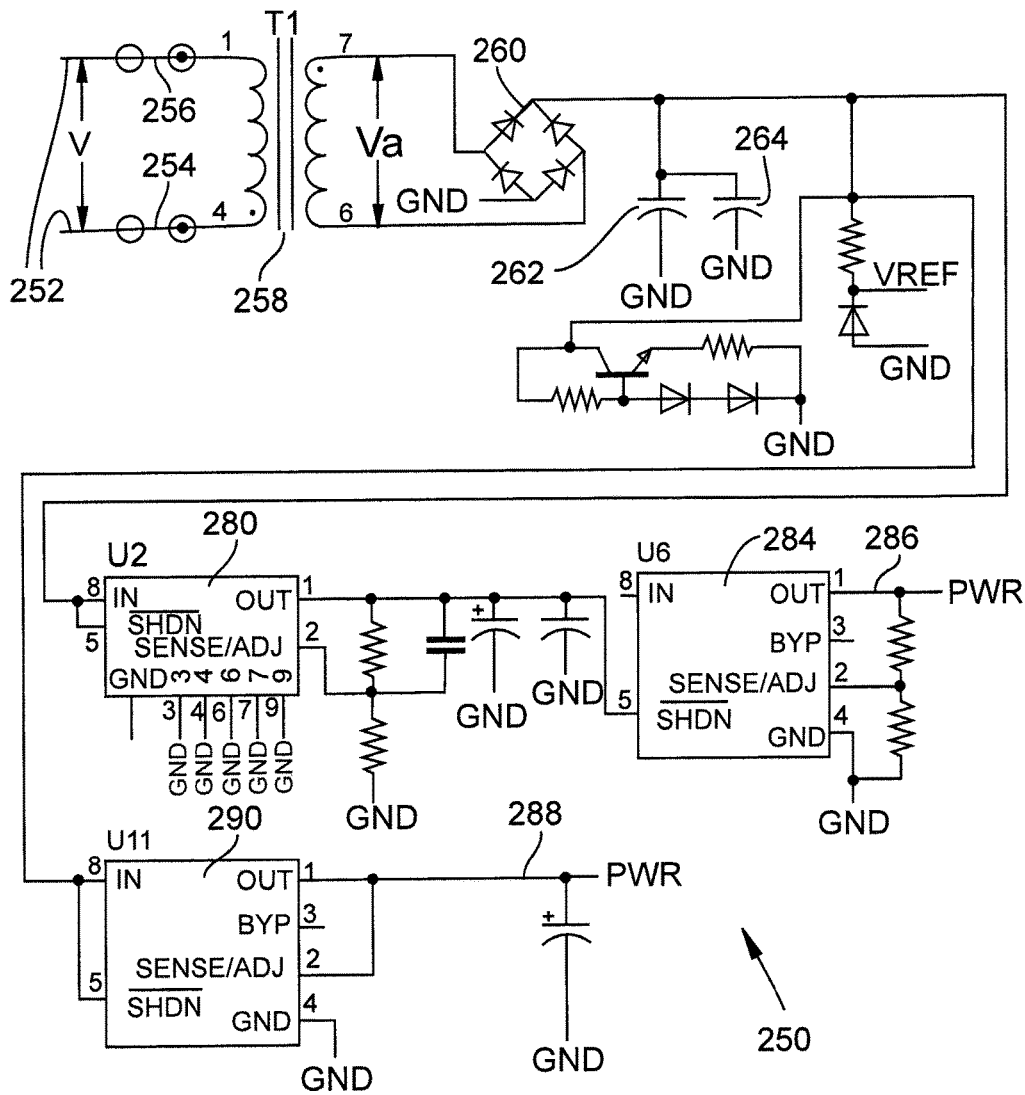
FIGS. 5A-5D illustrate an exemplary landline or telephone version of an SGM. The circuit shown in FIG. 5A is an example of a circuit for detecting power line voltages and thereby outages.
Figure 5B:
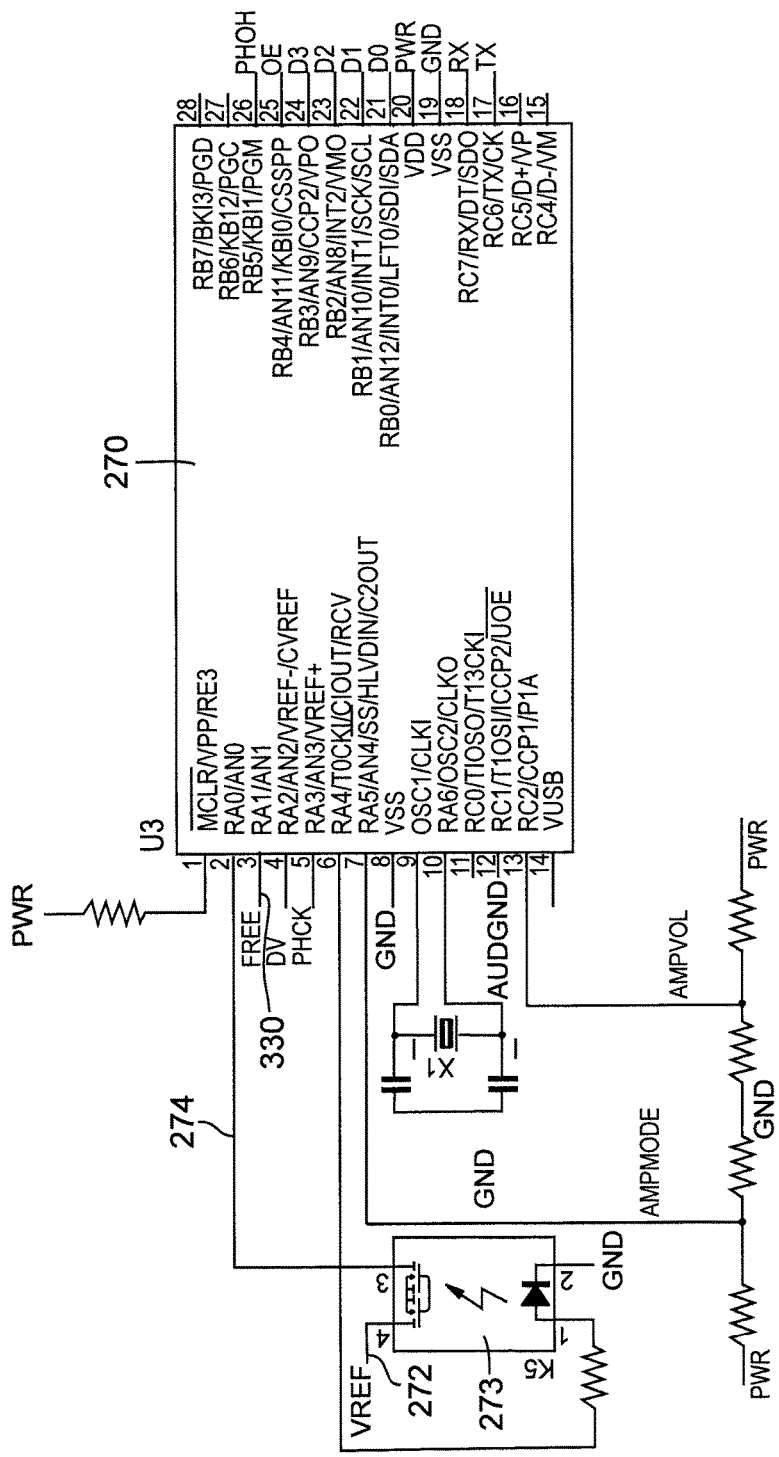
Figure 5C:
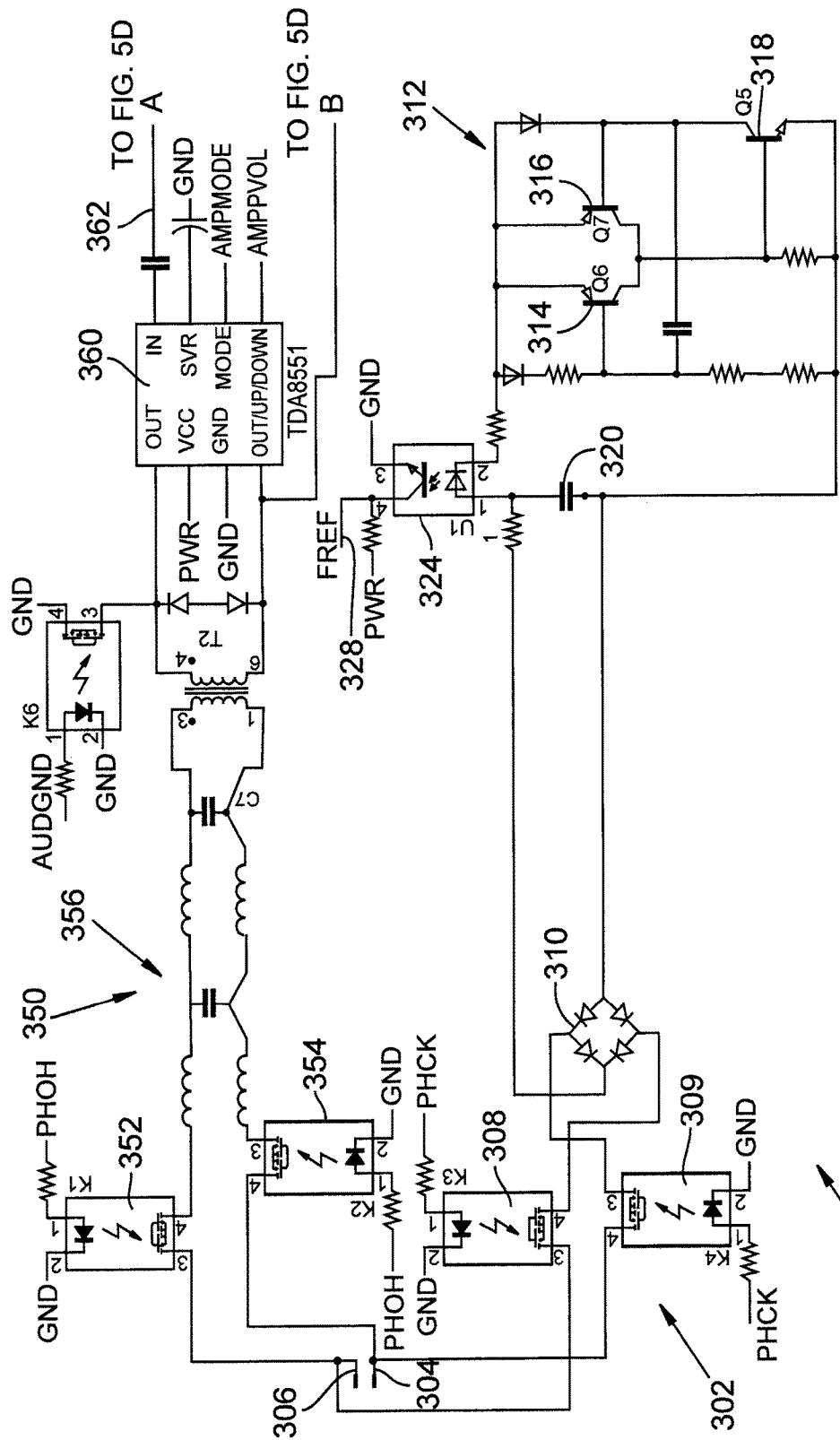

FIGS. 5A-C illustrate an example of an SGM for a phone line monitoring device that transmits monitoring signals, such as via a landline, to a system computer, such as a computer located remotely from the monitoring device.

With reference to FIG. 5A, the circuit 250 is designed to detect an outage. In the illustrated example, the circuit detects the voltage on the power lines such that when the voltage falls, an outage is determined to exist. The circuit is connected to the power lines at 252 by respective wires 254, 256. In this example, the wires 254, 256 can be connected between two phases of a plural phase power line with a typical voltage between the phases being 240 volts, although other voltages can exist. Alternatively, the circuit can operate between one phase of the power line and neutral. A transformer 258 steps down this voltage to a voltage $V_a$ of, for example, 12 volts AC. The voltage is rectified by a full wave rectifier 260 and charges two capacitors 262, 264. The line VREF (266) is at a voltage level corresponding to the voltage across the capacitors 262, 264. A zenor diode 268 limits VREF to a maximum, such as 5 volts in one example. If the voltage rises or drops at V, this change is reflected in the value VREF. The signal VREF is provided to a microprocessor 270 (FIG. 5B) via an input 272 to an optical isolator circuit 273 having an output coupled to a voltage input 274 of the microprocessor 270. The microprocessor 270 can be programed such as explained below. One example of a suitable microprocessor is a PIC18LF2550 microcontroller.

Referring back to circuit 250 (FIG. 5A), the full wave rectifier 260 is also coupled to a voltage regulator 280. A storage capacitor 282 is coupled to the voltage regulator 280 for storing charge that is provided to a second voltage regulator 284 in the event power turns off. Thus, a power output 286 (PWR) that provides power for the circuit is capable of powering the circuit from capacitor 282 for a period of time after the power turns off. In one example, capacitor 282 is 1.5 farads. Another voltage regulator 290 is also coupled to the rectifier 260 to provide a power output 288 for powering the circuit when the power is on.

Figure 5D:
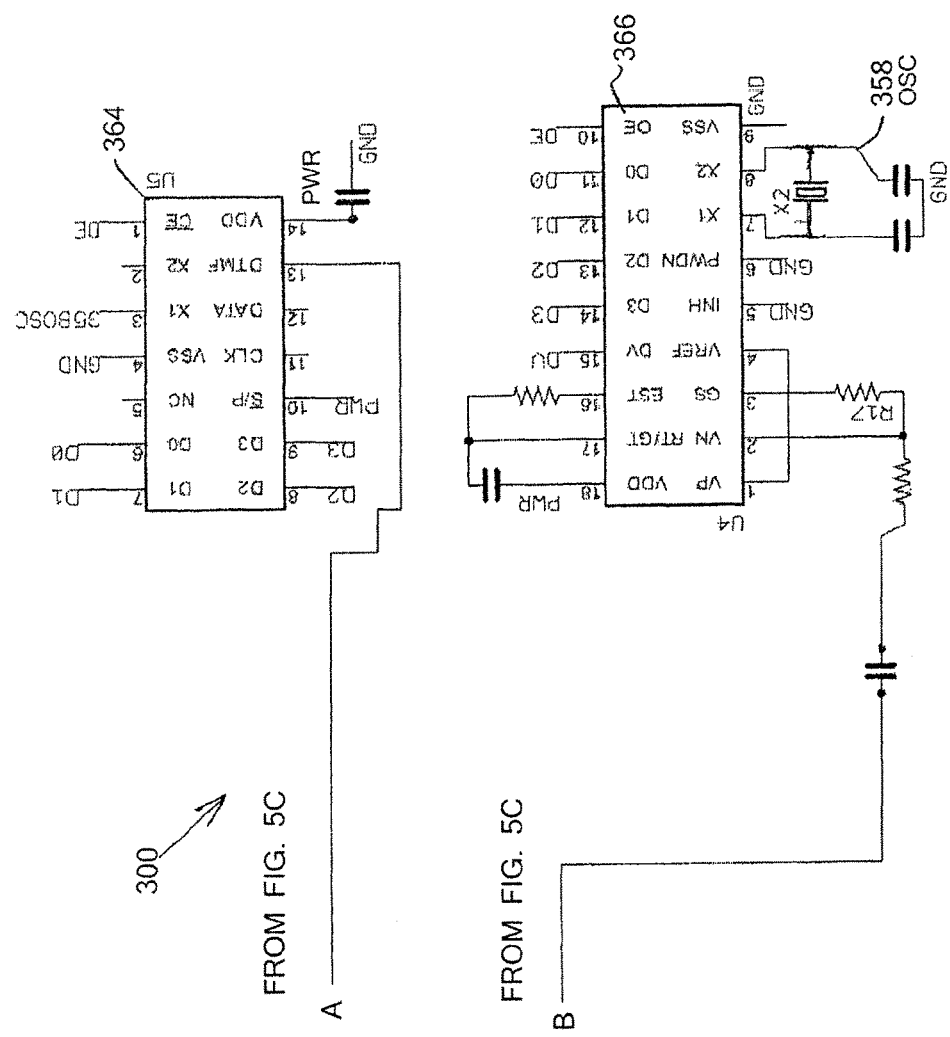

The circuit 300 shown in FIGS. 5C and 5D is designed to use the phone line to provide data signals to a remote computer that can be used to track the outages. A first portion of the circuit 302 is designed to detect whether the telephone is on or off the hook. As previously explained, if the telephone is off the hook, the circuit does not send the data and instead waits until the phone is back on the hook. In an alternative approach, the phone line could be captured in the event of an outage to immediately send outage data, although this is less desirable as it would interfere with the user's use of the telephone.

The phone line output on wires 304, 306 is fed to the circuit 300. Optical relays 308, 309 receive these respective phone line signals and isolate the phone power from the downstream circuit. The signals from circuits 308, 309 are rectified by a full wave rectifier 310 and provided to a circuit 312 that produces an output at a frequency that varies to indicate whether the phone is on or off the hook. Circuit 312 is comprised of transistors 314, 316 and 318. A capacitor 320 is charged by the signals from the phone line. The transistors 314, 316 have their emitters coupled to a capacitor 320 that is charged by the rectified signals from the phone line. When the phone is on the hook, this voltage is typically 45 to 55 volts and drops to about 20 volts when the phone is off the hook. When transistors 314, 316 and 318 are on, a strobe circuit 324 emits light until the charge on capacitor 320 is drained to the level that the circuit is off and the strobe circuit 324 stops emitting light. The capacitor 320 then recharges and the cycle repeats. When the phone is on the hook, the voltage from rectifier 310 is higher than if the phone is off the hook. Therefore, when the phone is on the hook, the capacitor recharges faster than when the phone is off the hook and the FREF (Frequency Reference) output 328 from circuit 324 is higher, indicating the on hook condition. FREF is lower when the phone is off the hook, indicating the off the hook condition. Other on/off hook detection circuits can be used. A signal corresponding to FREF is delivered to microcontroller 270 and can be used to determine whether the phone is on or off the hook. Also, the microcontroller can track when an outage occurred from FREF and a time stamp for the outage and will know the delay from waiting for the phone line to be returned to the hook from FREF. From this information the real time of the event can be determined by the central processor.

The upper portion of the circuit 300, indicated by the number 350, is designed to provide data to the phone line for delivery to a central computer, such as at a utility company headquarters. In addition, in the illustrated embodiment this circuit 350 receives information back from the central computer that can be used to confirm the receipt of the data, such as a check sum match. Circuit 350 comprises first and second optical relays 352, 254 that isolate the downstream portions of the circuit 350 from the phone line power source. A DSL filter 356 can be provided for filtering DSL signals from the phone line outputs. Consequently, the system can still communicate if the customer happens to have DSL service. As DSL becomes more and more obsolete, optional DSL circuit 356 can be eliminated. A transformer 358 steps down the voltage to a level suitable for use in the system. The transformer 358 also provides a galvanic break between the microcontroller and the phone line. An audio amplifier 360 with a digital volume control (see AMP MODE and AMP VOL inputs) is provided. A signal on line 362 (FIG. 5D) is provided to a DTMF CIRCUIT 364 to enable the chip for sending data at the appropriate times. Data at inputs D0, D1, D2 and D3 provided from the microcontroller 270 (the corresponding outputs of the microcontroller being similarly labelled) are translated to DTMF signals for transmission along the phone lines to the central computer. The circuit also comprises a DTMF receiver 366 for receiving signals back from the central computer which can be used to determine if the sent and received data matches, e.g., using a check sum or other verification approach. If no match occurs, transmission can be retried, for example, a plurality of times with seven being one example, to see if a check sum match can be achieved. If not, the data can be ignored.

Figure 6:
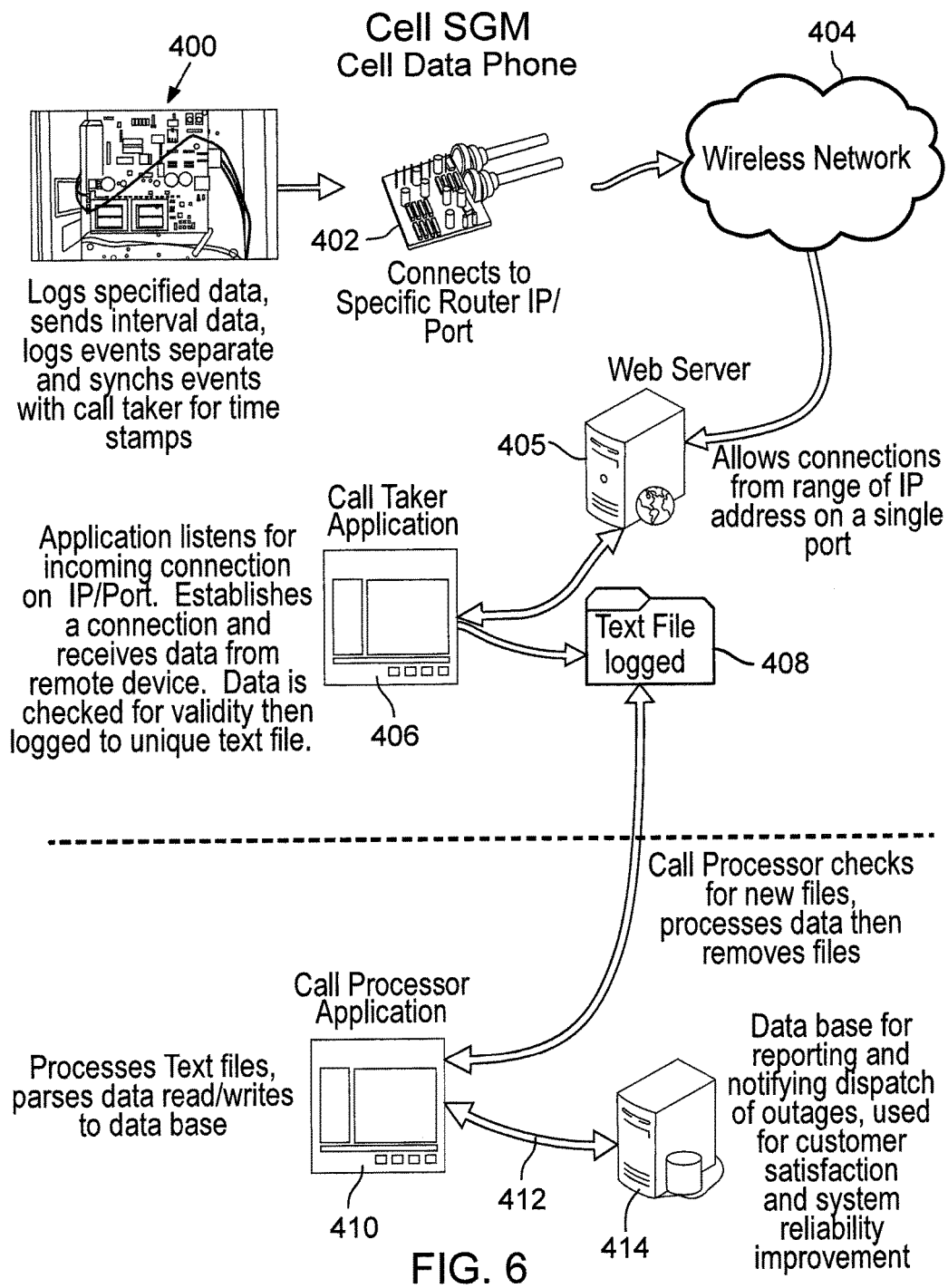
FIG. 6 is a schematic view of an exemplary power grid monitoring system with a cellphone based SGM monitor.

FIG. 6 is a schematic view of an exemplary power grid monitoring system with a cell phone based monitor (SGM) installed. The SGM is indicated at 400. The SGM logs specified data as determined by programming in a microcontroller of the SGM. Information such as interval data (for example the time between on and off power outages), events and synching of events to real time with a call taker for time stamps, is provided to a cell phone circuit of the monitor indicated at 402. The cell phone connects to a router and wireless network 404 for delivery of data via a phone call to, for example, a web server 405. A call taker 406 listens for incoming connections on an IP port of the web server (which can be a plurality of such ports). The call taker 406 receives data from the remote cell phone SGM. Data can be checked for validity and then logged into a text file 408, in this example. A call processor 410 checks for new files, processes data from the new files and then can, for example, delete the files after processing. The parsed data from call processor 410 can be delivered via a communication link 412 (wireless or by wire) to a server database indicated respectively at 414 and more specifically to memory in a computer that stores the database. The server can comprise a standard PC or other computer such as complete with a display, data input device (mouse, keyboard, etc.), memory and processor for processing the incoming data. For example, the database can be processed to report and notify dispatchers of outages.

Figure 7:
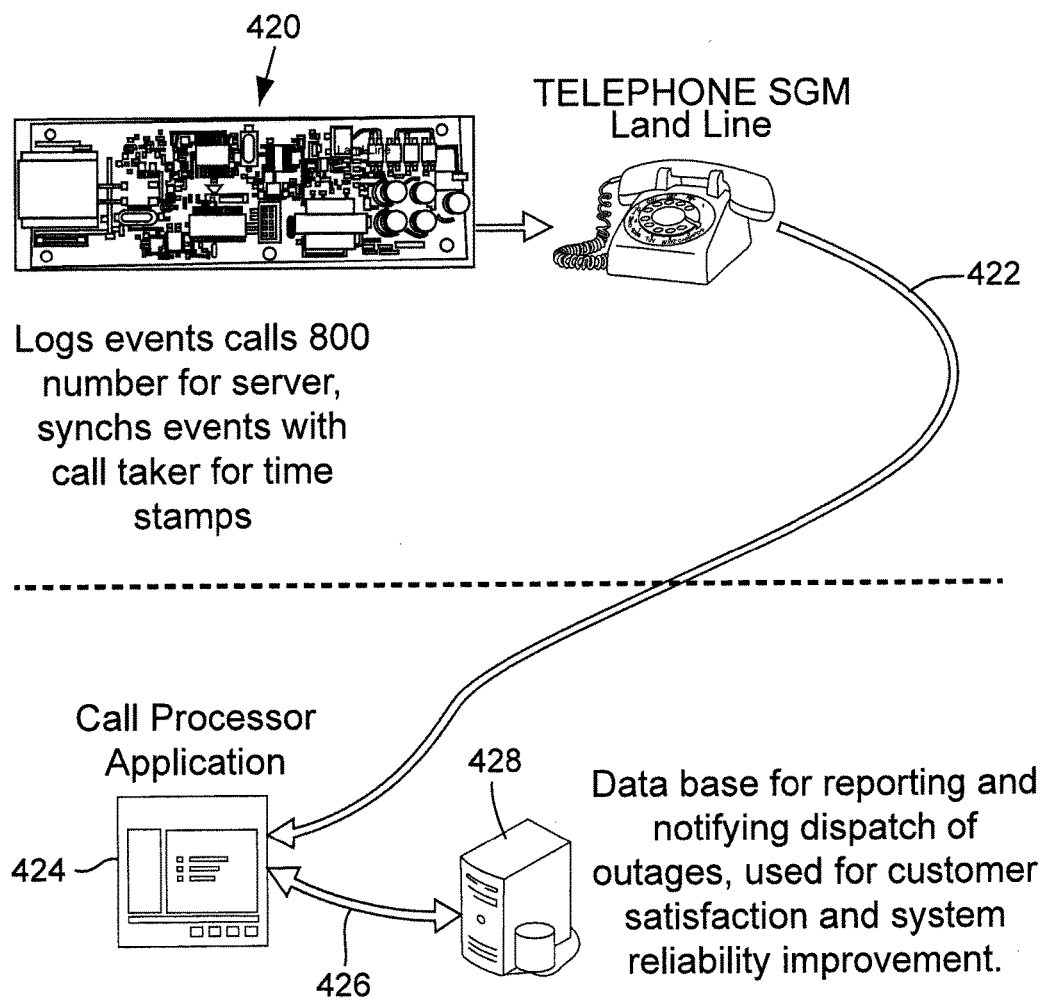
FIG. 7 is a schematic view of an exemplary power grid monitoring system with a phone line version of thane SGM monitor; it being understood that a system in accordance with this disclosure can have both landline and cellphone versions of SGM's, with or without environmental condition gathering components.

FIG. 7 illustrates an exemplary electrical power grid monitoring system with a phone land line version of a monitor. The monitor circuitry is indicated in this figure at 420. The data is delivered via a landline 422 to a call processor application 424. From call processor application, the processed data (like the case of call processor application 410) is delivered via a communication link 426 to a server database 428, which can be the same server and database as database 414 in FIG. 6 and can process data in the same manner as database data is processed in connection with element 414 of FIG. 6.

Figure 8A:
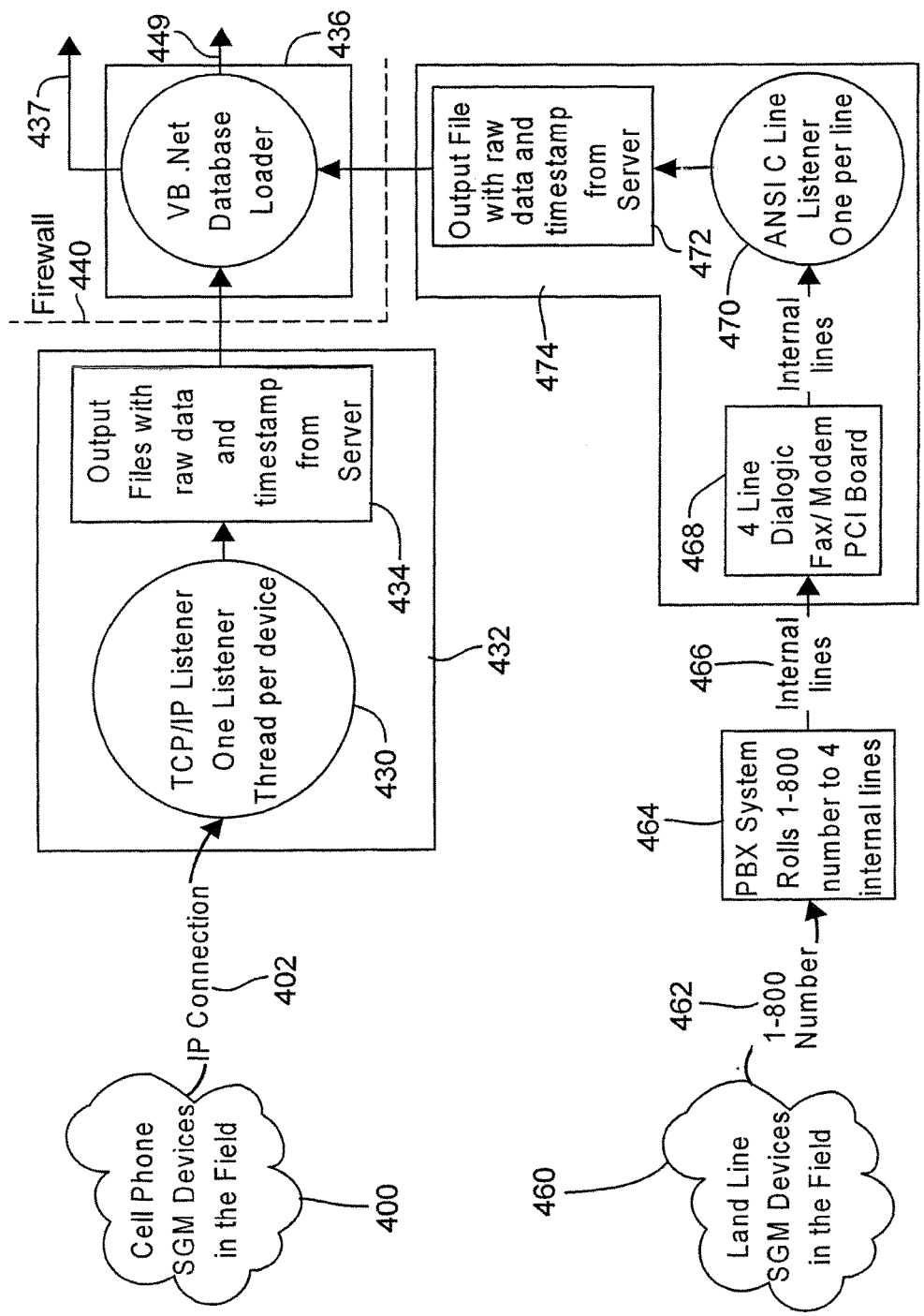
FIGS. 8A-8C illustrate an exemplary system architecture utilizing SGM's in accordance with this disclosure.
Figure 8B:
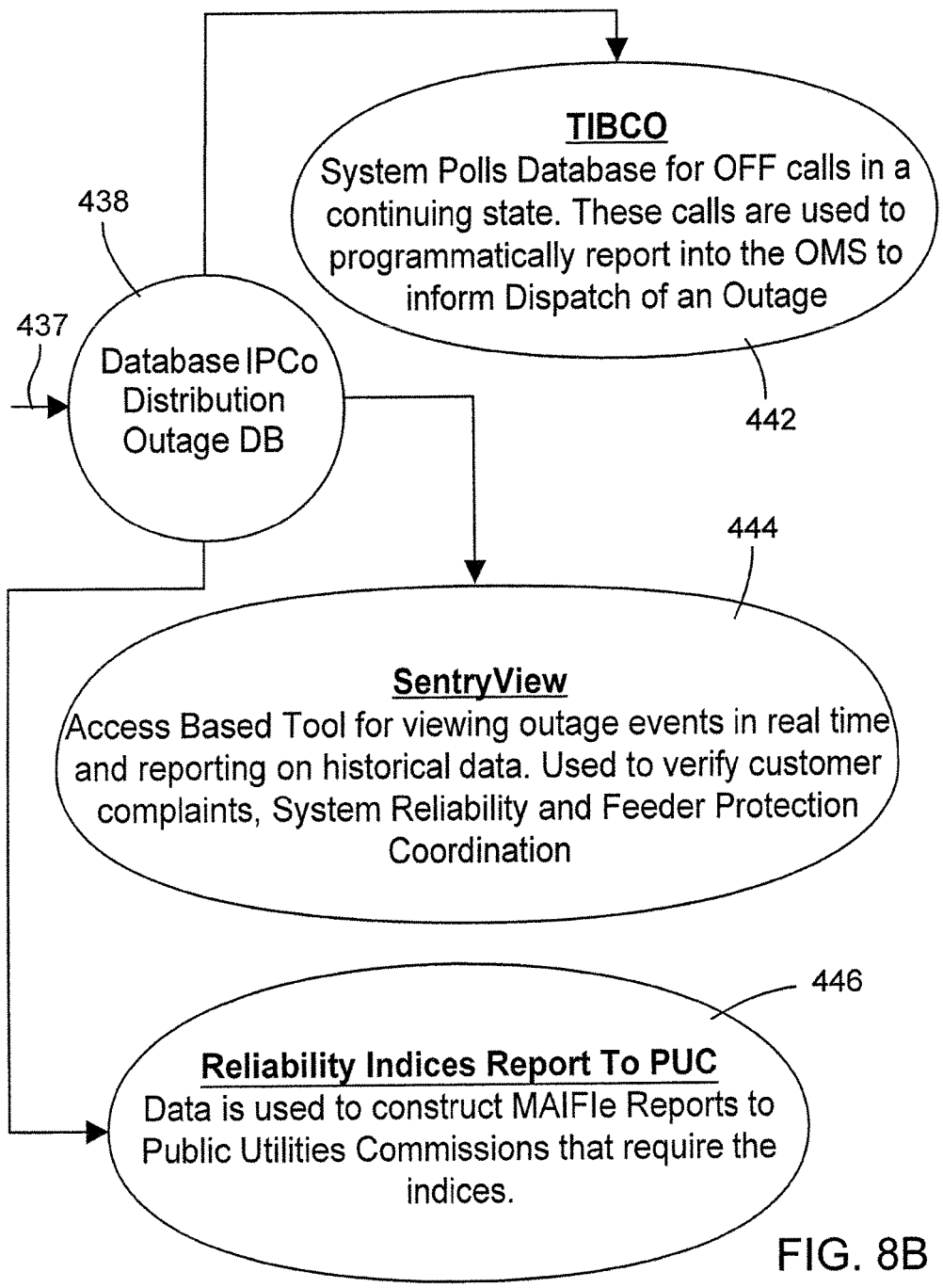
Figure 8C:
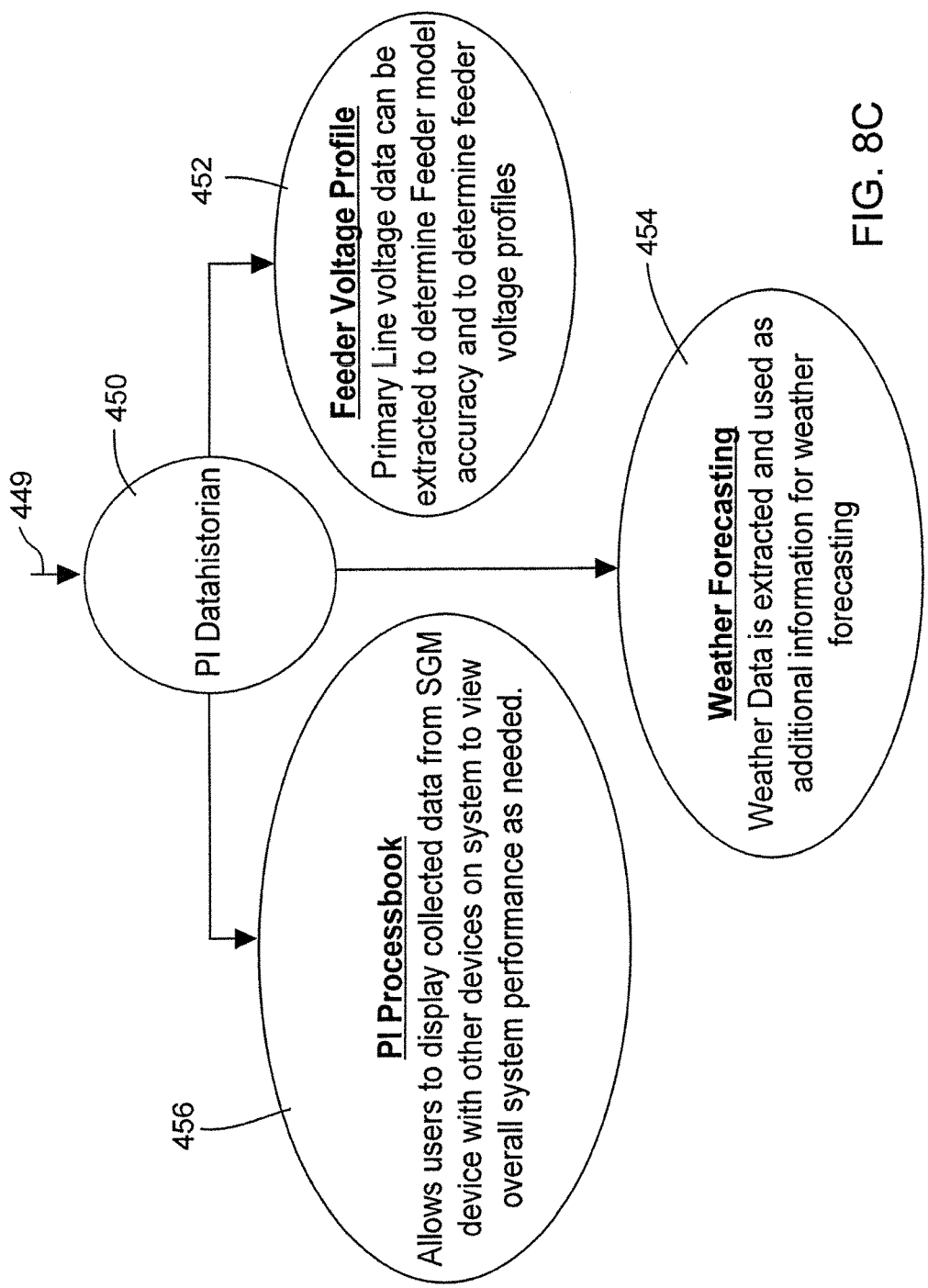

An exemplary system architecture is shown in FIGS. 8A-8C.

The cell phone signals from the cell phone monitors 400 are delivered via an IP connection 402 to a conventional transmission control protocol/internet protocol listener 430. The listener can be a part of a server 432 at, for example, a centralized processing location of a utility company. Data files indicated schematically at 434 are fed from server 432, together with time stamp information from which the real time of an event can be determined from the count of 60 Hz cycles since the event occurred provided the monitor 400. The data is fed to a database loader 436 from which the data is organized and loaded into a system database 438. A firewall 440 prevents access to the utility company's internal computers from external sources. Data is loaded into a database 438 (FIG. 8B) to allows tracking of outage times and locations, for example to a fine granularity, such as to the ten millisecond level. This data can be used to verify recloser coordination. It also can be used to diagnose recloser problems, such as whether a relay or recloser remains open for a specified time before reclosing (e.g., 2 seconds). The operation of the recloser relays can be compared to the specifications for the relays for diagnostic purposes. The data can be extracted from the database 438 and provided to an outage management system (OMS) as indicated at 442 (FIG. 8B). The outage management system 442 can poll the database for power off calls, for example, on a periodic, ad hoc, or continuous basis. These polls are used in determining the existence of outages and for reporting the outages to an outage management system portion of the system, for example, to inform dispatchers of an outage. Momentary as well as continuous or sustained outages are reported in a desired embodiment.

An optional program can be provided for use in reporting and displaying outage events in real time and for reporting such events on historical data. The reports and display can be used to provide an insight into system reliability and feeder protection coordination.

The database 438 can also provide information to a reporting application 446 (FIG. 8B) which can be used to generate reports, such as to a public utility commission, concerning outages and system reliability. In addition, the data from database loader 436 can be provided to a database 450 (FIG. 8C). A suitable database is a PI Data Historian (also called a Plant Information System) from Oil Systems Incorporated. The PI Data Historian in general stores data on a longer term basis for use by the utility as desired. The PI Data Historian, also called a Plant Information System is available from Oil Systems Incorporated. For example, the cell phone monitors can provide information on not only the voltage outages but voltage changes. Consequently, this data can be used to generate a feeder voltage profile at 452. The actual voltage profile from measured data can be compared with mathematical models of the feeder to determine whether the feeder is performing as forecast. In addition, as mentioned above, the monitors can provide weather and other environmental condition data. This data can be extracted from the Data Historian by an application software program 454 for use as desired. For example, micro-weather conditions at specific pole locations can be used to determine whether it is desirable to turn on or off windmills in a power generating wind farm. In addition, changes in the weather sweeping from one area of a distribution system to another area of a distribution system can be tracked and used to forecast, for example, changes in electrical loads on the system. The Data Historian 450 can also be coupled to a search process, such as a searching software application 456 labeled in FIG. 8C as PI Process Book. The PI Process Book comprises a software program that allows users to search and extract the data in the PI Data Historian and provide displays of selected data from the PI Data Historian.

In the flow chart of FIG. 8A, the landline monitors are indicated at 460. These monitors communicate via a landline, such as to a dedicated 800 number indicated at 462 to a conventional PBX system 464. The PBX system can have any number of internal lines, with four internal lines being one specific example. The PBX system can roll the calls to an available line. The calls are then routed via the selected line, indicated at 466, to a modem board 468, with a four line dialogic fax/modem PCI board being one specific example in the case of a four internal line system. The information from the modem is passed to a line listener, such as one ANSI C line listener 470 per line. The data extracted by the line listener is provided in the form of an output indicated at 472, such as a text file like the output 434 that provides the raw data and time stamp in this example from a server 474 to the database loader 436. The database loader 436 operates as previously described.

Exemplary software programs in pseudo code format and exemplary data files are set forth in the listings found at the end of the description and prior to the claims; and as described below, set forth a specific example of suitable programming that can be used for the various components of the system. The pseudo code will be understandable to one of ordinary skill in the art. Only a brief discussion of certain aspects of the code is set forth below. It is understood that the code disclosed in these listings can be modified, without departing from the inventive principles disclosed herein.

Listings 1A-1H illustrate an exemplary firmware for the cell phone monitor.

Listing 2 illustrates exemplary pseudo code for capturing data from an event (e.g., an outage) in an exemplary land line monitor.

The programming of the microprocessor in the landline monitor will be understood with respect to Listing 2, that discloses an example of the resulting data as processed by a Line Listener 470. The microprocessor 270 (FIG. 5B) is programmed to capture the data, in the example given in Listing 2.

In the example of Listing 2, the first data point is indicated by data group A and assigned the number 2 in this example. This data group A indicates the model number of the particular monitor. The next data group B identifies the call type. The call types in this example can be as follows: Power on (the system is rebooted); Outage call I (first state on to off); Outage call II (first state off to on); and a Test Call (such as one per week).

The next data group C (five characters in this example) identifies the SGM device by ID number, from which the location of the device can be determined. For example, location data correlated to SGM IDs can be stored in a lookup table in the system database so that the location of the monitor from data group C can be determined from the lookup table and monitor ID. The next data group D indicates how many cycles since the event began. Data group E indicates how long the event has been in the identified state since it changed. This information can be used to adjust the real event time to within a fine granularity, such as within 6 milliseconds to ten milliseconds.

Data group F indicates the state of the next event. If the value is fffe this means the event is still in the current state (off if it was off or on if it was on). If the sequence of events describing the outage continues to produce events the device will provide up to eight events in a single call. If more than eight events occur they will be captured in the next call and so forth. Data group G (at ffff) means that eight events have not yet occurred. Data group H is a check sum and Data group I is a termination indicator with "a" indicating the termination of data related to the call. The time stamp in the data file is provided by the server and is the time the call was received. The Line 1 text indicates that the call was received on Line 1 of the Dialogic Board.

The check sum in the above example is a value calculated based on the data contained in the message. If the server calculation of the check sum does not match the check sum provided by the SGM the data is considered invalid and a call complete termination from the server to the SGM will not be generated and the SGM will try again up to eight times. In the above system, in one example, if the user of the telephone is still using the phone about 15 minutes after the event occurred, the event is not captured.

Listings 3A and 3B illustrate exemplary pseudo code for one form of TCP port listener 430 in the system of FIG. 8A.

Listings 4A, 4B, 4C and 4D together illustrate exemplary pseudo code for one form of a line listener 470 of FIG. 8A. In this exemplary code, at lines 500 and 502, if an error is generated by the line listener or there is an unexpected code result, the error can be trapped (e.g., stored) and the phone call hung up. This is standard with such listener boards from Dialogic. On the other hand, if the code is as expected, the incoming call is answered at 504 (Listing 4B). In the event an incoming call is identified at 504, the procedure continues at the "answer incoming call" sub-routine. In these listings, the dialogic board error handling 500 (Listing 4C) and code error handling 502 (Listing 4D) can simply involve printing the error as the appropriate reaction.

Listings 5A, 5B, 5C and 5D together provide example pseudo code for an exemplary database loader 436 of FIG. 8A. At line 520 (Listing 5B), if the system includes a PI Data Historian 450 (FIG. 8C), part of the process involves constructing a file name for PI Data Historian based on time stamps. In one example, the file is reset after 180 calls to start over. Loop 530 of Listing 5B relates to loading data files obtained from the landline monitor data. Loop 540 of Listing 5C involves files obtained from cell phone monitors.

Listings 6A and 6B set forth exemplary pseudo code for inserting event data (e.g., power on/power off data) into the database 438.

Listings 6C and 6D illustrate exemplary pseudo code for inserting interval data into the database.

Listings 7A and 7B illustrate exemplary pseudo code for loading phone and cell device event calls into the database 438.

Listing 8 illustrates exemplary pseudo code for loading phone line device power on calls into the database 438.

Listing 9 illustrates exemplary pseudo code in one example for loading cell phone device interval calls into the database 438.

Listing 10 illustrates exemplary pseudo code for use in joining location data once the monitoring device identification is received. This sub-routine is used to insure that collected data is not stranded because of lack of location information on the device. For example, the monitoring device may have been installed but the location of the device may not yet have been included in the system database when data is reviewed. Once the location of the device is included in the system database, the data that is collected prior to knowing the location of the monitoring device can then be entered into the database in association with the location and device.

Listings 11A and 11B disclose exemplary pseudo code for loading cell device event calls into the system database.

Listings 12A and 12B illustrate exemplary pseudo code for loading cell monitoring device interval calls into the database and into the PI historian if being used.

Listing 13A is an exemplary data file for indicating a "power is on" event in a cell phone monitor example constructed by a TCP Line Listener 430. The first data line A in Listing 13A indicates the particular monitoring device is a model 3, version 2. Data line B indicates the ID number of the monitoring device and thus its location can be determined. Data line C indicates the date and time of the event. Data line D indicates the power status, namely power is on. Specifically, data line D indicates the power is back on after having been powered down. If the power had not been powered down, this line would have a different entry.

Listing 13B illustrates an example data file for the cell version of the monitor for an outage event. In this case, data line D has a code S8T that is an event call, indicating power has been lost. Data line C includes the time stamp.

Listings 13C and 13D illustrate an example data file for a cell version of the monitor where multiple events have occurred. Again, the model and version number of the device is indicated by the data in line A. The device ID is indicated by the data in line B. The different states are indicated by the data lines E. In particular, data line F indicates that this data occurred 28.1 seconds before the time stamp. The zero indicates that the event was the power turning off. The data line G occurred at 27.410 seconds before the time stamp. The 1 at the end of data line G indicates that the event went on. The duration of the event would be the difference between 28.1 seconds and 27.410 seconds. The last event H (Listing 13D) is at the time stamp because the time is 0.00. In addition, the 0 at the end of this line of data indicates that the power went off.

Listings 13E and 13F illustrate an example text data file with an error. In Listing 13D, as previously described, line A indicates the model and version number and data line B indicates the ID number of the particular monitoring device. The next four data lines referenced by C indicate average voltage readings at different times taken on Sep. 17, 2013, the times ranging from 14:36:35 to 14:49:32 with the voltages ranging down to 0.18 volts corresponding to an outage. The next four data lines D in this figure indicate the maximum voltages on the particular line that is being monitored at the same times as for data lines C. The next four data lines E indicate the minimum voltages at the same sampling times. The next four data lines F indicate the external or ambient temperature obtained from the temperature probe of a weather station at these sampling times. The next four data lines G indicate the board temperature internal to the device at the sampling times. The next four data lines H indicate the backup battery voltage. The next four data lines I indicate the wind speed at these times. The next four data lines J indicate the wind gusts (note, in this example I and J are zero, since there is no wind). The last line K indicates the wind direction (in degrees from North in this example). Data line L indicates the signal strength from the cell tower system at a specified time. The data line M indicates that an error has occurred and the nature of the error, in this case the monitoring device shut down unexpectedly, event data lost and cell reported no carrier and a low battery.

Listings 13G and 13H are like Listings 13E and 13F, except no error has been reported.

Listing 14 illustrates exemplary pseudo code for a test call for a land line monitor.

Listings 15A and 15B illustrate exemplary pseudo code for land line type monitor device in the event of an outage, with the first state being an off condition.

Listings 16A and 16B illustrate exemplary pseudo code for a land line type monitoring device in the event of an outage call with the first state being on.

Listings 17A and 17B illustrate exemplary pseudo code for reconciling outage events upon restoring power to the monitoring device.

EXAMPLES

The first four examples demonstrate the operation of a Smart Grip Monitor (SGM) for monitoring an electrical distribution grid and enhancing the reliability of such power grid. The SGM supplies a Distribution Outage Monitoring system (DOMS) with sufficient data to track voltage interruptions as defined in IEEE Std. 1159-1995. The last two examples demonstrate the SGM's ability to supply sufficient data to detect sag/swell voltage activity. The system is capable of monitoring recloser (including breaker activity) in near real time for both electronic and electromechanical devices. Tracking of momentary, temporary and long duration system variation as defined in IEEE Std. 1159-1995 can be accomplished by the system of this disclosure. In addition, coupling of power quality/reliability data to weather data enables the monitoring of additional parameters to aid in determining external casual factors for events and to allow for analysis of system performance and system design practices.

The power grid itself can be modified for improved performance. The examples below show the unique ability of the device to track voltage events. These examples are followed by statistical analysis examples that show how the SGMs provides a unique way to view power distribution system performance using parameters that no other existing system supplies.

Outage Detection Examples

Example 1-Real Time Data for a Sustained Outage Event

Figure 9:
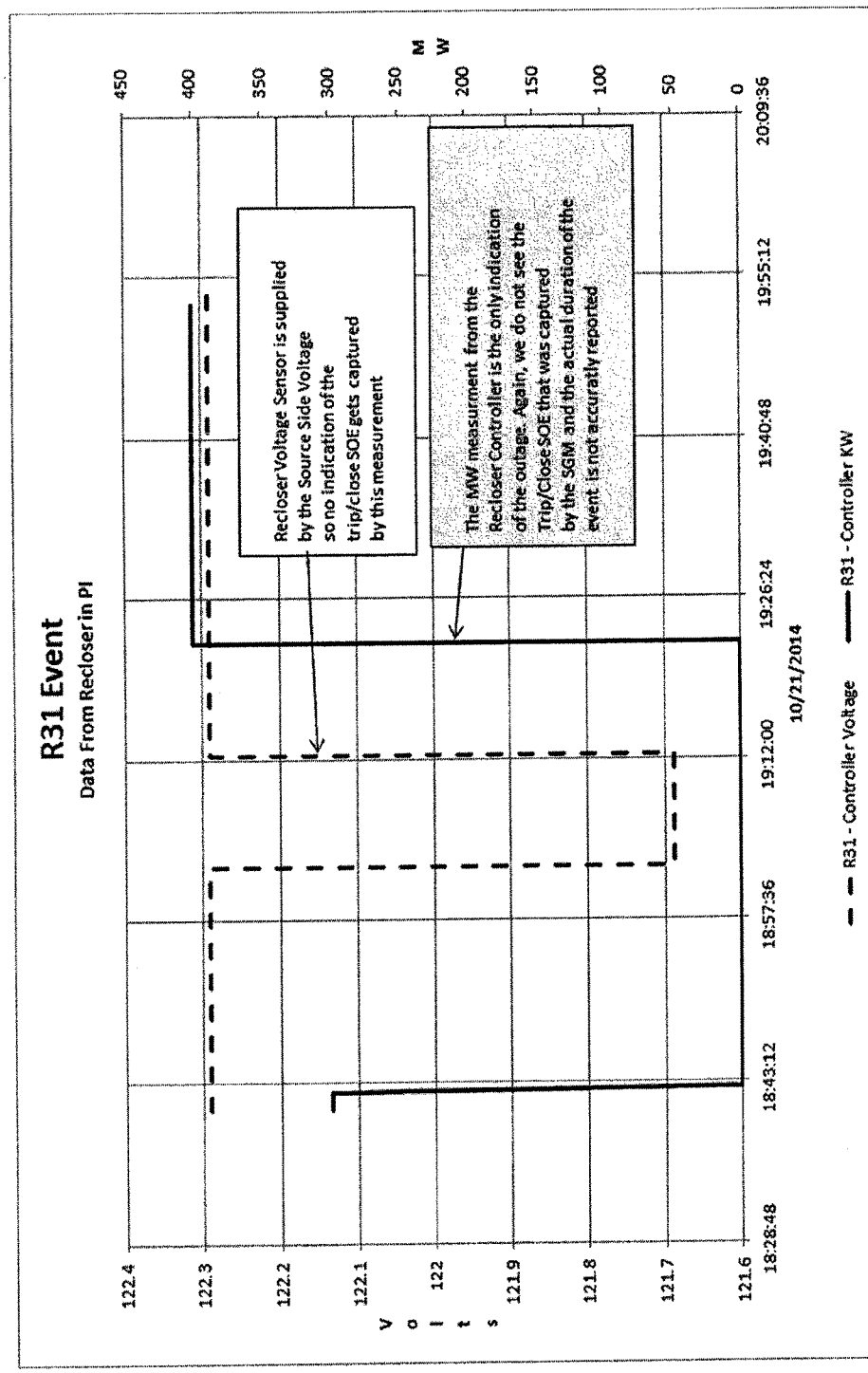
FIG. 9 illustrates information from a recloser event involving two trip closings of a recloser followed by a recloser lockout.

The SGM can provide trip/close activity on an electrical distribution system in near real time. As an example, Table 1 below displays an outage event that shows the trip/close sequence of events (SOE) that a recloser switch, and/or recloser in the form of a default clearing device used to clear the fault, as recorded by an SGM. This data, as with all SGM data, was recorded and provided in near real time to system dispatchers as the event occurred. This event was comprised of two trip/close events followed by a device lockout for 46 minutes and 8.360 seconds. In this example the recloser identified as R31 has an internal electronic recloser data logger for logging data. However, the data from the internal data logger falls short of defining the event as is shown in FIG. 9, which provides a graphical presentation of the actual event.

TABLE 1

| Call Type | 70245 Date | Device R31 Duration |
|---|---|---|
| PWR | Oct. 21, 2014 19:49:37.944 | Continuing |
| OFF | Oct. 21, 2014 19:03:29.582 | 46:08.360 |
| ON | Oct. 21, 2014 19:03:27.202 | 02.380 |
| OFF | Oct. 21, 2014 19:03:21.862 | 05.340 |
| ON | Oct. 21, 2014 19:03:18.252 | 03.610 |
| OFF | Oct. 21, 2014 19:03:15.912 | 02.340 |

Example 2—Recloser Controller Lockout Report Vs. SGM Report

This is a second example showing that only the SGM provides the trip/close sequence information in a near real time. Again, in this example as the events take place the data is being reported and stored in near real time by the SGM and DOMS. The data supplied by the internal data logger of the recloser controller in this example required a technician to drive to the recloser and retrieve the data, three days after the event. The evaluation required the use of software from the recloser manufacturer to interpret the data from the internal recloser log. Additionally, the reason the data from the internal recloser log was downloaded for this event was because the SGM data revealed that the recloser tripped (changed state) under this single-phasing condition. Without this notification from the SGM, there was no reason to look beyond the single-phasing event; and there was no indication that the settings on the recloser allowed it to trip under these conditions.

Figure 10:
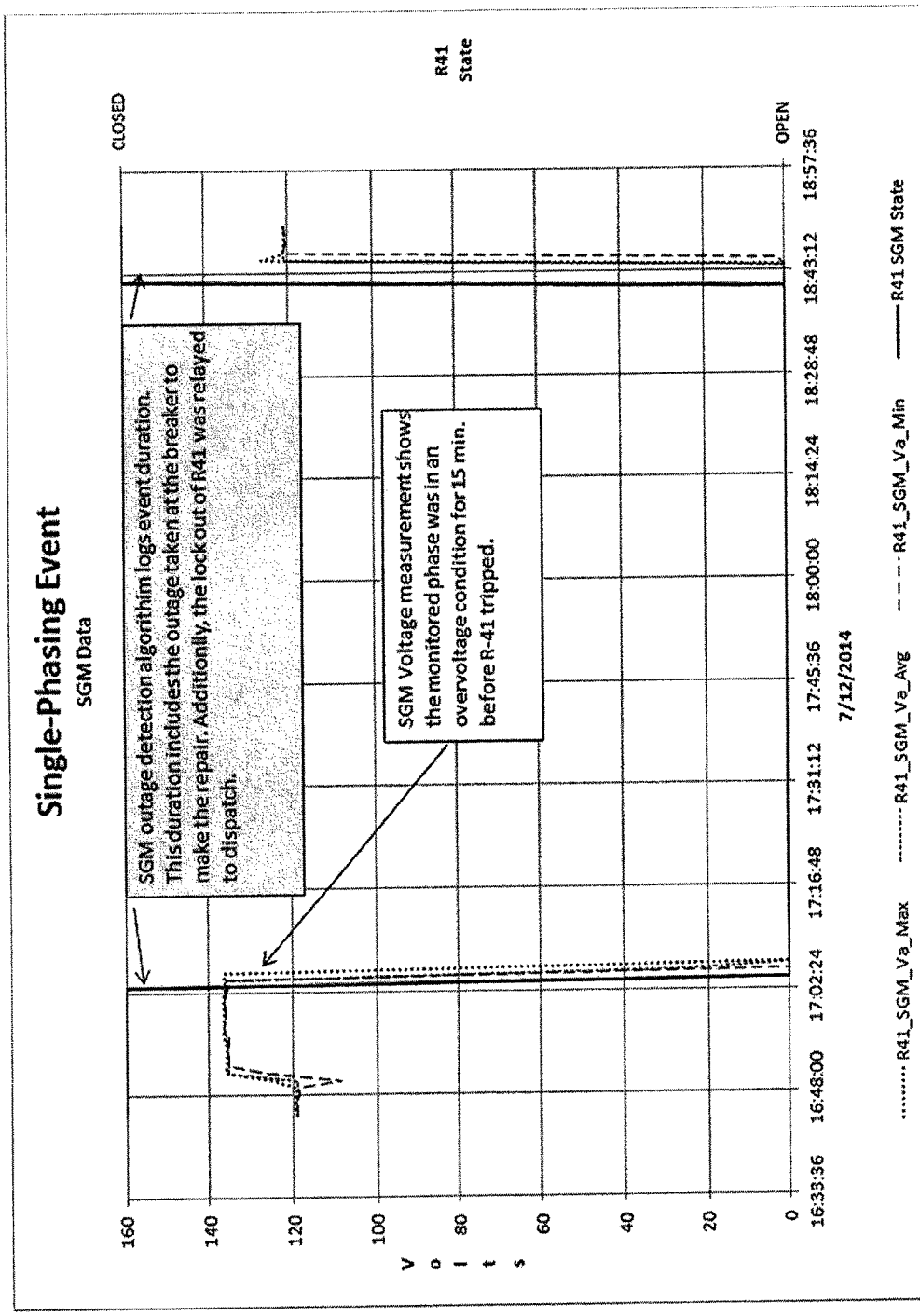
FIG. 10 is an illustration of a single-phasing recloser event and the data captured by an SGM in association with this event.

The single-phasing event occurred in this example when the high-side fuse on a substation transformer blew under load. The high-side in this example was a delta configuration. As a result of this configuration, there was an overvoltage condition on one phase while the other phases experienced an under voltage condition. When the fuse (recloser R41 in FIG. 9) first blew, the SGM reported the overvoltage condition as is seen in FIG. 10. The SGM is the only indication from this particular substation because this particular substation had no supervising control and data acquisition (SCADA) equipment. The recloser R41 tripped after about fifteen minutes into the single-phasing event and the SGM interval data indicates the voltage went to zero beyond R41. Table 2 below displays the SGM state and timing of the recloser operation for this specific recloser tripping event. This trip information was sent by the SGM to the central system and resulted in a dispatch notification; resulting in a field investigation and repair.

TABLE 2

| | 70243 | Device R41 |
|---|---|---|
| Call Type | Date | Duration |
| PWR | Jul. 12, 2014 18:43:37.614 | Continuing |
| OFF | Jul. 12, 2014 17:03:25.110 | 01:40:12.503 |

Figure 11:
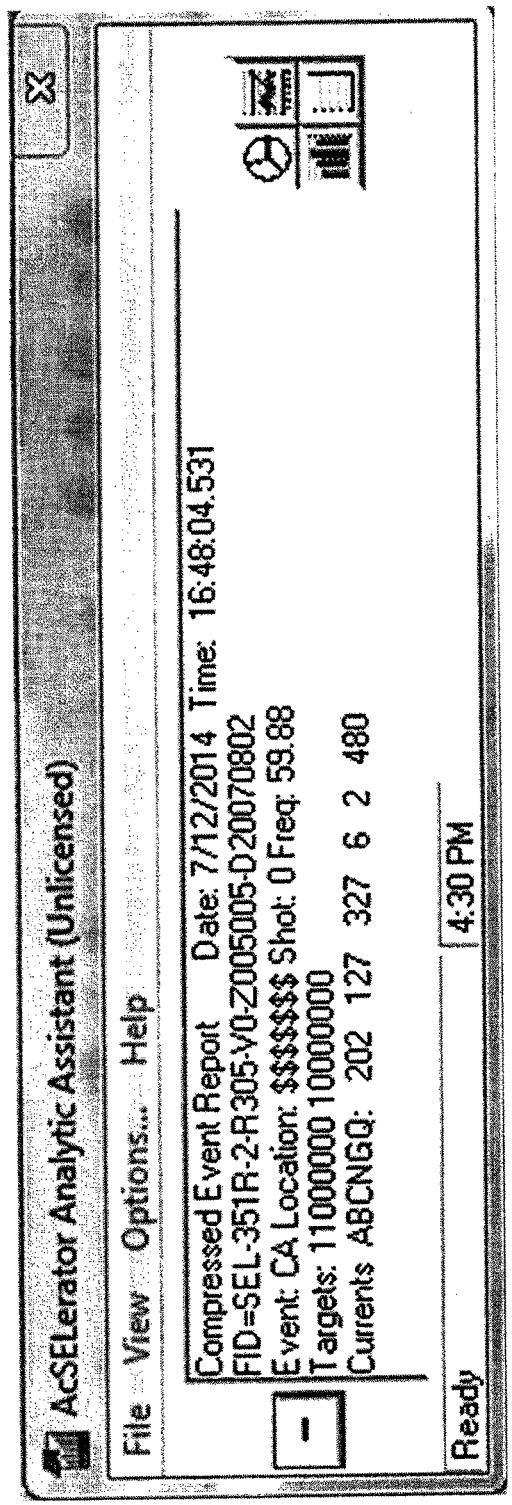
FIG. 11 illustrates an event file obtained from a recloser data log stored in the recloser and illustrates the limited information available from data loggers included in certain types of reclosers.

The recloser data retrieved by the technician consisted of three event files. The first event file was for when the fuse blew. This event caused a high current to flow on phase C, which armed the controller. Once the first event file was loaded into the recloser vendor's software, we obtained initial information shown in FIG. 11. From FIG. 11, it is apparent that the event took place at 16:48:04.531 and that multiple targets were triggered by the event. The SGM interval data from FIG. 10 agrees with this timing. There is no voltage information relayed in FIG. 11.

Figure 12:
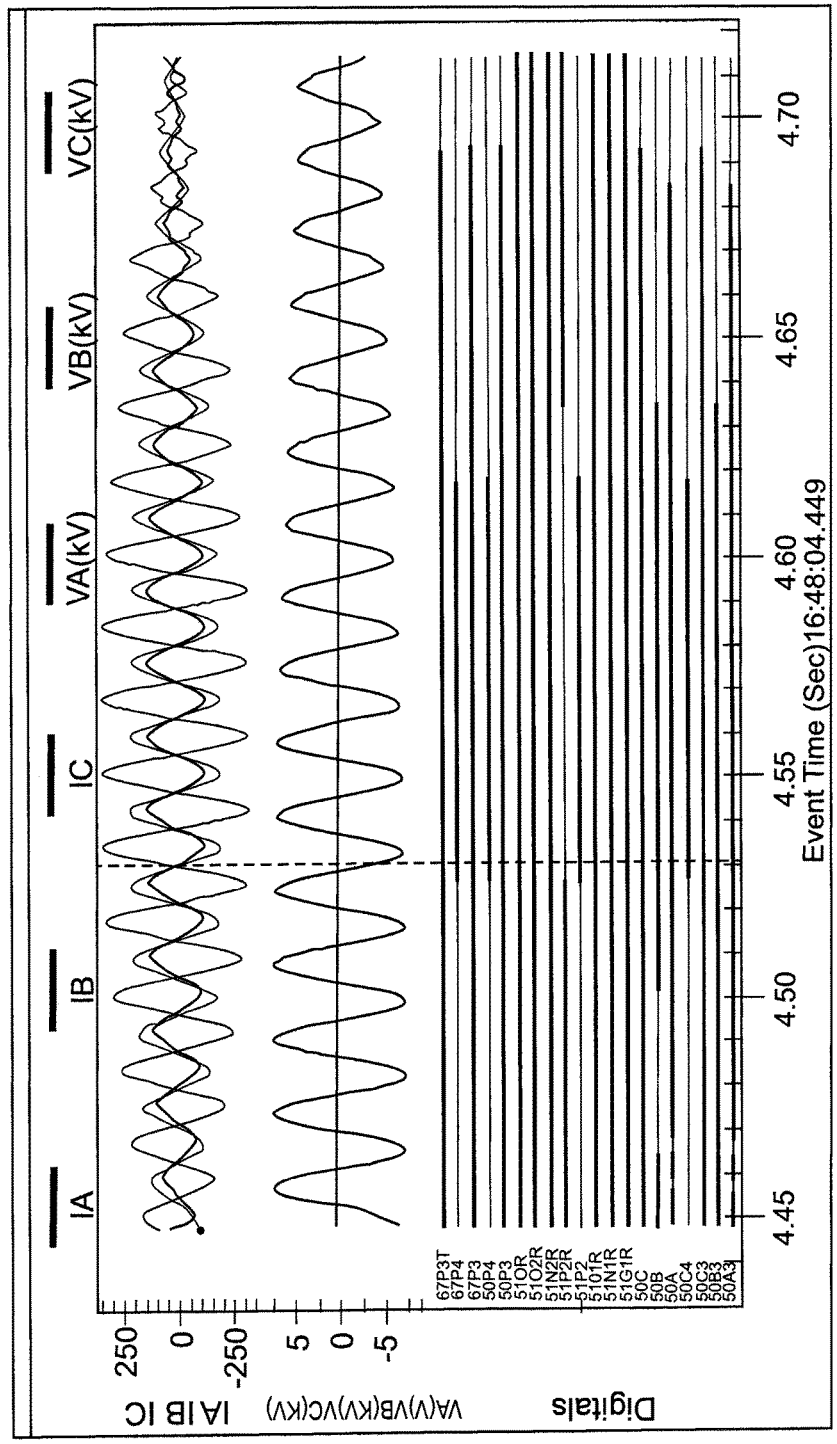
FIG. 12 illustrates further information available from an examination of the recloser data log and illustrating the actual recloser wave forms in a schematic fashion.

To obtain voltage information from the actual internal recloser log, the actual recloser waveforms from the recloser were examined (shown in FIG. 12).

Figure 13:
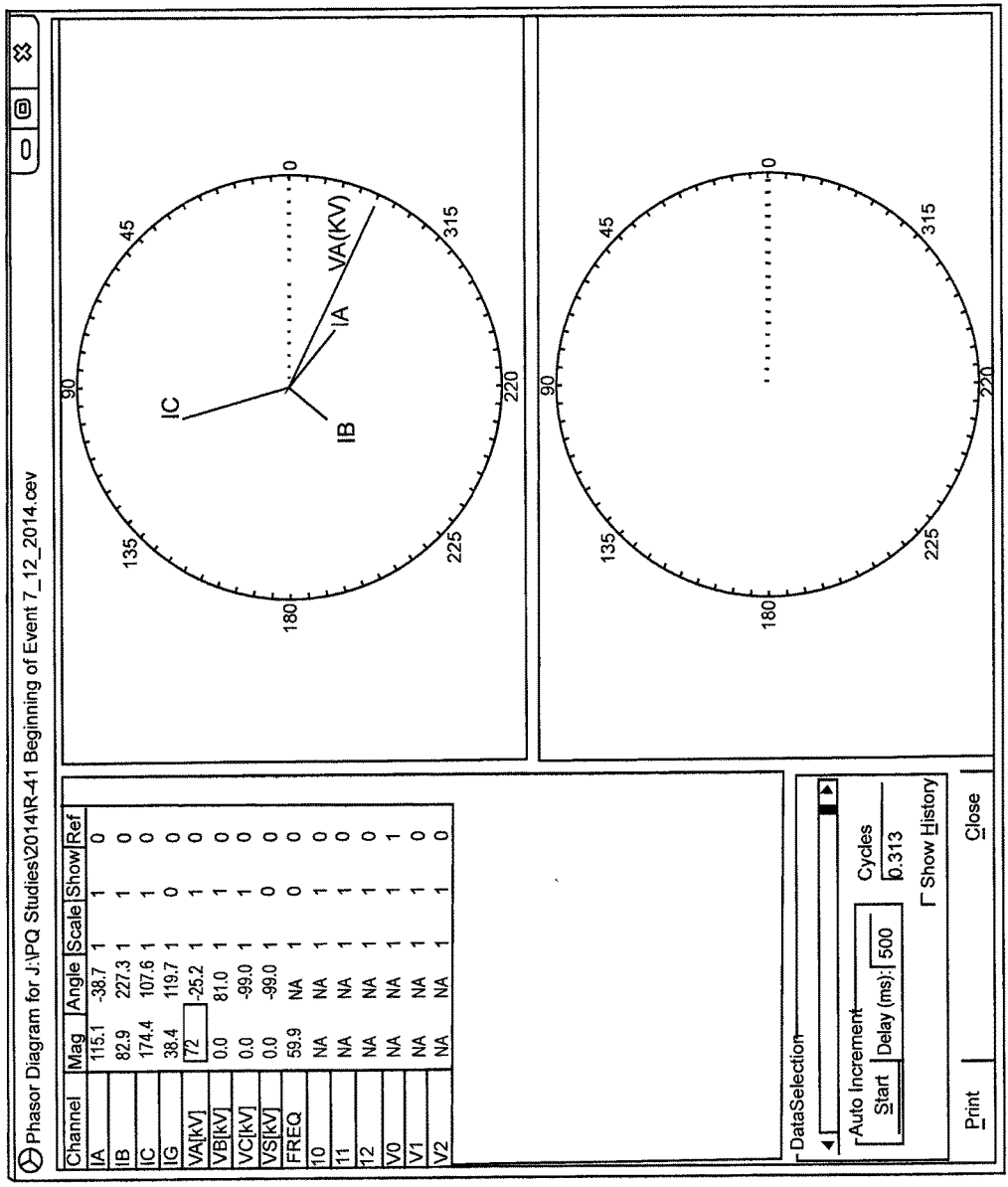
FIGS. 13 and 14 illustrate RMS values and phasor rotations for two cycles of recloser operation shown in FIG. 12.

Note that there is still only limited available data related to the actual voltages involved; and only one control voltage is presented. The lines at the bottom of FIG. 12 are where one would locate the trip/close state of event for an actual "trip/close" event. These represent the binary logic that this particular device uses to send its trip signals. In order to see the "Root Mean Square" (RMS) data related to the event, one can use a Phasor Diagram tool. This is a "replay" tool that will walk each cycle shown in FIG. 12 to show the RMS values as well as the phasor rotation. FIG. 13 shows the first cycle information while FIG. 14 show the voltage levels at the last cycle, which should be roughly the phase voltage at the recloser after the fuse blows.

Figure 14:
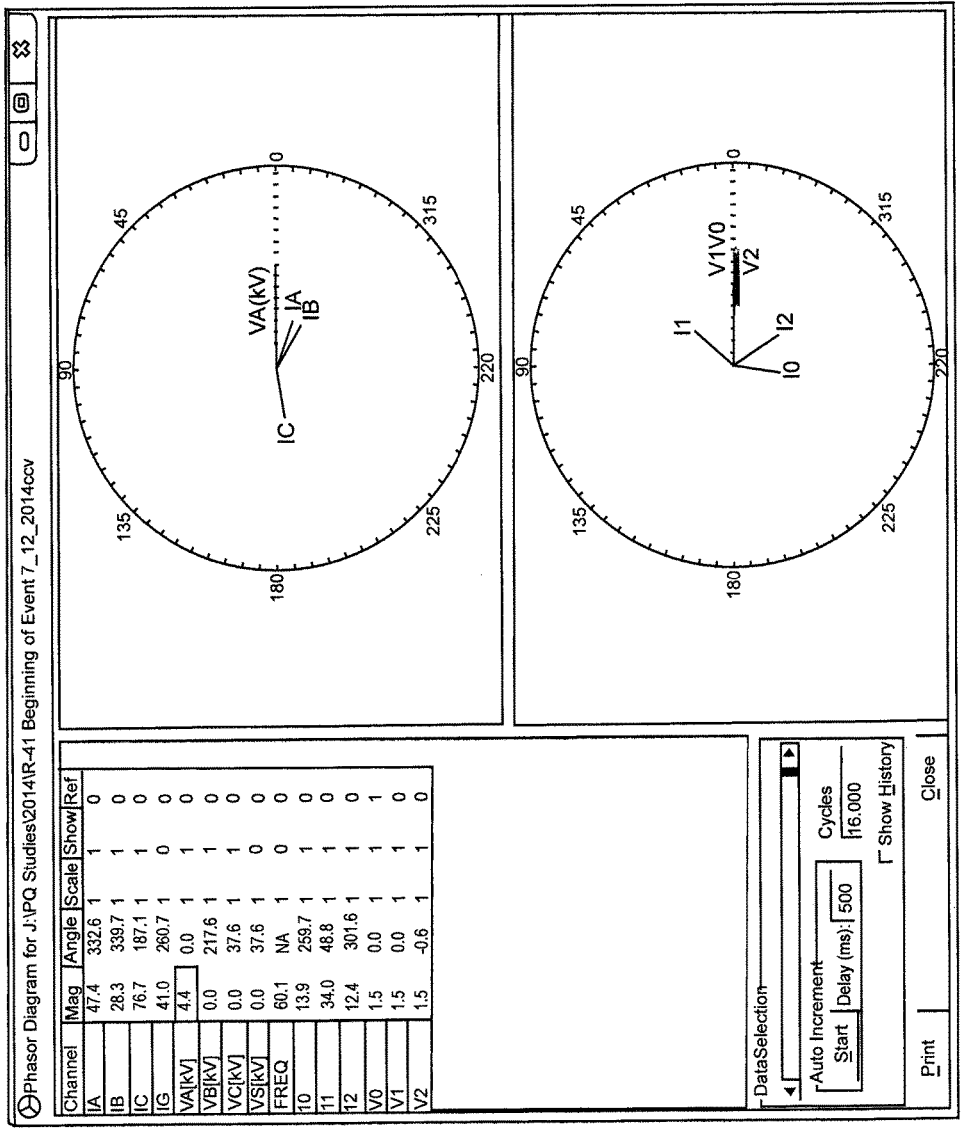

From FIGS. 13 and 14, one can determine that prior to the event there was 7.2 kV/7.2 kV×120=120 Volts before the fuse blew. This agrees with the SGM data shown in FIG. 10. At the end of the recloser "arming" event, the voltage was 4.4 kV/7.2 kV×120=66.7 Volts. This indicates that the control voltage was not on the overvoltage phase seen by the SGM monitoring the recloser R41. However, this agrees with other SGMs on this system that were also on the same phase as the recloser controller, e.g. a separate SGM, identified as BKR_SGM, recorded 69.3 Volts near the station for this phase. However, this is the end of the data for this event. We can only assume that this 66.7 Volts remained until the next controller arming event. The next event occurred when the recloser finally opened. The recloser data for this final trip event can be opened, and is shown in FIG. 15.

Figure 15:
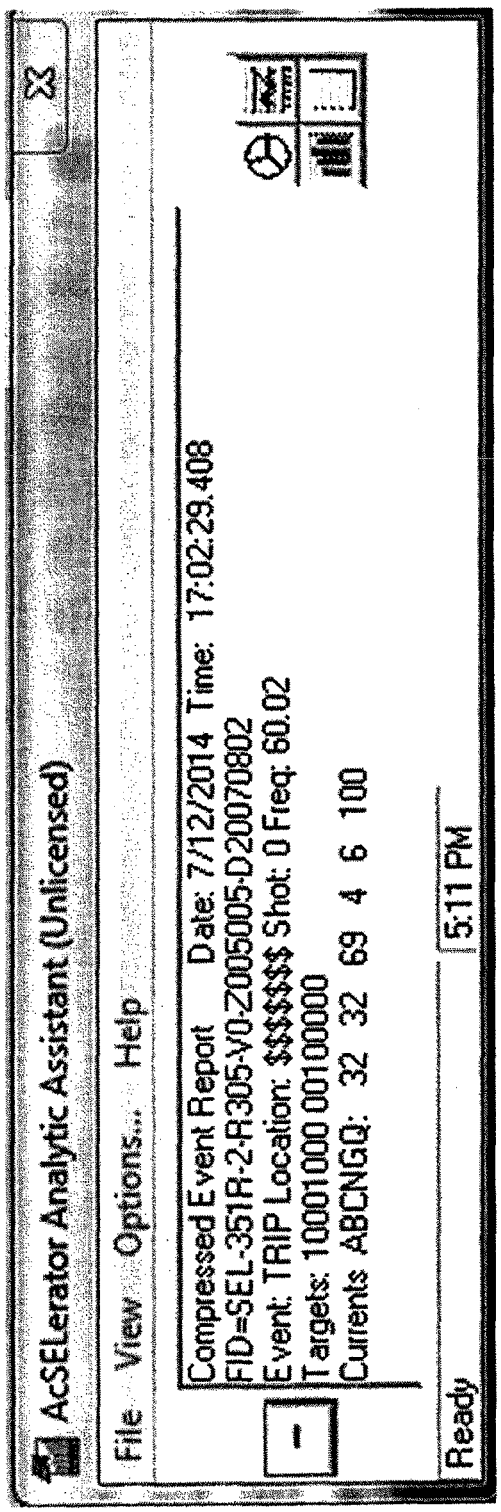
FIG. 15 is a screen shot illustrating the occurrence of a recloser arming event available from the recloser data log.

In FIG. 15, it is apparent that a recloser "arming" event occurred at 17:02:29.408. From the SGM data, one knows that recloser R41 opened at 17:03:25.110 (seen in Table 2) as time stamped by the server using TCP/IP time syncing. Therefore, one would expect this to be the event that shows the tripping of recloser R41. To examine this, the waveform data from the recloser was obtained as shown in FIG. 16.

Figure 16:
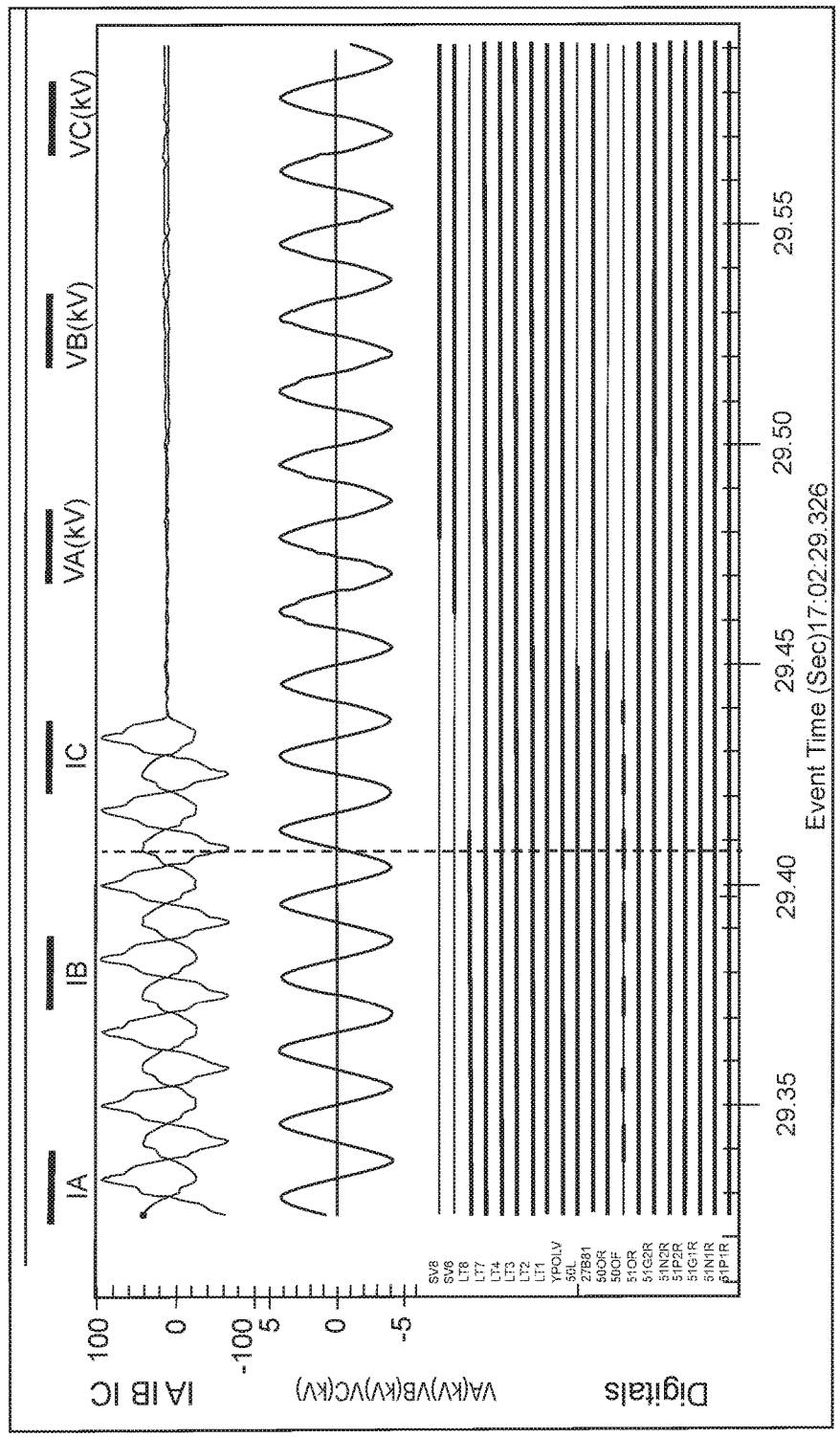
FIG. 16 illustrates data from recloser data log that illustrates the interruption of current through the recloser associated with the data log.

As can be seen in FIG. 16, the currents flowing through recloser R41 are interrupted and also that several targets were active. A further examination would be needed to determine which target actually caused the trip. However, in FIG. 16, one does not see the voltage go to zero. The voltage supplied to the recloser control is from the source side and therefore it does not reflect the voltage condition on the load side of the device. Often one would just assume that, since no current is flowing through the recloser, the load side voltage is zero. For most cases this is true, however with the expanding penetration of Distributed Generation (DG) this may not always be the case, especially if edge of grid technologies are employed in the future that allow islanding. The next event that would be collected by the recloser controller would occur when the device is put back into service after the repairs are made at the station where the recloser blew. The above process can be used to view subsequent data files to verify that the system is thereafter running normally.

As can be seen by this example, the use of electronic recloser data can provide some of the information the SGM and DOMS provides. However, the extended time needed for an evaluation, and the limited amount of voltage data related to the load side of the recloser, pale in comparison to that supplied by the SGM and DOMS. The recloser controller is design to collect data for the reconstruction of faulting events. Therefore, its main focus is on current flows beyond the device, not on the voltage quality beyond the device. The SGM and DOMS are designed with power quality in mind. Voltage quality is a true indication of power grid performance. It is the voltage that is used to allow customers to draw current to produce work. If that voltage is not within the correct parameters, the customer's equipment will not function correctly, or may be damaged. With an exemplary SGM, reporting of the exact state of events for outages, both sustained and momentary, as well as voltage event data within minutes of the event, with DOMS being operable in a desirable system example to send loss of voltage information to dispatch for outage notification, distribution system reliability is improved. The SGM interval voltage data also provides information on voltage sag/swell conditions. The disclosed SGMs can provide this data not only for electronic reclosers and fuses, but also for hydraulic reclosers and fuses, that have no electronic control. The SGM's can also be used for non-SCADA stations for a fraction of the cost of installing electronic controllers or SCADA systems; which SCADA systems, even if used, fail to supply the level of voltage data seen from the SGM. This is not to mention the weather data available from SGMs with weather station components; which can be seen from the next example.

Example 3—Momentary Outage with Wind Information

Figure 17:
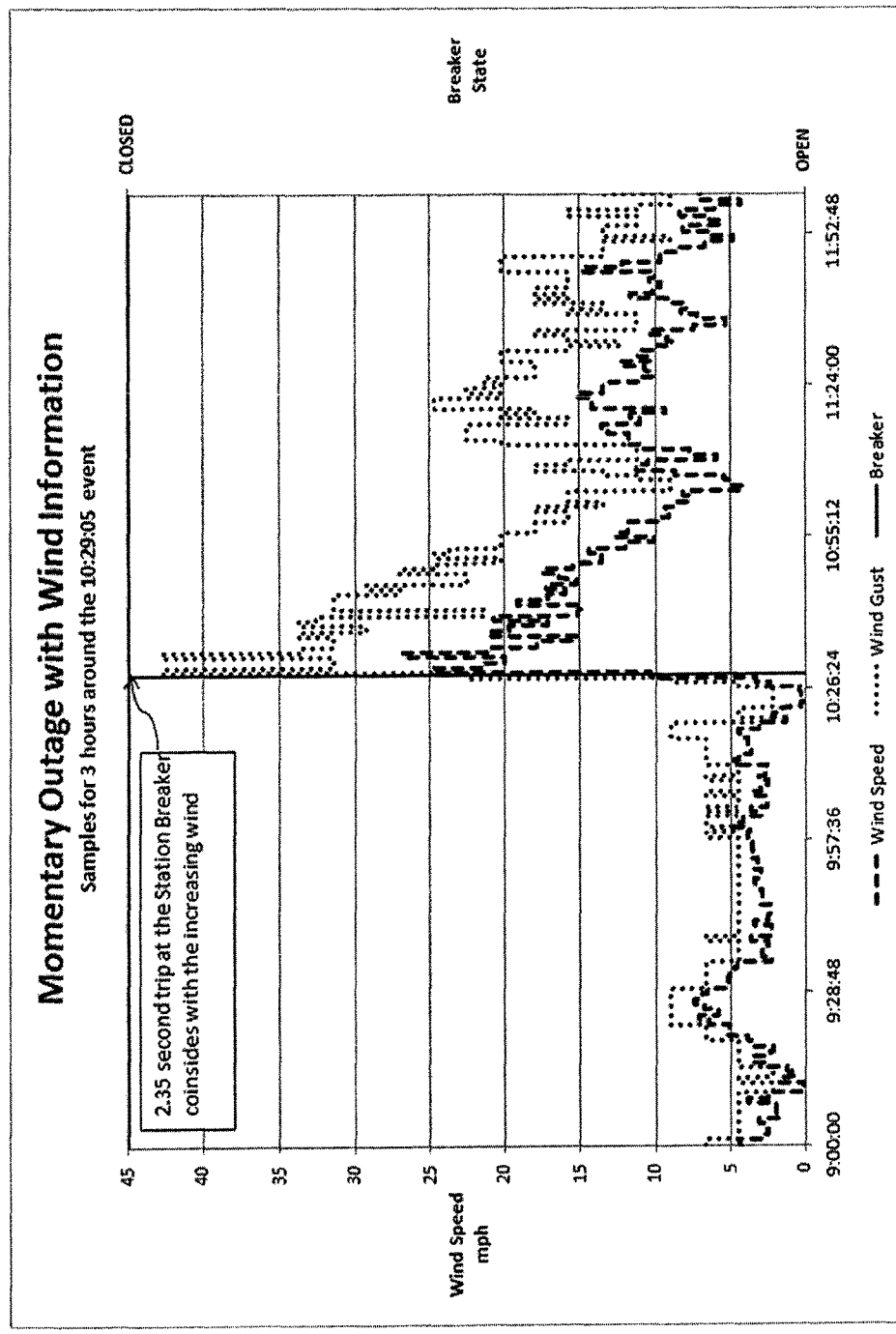
FIG. 17 illustrates an example of a cellphone enabled SGM that includes environmental condition components for measuring and reporting weather data together with recloser events.

This is an example of a momentary event captured by two meter base SGMs paired with one cell based SGM with wind data. The event was seen by the three SGM devices on the feeder because the fault was in the protection zone of the station breaker coupled to the feeder. The station breaker opened for 2.350 seconds to clear a fault. The state of event (SOE) information for the event is shown in Table 3 below. FIG. 17 illustrates an example of how the cellphone enabled SGM measures the weather data as well as the station event for the event shown in Table 3. Again, this is a unique function of the SGM with a weather station as it can provide millisecond resolution of the event with each voltage transition, between "ON/OFF" system states, and allowing capturing of local weather conditions, in this case how the wind speed were increasing, at the time of the event. Wind speed can, for example, be determined as the average wind speed over a single time period and the wind gust can be determined as the maximum wind speed during the sampling period. The sampling period can be varied, such as very short, such as one to five minutes. As can be seen from FIG. 17, a trip occurred when the wind gust exceed 40 mph. If the momentary outage repeated itself or became worse when wind gusts exceed 40 mph, then the SGM and system provides an indication of a wind associated problem (e.g., tree branches brush across the lines with such wind gusts), which enables proactive addressing of the problem (e.g., tree branch pruning in the area monitored by the SGMs) prior to an extended outage.

TABLE 3

| 60322 | | Device BKR |
|---|---|---|
| Call Type | Date | Duration |
| ON | 10/15/2014 10:29:08.091 | Continuing |
| OFF | 10/15/2014 10:29:05.741 | 02.350 |

| 70329 | | Device R16 |
|---|---|---|
| Call Type | Date | Duration |
| ON | 10/15/2014 10:29:07.255 | Continuing |
| OFF | 10/15/2014 10:29:04.805 | 02.450 |

Cell SGM with Weather and Voltage Data

| 63586 | | Device R54 |
|---|---|---|
| Call Type | Date | Duration |
| ON | 10/15/2014 10:29:08.092 | Continuing |
| OFF | 10/15/2014 10:29:05.742 | 02.350 |

Example 4 SGM Momentary Outage Detection Vs. Voltage Data Collection

Figure 18:
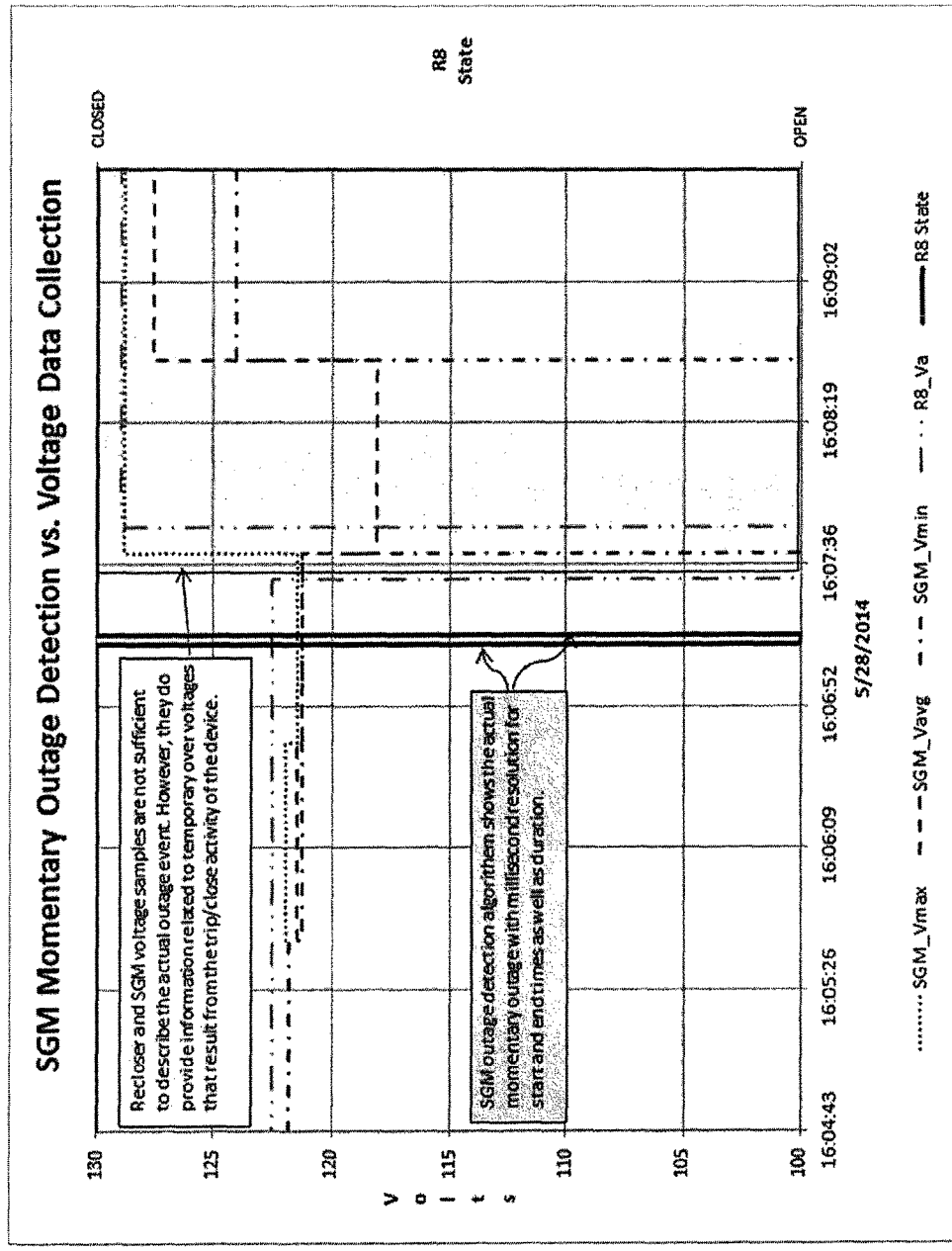
FIG. 18 is a graph illustrating enhanced momentary outage detection by the exemplary SGM.

Shown in FIG. 18 is an example demonstrating how voltage monitoring alone will not achieve the outage monitoring abilities of the SGM. FIG. 18 shows that the sampling resolution of typical voltage measurement devices makes them impractical for identifying short duration outages. Although all voltage measurements indicate that the voltage did actually go to zero, there is no indication of the actual duration of the event; and, if multiple momentary trips occur, they are also lost. This example is a 2.770 second outage used to clear a fault. The SGM state of event data for this event is shown in Table 4 below. FIG. 18 shows the comparison of the measured voltages to the actual event on the system.

TABLE 4

| 70259 | | Device R8 |
|---|---|---|
| Call Type | Date | Duration |
| ON | May 28, 2014 16:07:13.715 | Continuing |
| OFF | May 28, 2014 16:07:10.945 | 02.770 |

The events in Examples 1-4 demonstrate the SGM's data collection for momentary and sustained event tracking, the SGM can also be used to provide insight into the sag and swell power quality parameters defined by IEEE Std. 1159-1995. The examples below demonstrate an exemplary SGMs unique capability to aid in tracking these parameters.

Sag/Swell Detection Examples

Example 5 Outage Detection and with Fault Current Causing an Overvoltage

Figure 19:
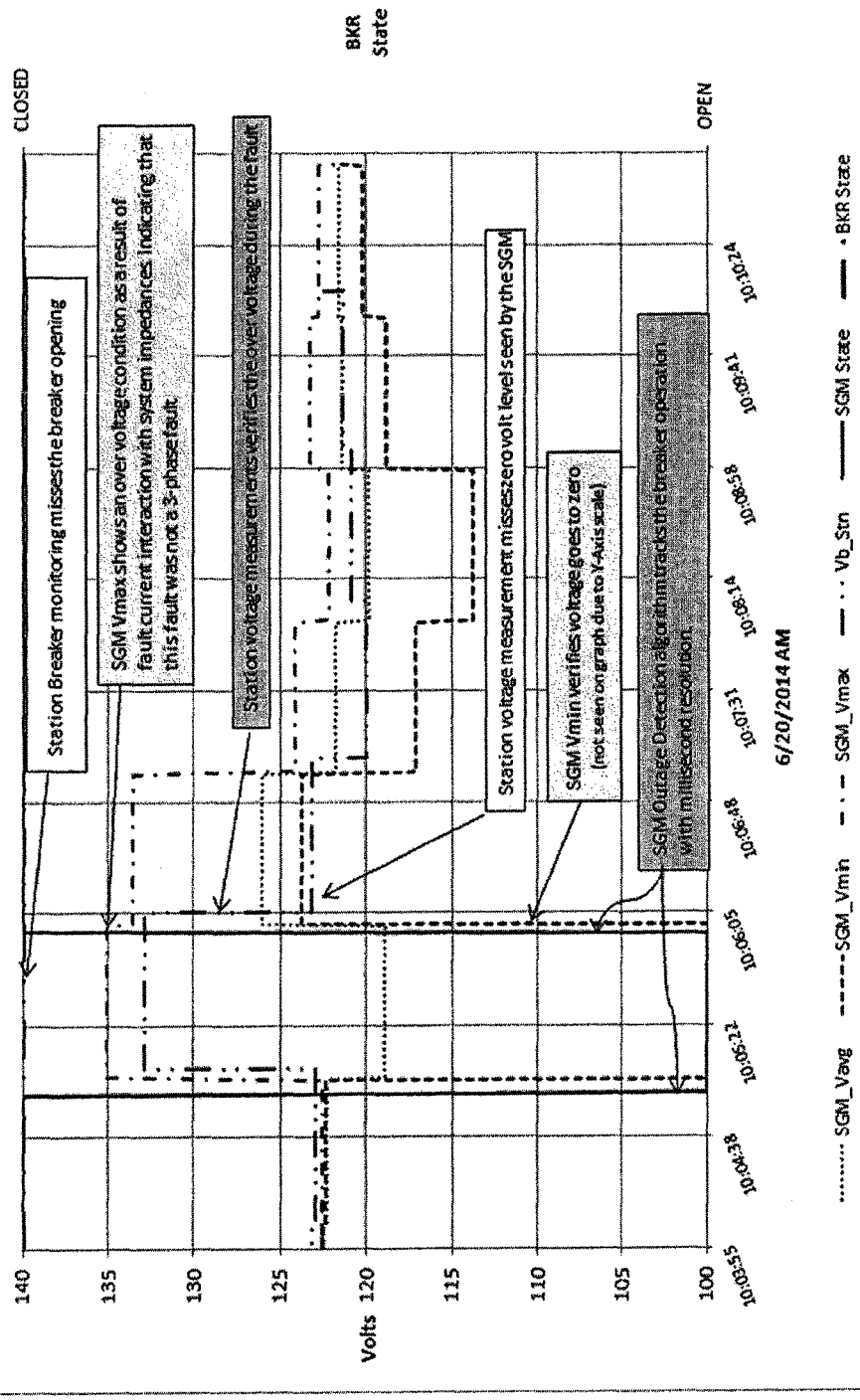
FIG. 19 is a graph illustrating a comparison of measured voltages in response to an actual event on a power distribution system.

FIG. 19 is an example of a non-three phase fault that occurred on the electrical power grid system. The exemplary SGM provided the data to show how the un-faulted phases reacted to the system fault. In addition, the SGM revealed that the resolution of the data collection from the station breaker status into the PI data historian failed to indicate that the station breaker cleared the fault. The only tool that provided the correct information related to this fault was the SGM. Table 5 below shows the actual state of event information from the SGM for the breaker opening to clear the fault.

TABLE 5

| 70374 | | Device BKR |
|---|---|---|
| Call Type | Date | Duration |
| ON | Jun. 20, 2014 10:04:57.759 | Continuing |
| OFF | Jun. 20, 2014 10:04:55.689 | 02.070 |

Example 6 SGM Detection of Regulator and Capacitor Operations

Figure 20:
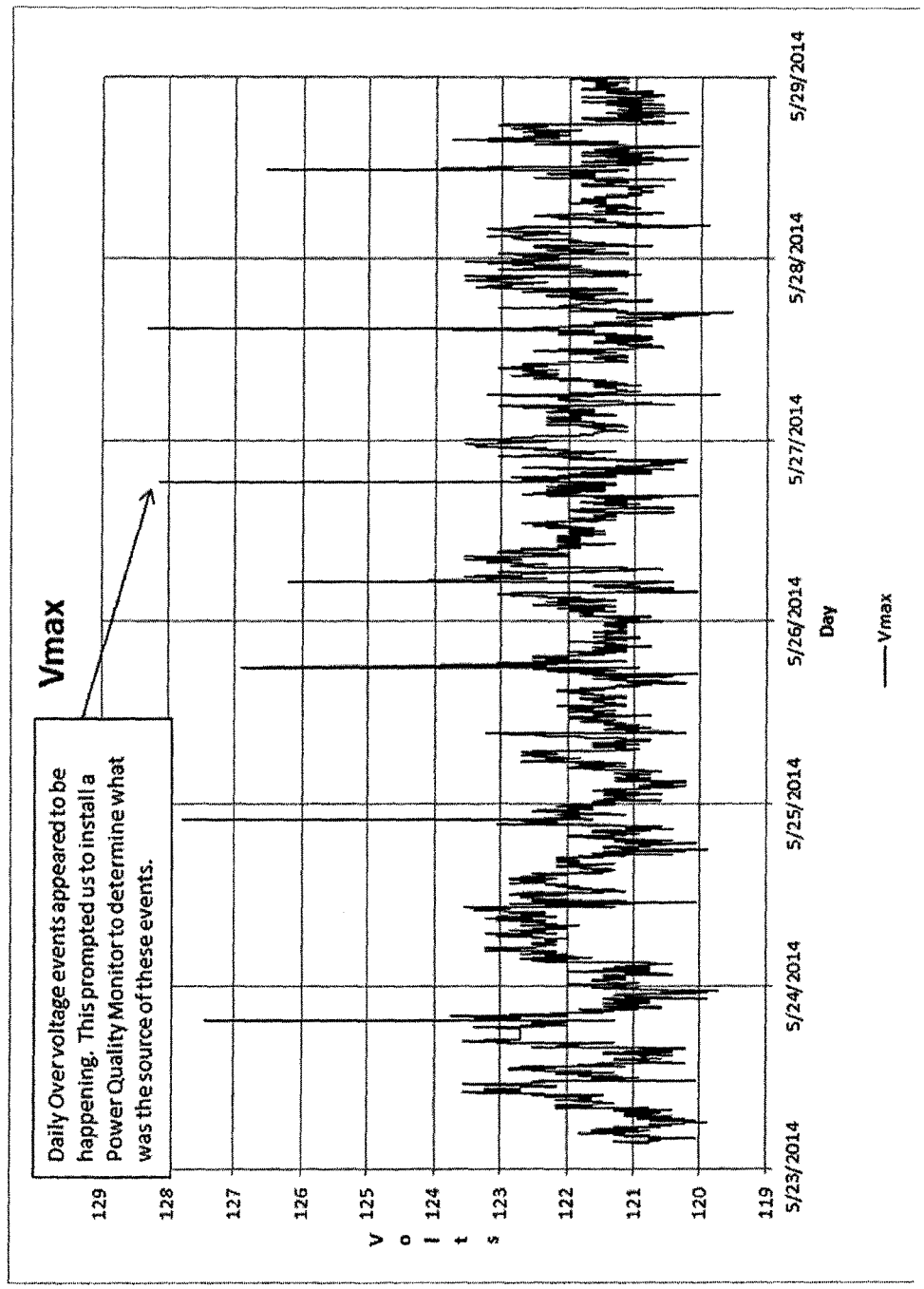
FIG. 20 is a graph of a portion of Vmax trend data obtained from an SGM.

As a result of the method employed in the programming of an exemplary SGM for voltage measurements, the SGM can also detect system Volt/Var Optimization (VVO) issues. The SGM can have an Over/Under Voltage alarm to log this information to aid in addressing potential low voltage areas in a distribution system. During testing, it was surprising to see temporary Over Voltage conditions several times a day at one of the SGM locations being reported by a one second Vmax measurement from the SGM. FIG. 20 shows a portion of the Vmax trend from the device. To determine the source of these over voltage events we installed a conventional power quality monitor on the leads supplying voltage to the SGM.

Figure 21:
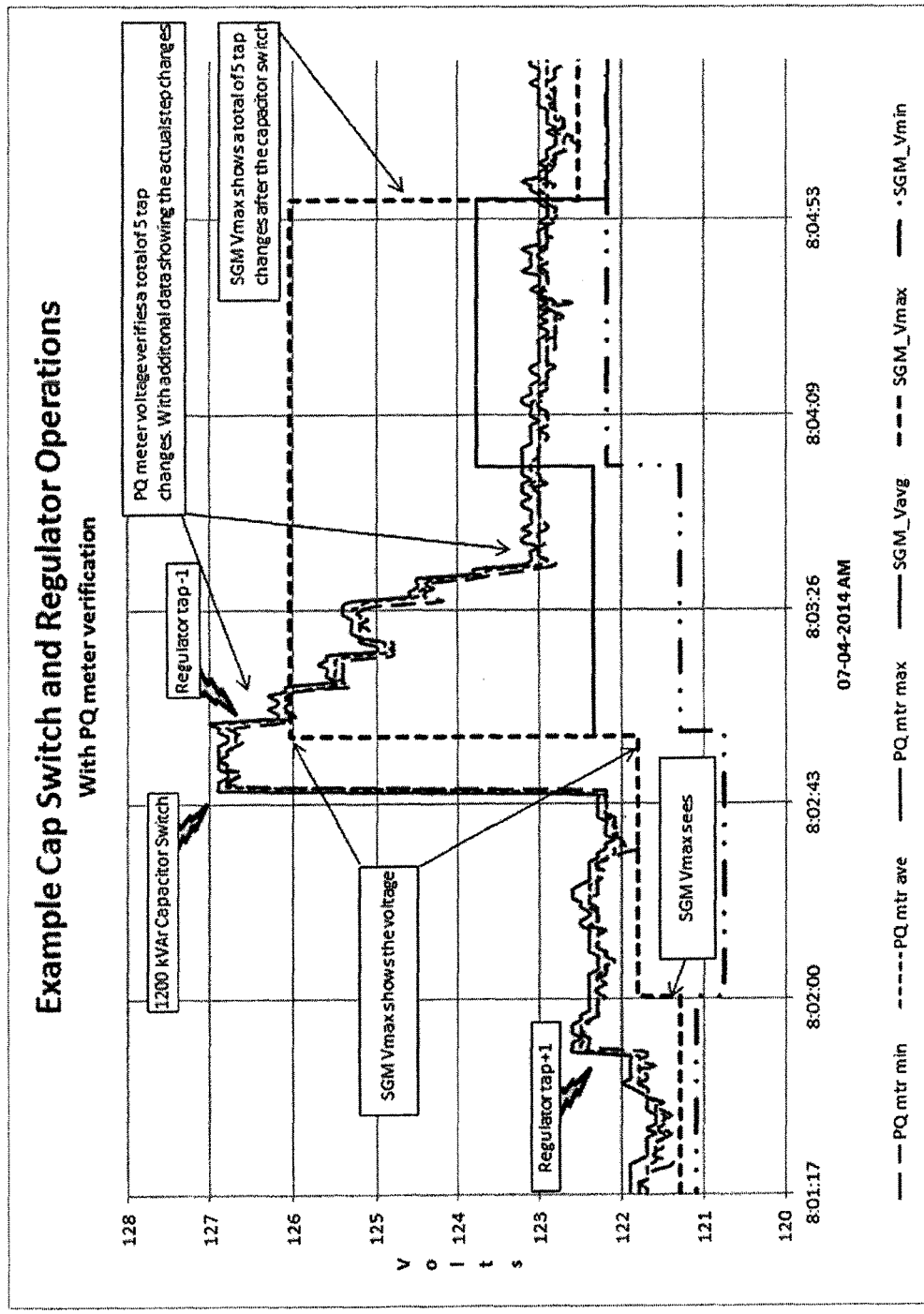
FIG. 21 is a graph of voltage wave forms during a capacitor switching event.

Once the power quality monitor was installed, the source of the over voltage events was determined. These were due to the switching of a 1.2 MVAr capacitor bank on the system. FIG. 21 shows detailed information indicating how the system was operating during one of these events. The SGM reporting indicated there was a Volt/Var coordination issue on this feeder that caused a Load Tap Changer (LTC) in a voltage regulator on the feeder to operate as much as five times every time the capacitor bank was switched. This information is not available from any other single voltage measurement on the system. The SGM's provided visibility to these system interactions by simply monitoring a single phase system voltage.

Statistical Analysis Examples

Figure 22:
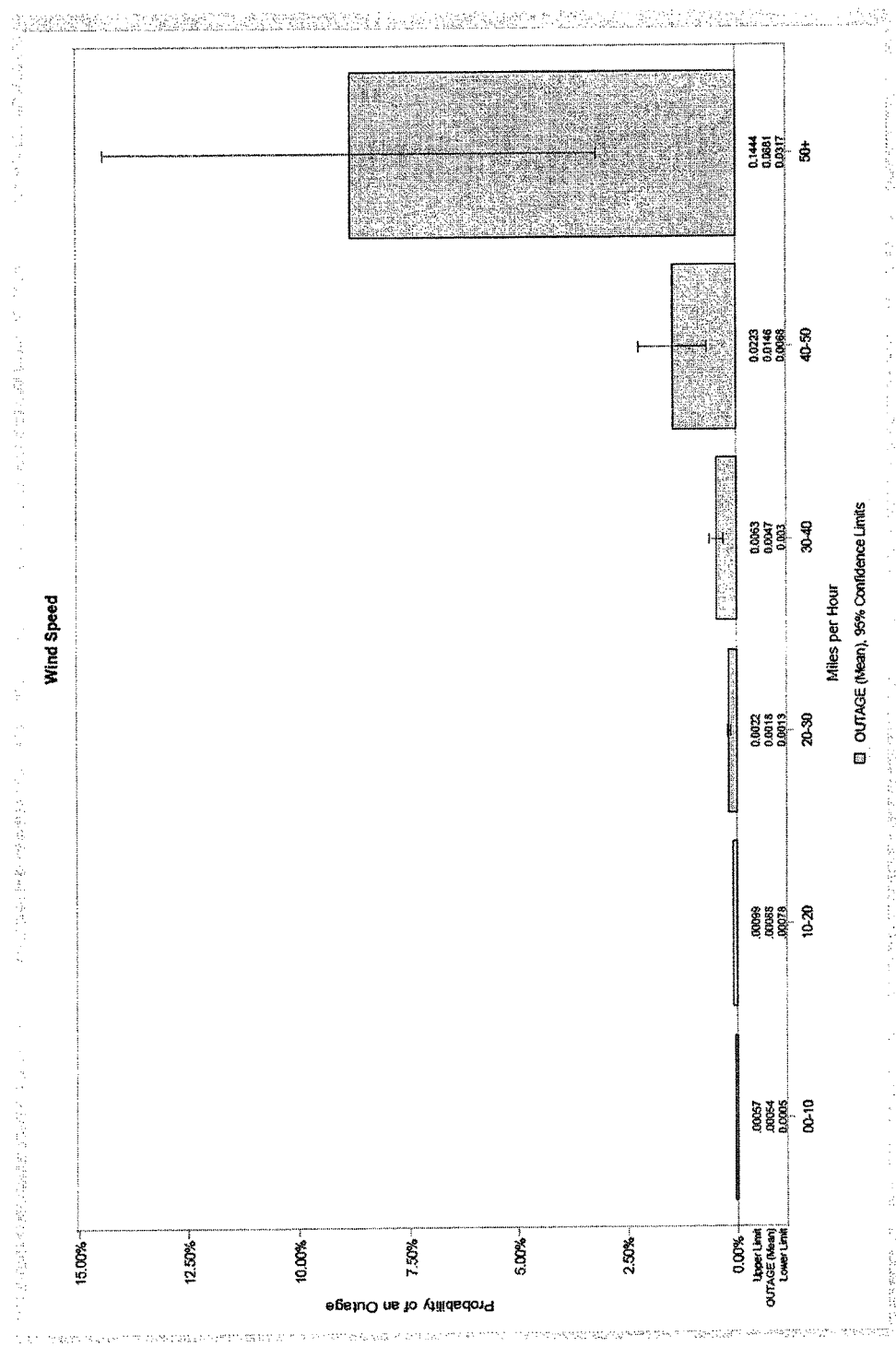
FIGS. 22 and 23 are graphs illustrating the association of wind speeds with an increase in outage activity in a power distribution system.
Figure 23:
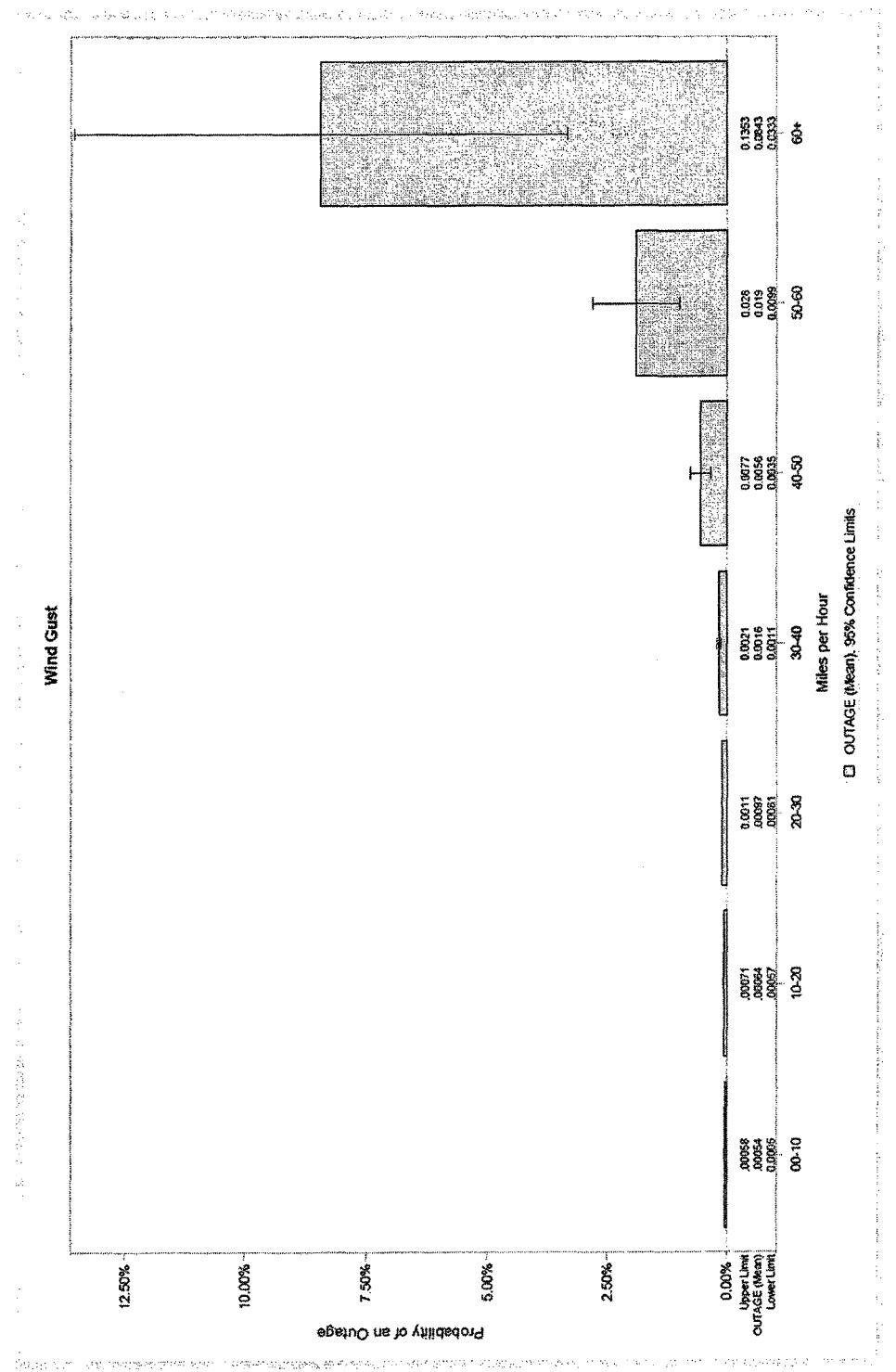

Using the data provided by the SGM an electrical power distribution grid can be statistically analyzed. FIGS. 22 and 23 illustrate how wind speeds are associated with an increase in outage activity on a power distribution system. The wind speed and the outage data are supplied SGMs with weather stations. Therefore, the wind speeds are local to the devices that tripped, and are actual speeds essentially in real time. It is intuitive that higher winds result in a higher probability of an outage. However, the SGM data provides information on how much higher that probability is, and at what wind speeds they become relevant. Also the SGM allows the identification of microclimates (e.g., particular pole locations subjected to higher gusts) enabling such locations to be proactively designed for higher wind loading.

Figure 24:
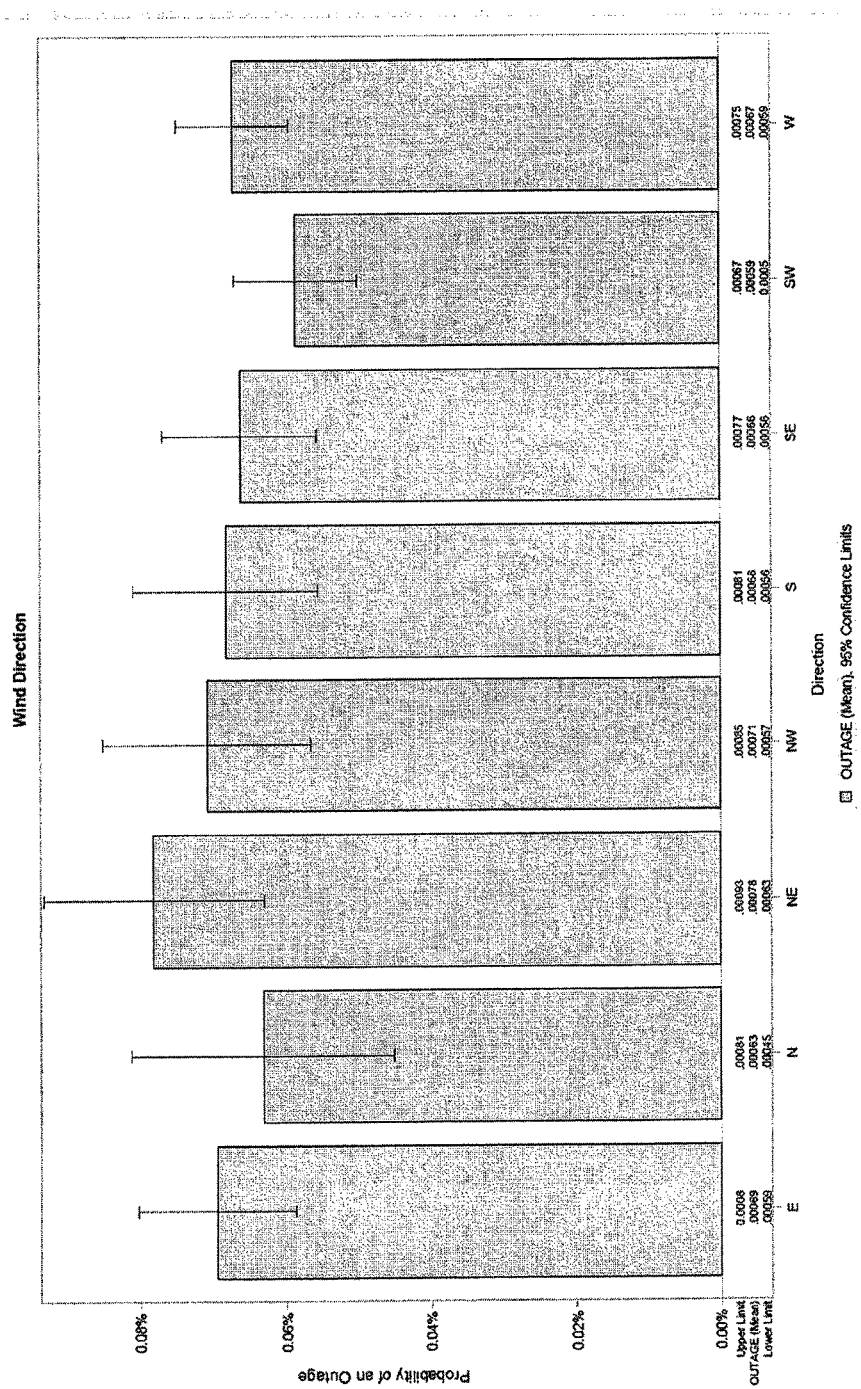
FIG. 24 is a graph illustrating the change in the probability of an outage based on wind direction as determined by an SGM, the information being obtained for a power grid being operated by Idaho Power Company.

FIG. 24 shows how the probability of an outage is also increased based on wind direction. Based on current data set information, the power grid operated by Idaho Power Company has a slightly higher probability of an outage when the wind is coming from the Northeast.

Figure 25:
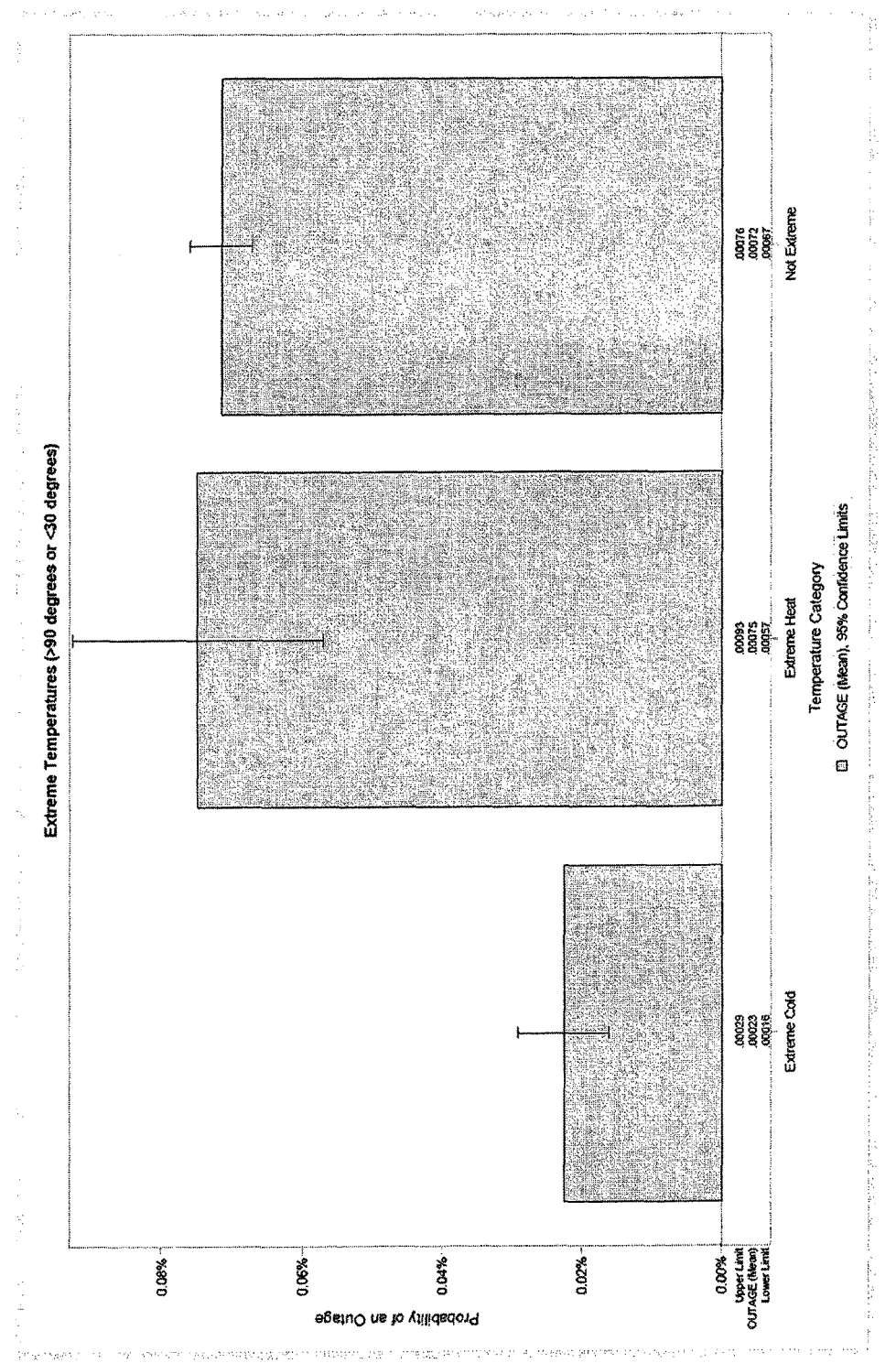
FIG. 25 is a graph illustrating the probability of an outage based on ambient temperature information.

FIG. 25 shows the probability of an outage based on temperature. There is a slightly higher probability of an outage during extreme heating conditions.

The above examples illustrate the uniqueness of the exemplary SGMs and of systems utilizing such SGMs. In a desirable form, the SGMs can be positioned at each recloser (e.g., recloser, breaker or fuse) so as to collect the SOE for every outage event on the system. The addition of embodiments with localized weather data and tracking of voltage data, such as in a Maximum/Minimum/Average format delivered by the SGM, allows the DOMS to identify system fluctuations that are missing in known systems. A power distribution system with SGMs provides enhanced power quality monitoring and reduces down time to fix problems by more precisely identifying the power problems and their locations. The SGMs are suitable for use in monitoring of automated recloser in the electrical distribution system whether they have electronic controllers. The monitoring reclosers provides accurate timestamps and reveals system interactions that otherwise may not be readily detected.

In view of the many possible embodiments to which the principles of the disclosed invention may be applied, it should be recognized that the illustrated embodiments are only preferred examples of the invention and should not be taken as limiting the scope of the invention.

We claim:

1. An electrical power distribution system for distributing electrical power through power transmission lines, the system comprising:
    a power line distribution section comprising first and second power lines supported along their length by a plurality of spaced apart power poles, a plurality of such power poles carrying transformers that are coupled to the power lines to provide secondary power to end users of power, the distribution section comprising a plurality of reclosers in each of the first and second power lines carried by respective power poles, the reclosers being positioned at plural locations along the length of the first and second power lines, an upstream recloser being a recloser that is closer to a source of power for a specific location in the distribution system where voltage is being monitored and a downstream recloser being a recloser that is further from the source of power for the specific location at which voltage is being monitored, the reclosers being operable to shift between a closed state in which electric current flows through the recloser and an open state in which electric current does not flow through the recloser;
    a plurality of recloser status monitors for each of the first and second power lines and carried by respective power poles, the recloser status monitors each comprising a voltage monitoring circuit comprising a first input coupled to the first power line and a first voltage output at which a first voltage output signal is provided that corresponds to the voltage at the first power line and thereby to the open and closed status of a recloser through which current flows to the location where voltage of the first power line is being monitored by the voltage monitoring circuit, the voltage monitoring circuit comprising a second input coupled to the second power line and a second voltage output at which a second voltage output signal is provided that corresponds to the voltage at the second power line and thereby to the open and closed status of a recloser through which current flows to the location where voltage of the second power line is being monitored by the voltage monitoring circuit, wherein the voltage monitoring circuit comprises an RMS voltage circuit and wherein the first and second voltage outputs correspond to the RMS voltage over time at the respective first and second power lines;
    the recloser status monitor comprising a microcontroller comprising a first voltage receiving input coupled to the first voltage output and a second voltage receiving input coupled to the second voltage output, the microcontroller providing voltage data signals corresponding to the first and second voltage output signals over time and time data associated with the voltage output signals, including voltage data signals corresponding to an event that causes the recloser to open and then reclose one or more times in response to the event and then reclose following the event, the voltage output signals indicating the open or closed status of the reclosers that are upstream from the location at which voltage is being monitored by the voltage monitoring circuit; and
    the recloser status monitor also comprising a cellphone circuit having an input coupled to the microcontroller and to the direct current voltage output, the cellphone circuit being operable in response to the control signal from the microcontroller to place a cellphone call to a recipient location and to transmit the voltage data signals and the time data to the recipient location, including the voltage data signals corresponding to opening and reclosing the recloser during the event and the reclosing of the recloser following events that do not result in a power outage.

2. A system according to claim 1 wherein the each of the recloser status monitors comprises a power circuit comprising a transformer having an input for coupling to at least one of the first and second power lines so as to receive power from said at least one of the first and second power lines; the transformer having a first alternating current output, the power circuit comprising a first full wave rectifier coupled to the transformer outlet and operable to convert the first alternating current output to a direct current voltage output; the voltage monitoring circuit, the microcontroller, and the cell phone each being coupled to the direct current voltage output.

3. A system according to claim 1 comprising a server at the recipient location for receiving the voltage data signals and the time data, which indicate a power outage, including an intermittent power outage;
the powerline distribution system having meters that report power usage to the recipient location; and
the server, in response to the power outage, pinging meters downstream of or proximate to the location of the power outage and identifying meters that do not reply to the pings as locations of possible additional power outages.

4. A system according to claim 1 wherein at least one of the recloser status monitors carried by a power pole further comprises a weather station having an anemometer operable to measure wind speed, the weather station having a weather data output at which wind speed signals representing the measured wind speed are provided, the microcontroller comprising a weather data input coupled to the weather data output, the microcontroller providing wind speed indicating data corresponding to the wind speed signals, and thereby to the measured wind speed over time, the cellphone circuit also being operable to transmit the wind speed indicating data to the recipient location.

5. A system according to claim 4 wherein the wind speed indicating data also comprises wind gust data.

6. A system according to claim 4 wherein the weather station has a wind vane operable to measure wind directions, the weather station having a weather data output at which wind direction signals representing the measured wind direction are provided, the microcontroller providing wind direction indicating data corresponding to the wind direction signals, and thereby to the measured wind direction over time, the cellphone circuit also being operable to transmit the wind direction indicating data to the recipient location.

7. A system according to claim 4 wherein the weather station further comprises an ambient temperature detector operable to measure the ambient temperature, ambient temperature signals representing the measured ambient temperature being provided at the weather data output and thereby to the microcontroller, the microcontroller providing ambient temperature indicating data corresponding to the ambient temperature signals and thereby to the measured ambient temperature over time, the cellphone circuit also being operable to transmit the ambient temperature indicating data to the recipient location.

8. A system according to claim 1 wherein the electrical power distribution system includes a capacitor bank and the voltage data signals indicate plural tap changes in response to switching of the capacitor bank in the power distribution system.

9. A system according to claim 1 wherein the first voltage output signal corresponds to the voltage at the first power line and the second voltage output signal corresponds to the voltage at the second power line, and wherein the time data associated with the voltage output signal is at a granularity that enables the determination of the time of the occurrence of voltage changes to within six to ten milliseconds of the actual occurrence of such voltage changes.

10. An apparatus for monitoring and reporting the operation of reclosers in an electrical power distribution system having power lines that are opened and closed by the reclosers, the apparatus comprising:
a power circuit comprising a transformer having an input for coupling to the power lines so as to receive power from the power lines; the transformer having a first alternating current output, the power circuit comprising a first full wave rectifier coupled to the transformer outlet and operable to convert the first alternating current output to a direct current voltage output;
a recloser status monitor coupled to the direct current voltage output and to one of the power lines, the recloser status monitor comprising a voltage monitoring circuit coupled to said one of the power lines, the voltage monitoring circuit having a voltage output at which a voltage output signal is provided that corresponds to the voltage at said one of the power lines, the recloser status monitor having a power input coupled to the direct current voltage output;
a microcontroller having a voltage receiving input coupled to the voltage output, the microcontroller providing voltage data signals corresponding to the voltage output signals over time and time data associated with the voltage output signals, the voltage output signals indicating the open or closed status of the recloser, including voltage data signals corresponding to an event that causes the recloser to open and then reclose one or more times in response to the event and then reclose following the event, the microcontroller being coupled to the direct current voltage output, and the microcontroller providing a cellphone control signal; and
a cellphone circuit having an input coupled to the microcontroller and to the direct current voltage output, the cellphone circuit being operable in response to the control signal from the microcontroller to place a cellphone call to a recipient location and to transmit the voltage data signals and the time data to the recipient location including the voltage data signals corresponding to opening and reclosing the recloser during the event and the reclosing of the recloser following the event.

11. An apparatus according to claim 10 wherein the voltage monitoring circuit comprises an RMS voltage circuit and wherein the voltage output corresponds to the RMS voltage over time at said one of the power lines.

12. An apparatus according to claim 10 further comprising a weather station having an anemometer operable to measure wind speed, the weather station having a weather data output at which wind speed signals representing the measured wind speed are provided, the microcontroller comprising a weather data input coupled to the weather data output, the microcontroller providing wind speed indicating data corresponding to the wind speed signals, and thereby to the measured wind speed over time, the cellphone circuit also being operable to transmit the wind speed indicating data to the recipient location.

13. An apparatus according to claim 12 wherein the wind speed indicating data also comprises wind gust data.

14. An apparatus according to claim 13 wherein the weather station has a wind vane operable to measure wind directions, the weather station having a weather data output at which wind direction signals representing the measured wind direction are provided, the microcontroller providing wind direction indicating data corresponding to the wind direction signals, and thereby to the measured wind direction over time, the cellphone circuit also being operable to transmit the wind direction indicating data to the recipient location, wherein the weather station further comprises an ambient temperature detector operable to measure the ambient temperature, ambient temperature signals representing the measured ambient temperature being provided at the weather data output and thereby to the microcontroller, the microcontroller providing ambient temperature indicating data corresponding to the ambient temperature signals and thereby to the measured ambient temperature over time, the cellphone circuit also being operable to transmit the ambient temperature indicating data to the recipient location.

15. An apparatus according to claim 10 in combination with a power pole of an electrical power distribution system and wherein the apparatus is mounted to an upper end portion of the power pole.

16. An apparatus according to claim 10 mounted to a power pole at a location downstream from a recloser and coupled to the power line controlled by the recloser to measure the voltage on such power line at a location downstream of said recloser.

17. An apparatus according to claim 10 wherein the apparatus further comprises a backup battery circuit for coupling to the power lines, the backup battery circuit comprising a backup battery power output coupled to the recloser status indicating current, coupled to the weather station current, coupled to the microcontroller and to the cellphone circuit.

* * * * *